(12) United States Patent
Cha et al.

(10) Patent No.: US 12,557,451 B2
(45) Date of Patent: Feb. 17, 2026

(54) DISPLAY DEVICE

(71) Applicant: Samsung Display Co., LTD., Yongin-si (KR)

(72) Inventors: Jong Hwan Cha, Suwon-si (KR); Ki Nyeng Kang, Sejong-si (KR); Jin Taek Kim, Yongin-si (KR); Hong Joon Moon, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 529 days.

(21) Appl. No.: 18/092,509

(22) Filed: Jan. 3, 2023

(65) Prior Publication Data

US 2023/0231096 A1    Jul. 20, 2023

(30) Foreign Application Priority Data

Jan. 14, 2022    (KR) .................. 10-2022-0005728

(51) Int. Cl.
*H10H 20/857*    (2025.01)
*H01L 25/16*    (2023.01)
(Continued)

(52) U.S. Cl.
CPC ......... *H10H 20/857* (2025.01); *H01L 25/167* (2013.01); *H10D 86/441* (2025.01); *H10D 86/60* (2025.01)

(58) Field of Classification Search
CPC .. H10H 20/857; H10H 20/819; H10H 20/831; H10H 20/83; H10H 29/10; H01L 25/167; H01L 25/075; H01L 25/0753; H10D 86/441; H10D 86/60; H10K 59/131; H10K 59/122; H10K 59/35

See application file for complete search history.

(56) References Cited

U.S. PATENT DOCUMENTS

2021/0367024 A1    11/2021    Kim et al.
2021/0376045 A1    12/2021    Lee et al.
(Continued)

FOREIGN PATENT DOCUMENTS

KR    10-2018-0055021    5/2018
KR    10-2019-0029831    3/2019
(Continued)

*Primary Examiner* — Anne M Hines
*Assistant Examiner* — Jose M Diaz
(74) *Attorney, Agent, or Firm* — Womble Bond Dickinson (US) LLP

(57) ABSTRACT

A display device comprises electrode patterns spaced apart from each other in a first direction; a via layer disposed on the electrode patterns; first electrodes, each of the first electrodes partially overlapping an electrode pattern of the electrode patterns on the via layer in a plan view and extending in a second direction intersecting the first direction; second electrodes, each of the second electrodes comprising a portion extending in the second direction, the first electrodes and the second electrodes being spaced apart from each other and alternately disposed with each other; and light emitting elements disposed on a first electrode of the first electrodes and a second electrode of the second electrodes. The first electrodes are in contact with the electrode patterns through first electrode contact holes penetrating the via layer, and the first electrode contact holes are spaced apart from each other in the first direction.

19 Claims, 31 Drawing Sheets

(51) Int. Cl.
*H10D 86/40* (2025.01)
*H10D 86/60* (2025.01)

(56) References Cited

U.S. PATENT DOCUMENTS

2022/0077228 A1 3/2022 Do et al.
2022/0352244 A1 11/2022 Kang et al.

FOREIGN PATENT DOCUMENTS

| KR | 2020-0088962 | 7/2020 |
| KR | 10-2020-0118937 | 10/2020 |
| KR | 2020-0145965 | 12/2020 |
| KR | 2021-0132278 | 11/2021 |
| KR | 2021-0143969 | 11/2021 |
| KR | 2021-0148539 | 12/2021 |

DISPLAY DEVICE

CROSS-REFERENCE TO RELATED APPLICATION

This application claims priority from Korean Patent Application No. 10-2022-0005728 filed on Jan. 14, 2022 in the Korean Intellectual Property Office, and all the benefits accruing therefrom under 35 U.S.C. 119, the contents of which in its entirety are herein incorporated by reference.

BACKGROUND

1. Technical Field

The disclosure relates to a display device capable of preventing a contact defect caused by a lower stepped portion.

2. Description of the Related Art

Display devices have grown in popularity because of the developments of multimedia technology. Also, various types of display devices such as an organic light emitting display (OLED), a liquid crystal display (LCD) and the like have been used.

A light emitting display device includes a light emitting element having ability to emit light independently of a separate light source. The light emitting display device includes an organic light emitting display device using an organic material as a light emitting material of a light emitting element, an inorganic light emitting display device using an inorganic material as a light emitting material, or the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device having an electrode arrangement structure of improved electrical characteristics.

Embodiments also provide a display device capable of preventing a contact defect caused by a lower stepped portion.

However, embodiments of the disclosure are not limited to those set forth herein. The above and other embodiments will become more apparent to one of ordinary skill in the art to which the disclosure pertains by referencing the detailed description of the disclosure given below.

According to an embodiment of the disclosure, a display device comprises a plurality of electrode patterns spaced apart from each other in a first direction; a via layer disposed on the plurality of electrode patterns; a plurality of first electrodes, each of the plurality of first electrodes partially overlapping an electrode pattern of the plurality of electrode patterns on the via layer in a plan view and extending in a second direction intersecting the first direction; a plurality of second electrodes, each of the plurality of second electrodes comprising a portion extending in the second direction, the plurality of first electrodes and the plurality of second electrodes being spaced apart from each other and alternately disposed with each other; and a plurality of light emitting elements disposed on a first electrode of the plurality of first electrodes and a second electrode of the plurality of second electrodes. The plurality of first electrodes may be in contact with the plurality of electrode patterns through a plurality of first electrode contact holes penetrating the via layer, and the plurality of first electrode contact holes may be spaced apart from each other in the first direction.

The display device may further comprise a first voltage line extending in the first direction; and a second voltage line spaced apart from the first voltage line in the second direction with the plurality of electrode patterns interposed between the first voltage line and the second voltage line. The first electrode of the plurality of first electrodes may be electrically connected to the first voltage line, and the second electrode of the plurality of second electrodes may be electrically connected to the second voltage line.

The display device may further comprise a third voltage line extending in the second direction and intersecting the first voltage line; and a fourth voltage line extending in the second direction and intersecting the second voltage line. The fourth voltage line may be spaced apart from the third voltage line in the first direction with the plurality of electrode patterns interposed between the third voltage line and the fourth voltage line. The second electrode of the plurality of second electrodes may be electrically connected to the fourth voltage line.

Each of the plurality of second electrodes may comprise an electrode stem portion extending in the first direction, and the electrode stem portion may be in contact with the fourth voltage line through a second electrode contact hole penetrating the via layer at a portion overlapping the fourth voltage line in a plan view.

The display device may further comprise a dummy pattern disposed on the via layer and overlapping the third voltage line in a plan view. The dummy pattern may be spaced apart from the first electrode of the plurality of first electrodes and be in contact with the third voltage line through a third electrode contact hole penetrating the via layer.

The second electrode may comprise an electrode stem portion extending in the first direction; a plurality of electrode branch portions, each of the plurality of electrode branch portions extending in the second direction and spaced apart from the first electrode of the plurality of first electrodes; and a first electrode connection portion electrically connected to the electrode stem portion and the electrode branch portions. A light emitting element of the plurality of light emitting elements may be disposed on any one of the first electrode and an electrode branch portion of the plurality of electrode branch portions.

Each of the plurality of first electrodes may comprise an electrode main portion extending in the second direction and spaced apart from the electrode branch portion of the plurality of electrode branch portions of the second electrode of the plurality of second electrodes; an electrode piece portion spaced apart from the electrode stem portion in the second direction and extending in the first direction; and a second electrode connection portion electrically connecting the electrode main portion to the electrode piece portion. In the plurality of first electrodes, the electrode piece portions may be spaced apart from each other in the first direction.

The plurality of electrode branch portions may comprise a first electrode branch portion included in the second electrode of the plurality of second electrodes, and a second electrode branch portion included in another second electrode of the plurality of second electrodes. The plurality of light emitting elements may comprise a first light emitting element having a first end disposed on the first electrode of the plurality of first electrodes and a second end disposed on the first electrode branch portion, and a second light emitting element having a first end disposed on the first electrode of the plurality of first electrodes and a second end disposed on a second electrode branch portion.

The display device may further comprise a first connection electrode disposed on the first electrode of the plurality of first electrodes and in contact with the first end of the first light emitting element; a second connection electrode disposed on the first electrode branch portion of the second electrode of the plurality of second electrodes and in contact with the second end of the second light emitting element; and a third connection electrode comprising a first extension portion disposed on the second electrode branch portion of the second electrode of the plurality of second electrodes and in contact with the second end of the first light emitting element, a second extension portion disposed on the first electrode of the plurality of first electrodes and in contact with the first end of the second light emitting element, and a first connection portion electrically connecting the first extension portion to the second extension portion.

The display device may further comprise an electrode line spaced apart from the electrode stem portion of the second electrode of the plurality of second electrodes in the second direction and extending in the first direction. The plurality of first electrodes may be spaced apart from the electrode line.

The display device may further comprise a bank layer adjacent to an emission area in which the plurality of light emitting elements are disposed, a first sub-region disposed on a side of the emission area in the second direction, and a second sub-region disposed on another side of the emission area in the second direction. The electrode stem portion may be disposed in the first sub-region.

The bank layer may overlap the plurality of first electrode contact holes in a plan view.

The display device may further comprise a plurality of first bank patterns extending in the second direction and spaced apart from each other in the first direction; and a plurality of second bank patterns extending in the second direction and disposed between the first bank patterns. The plurality of light emitting elements may be disposed between a first bank pattern of the plurality of first bank patterns and a second bank pattern of the plurality of second bank patterns.

The first electrode of the plurality of first electrodes may cover the first bank pattern of the plurality of first bank patterns, a part of the second electrode of the plurality of second electrodes may be disposed on the second bank pattern of the plurality of second bank patterns, and a width of a portion of the first electrode of the plurality of first electrodes disposed on the first bank pattern of the plurality of first bank patterns may be greater than a width of a portion of the second electrode of the plurality of second electrodes disposed on the second bank pattern of the plurality of second bank patterns.

According to an embodiment of the disclosure, a display device comprises a plurality of pixels arranged in a first direction and a second direction intersecting the first direction; a first voltage line and a second voltage line disposed in a pixel of the plurality of pixels and spaced apart from each other in the second direction, the first voltage line and the second voltage line extending in the first direction; a third voltage line and a fourth voltage line disposed in the pixel of the plurality of pixels and spaced apart from each other in the first direction, the third voltage line and the fourth voltage line extending in the second direction; a plurality of electrode patterns disposed between the first voltage line and the second voltage line and spaced apart from each other in the first direction; a plurality of first electrodes, each of the plurality of first electrodes overlapping an electrode pattern of the plurality of electrode patterns in a plan view and extending in the second direction; a plurality of second electrodes, each of the plurality of second electrodes extending in the second direction, the plurality of first electrodes and the plurality of second electrodes being spaced apart from each other and alternately disposed with each other; and a plurality of light emitting elements disposed on a first electrode of the plurality of first electrodes and a second electrode of the plurality second electrodes. The plurality of first electrodes may be in contact with the plurality of electrode patterns through a plurality of first electrode contact holes, and the plurality of first electrode contact holes may be spaced apart from each other in the first direction.

The display device may further comprise a dummy pattern spaced apart from the first electrode of the plurality of first electrodes and in direct contact with the third voltage line through a third electrode contact hole. The first voltage line may intersect the third voltage line. The second voltage line may intersect the fourth voltage line. The second electrode may comprise an electrode stem portion extending in the first direction and in direct contact with the fourth voltage line through a second electrode contact hole, and a plurality of electrode branch portions extending in the second direction. The plurality of electrode branch portions and the plurality of first electrodes may be spaced apart from each other and alternately disposed with each other.

The plurality of pixels may comprise a first pixel and a second pixel adjacent to the first pixel in the second direction. The first voltage line of the first pixel may be adjacent to and opposite to the second voltage line of the second pixel in the second direction. The first pixel and the second pixel may share the third voltage line and the fourth voltage line.

The plurality of pixels may further comprise a third pixel adjacent to the first pixel in the first direction. The fourth voltage line and the second electrode contact hole may be disposed at a boundary between the first pixel and the third pixel.

The plurality of pixels may comprise a first pixel and a second pixel adjacent to the first pixel in the second direction. The first voltage line of the first pixel may be adjacent to and opposite to the first voltage line of the second pixel in the second direction. The first pixel and the second pixel may share the third voltage line and the fourth voltage line.

A gap between a second electrode contact hole of the first pixel and a second electrode contact hole of the second pixel may be greater than a gap between a third electrode contact hole of the first pixel and a third electrode contact hole of the second pixel.

The display device according to an embodiment may include electrodes having an arrangement structure corresponding to lower conductive layers. The display device may prevent a connection defect, a pattern defect, or the like that may occur due to the lower stepped portion in case that the lower conductive layer and electrodes are electrically connected.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
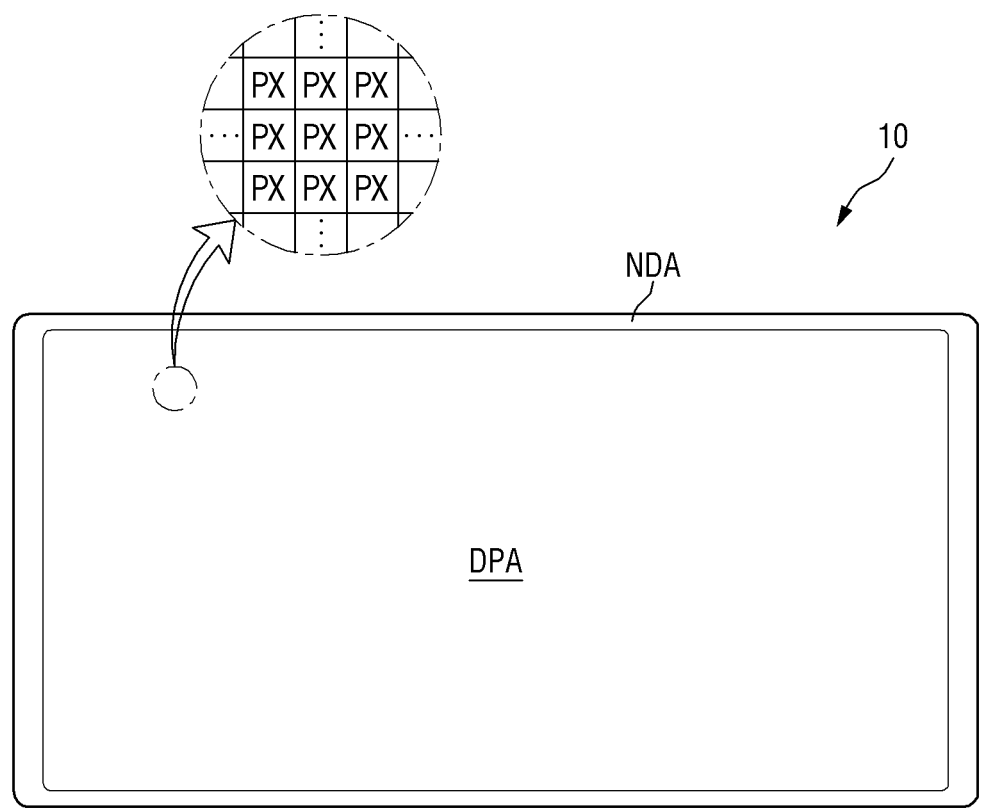
FIG. 1 is a schematic plan view of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

When an element, such as a layer, is referred to as being "on," "connected to," or "coupled to" another element or layer, it may be directly on, connected to, or coupled to the other element or layer, or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure. Similarly, the second element could also be termed the first element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

FIG. 1 is a schematic plan view of a display device according to an embodiment.

Referring to FIG. 1, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide the display screen.

The display device 10 may include a display panel which provides the display screen. Examples of the display panel may include an inorganic light emitting diode display panel, an organic light emitting display panel, a quantum dot light emitting display panel, a plasma display panel, a field emission display panel, or the like. Description of an inorganic light emitting diode display panel applied as the display panel is provided below. However, the disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (or vertices), another polygonal shape, a circular shape, or the like. A shape of a display area DPA of the display device 10 may also be similar to an overall shape of the display device 10. FIG. 1 illustrates the display device 10 having a rectangular shape elongated in a second direction DR2.

The display device 10 may include the display area DPA and a non-display area NDA. The display area DPA may be an area where a screen may be displayed, and the non-display area NDA may be an area where the screen is not displayed. The display area DPA may also be referred to as an active region, and the non-display area NDA may also be referred to as a non-active region. The display area DPA may substantially occupy a center of the display device 10.

The display area DPA may include pixels PX. The pixels PX may be arranged in a matrix. A shape of each pixel PX may be a rectangular or square shape in a plan view. However, the disclosure is not limited thereto, and the shape of the pixel PX may be a rhombic shape in which each side is inclined with respect to a direction. The pixels PX may be arranged in a stripe type or an island type. Each of the pixels PX may include one or more light emitting elements that emit light of a wavelength band to display a color.

The non-display area NDA may be disposed around the display area DPA. The non-display area NDA may be adjacent to the display area DPA. For example, the non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted in the non-display area NDA.

Figure 2:
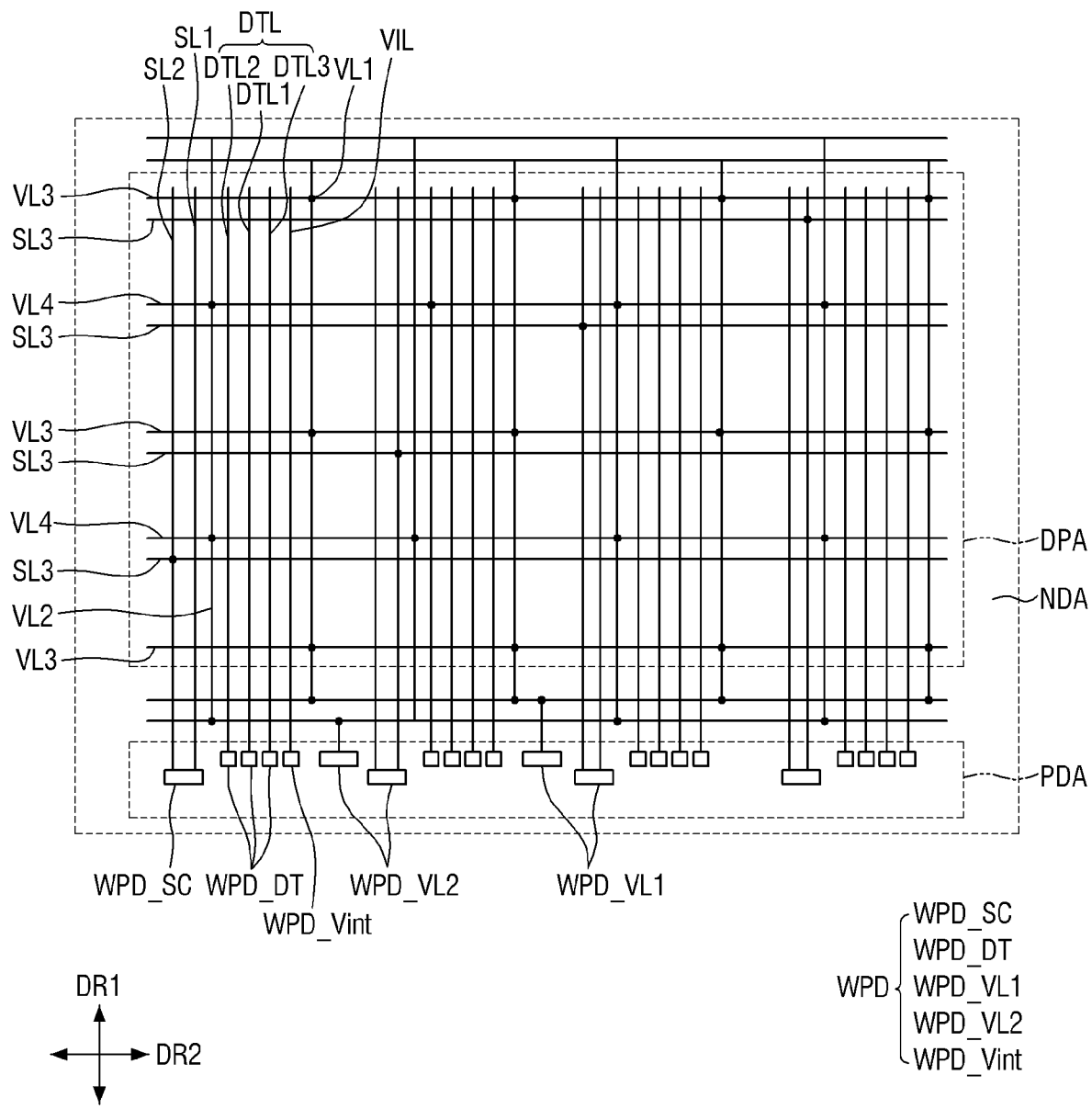
FIG. 2 is a schematic layout view illustrating wires of a display device according to an embodiment.

FIG. 2 is a schematic layout view illustrating wires of a display device according to an embodiment.

Referring to FIG. 2, the display device 10 may include wires. The display device 10 may include scan lines SL1, SL2, and SL3, data lines DTL1, DTL2, and DTL3, an initialization voltage line VIL, and voltage lines VL1, VL2, VL3, and VL4. Although not shown in the drawing, other wires may be further provided in the display device 10. The wires may include wires formed of a first conductive layer and extending in a first direction DR1, and wires formed of a third conductive layer and extending in the second direction DR2. However, the extension directions of the wires are not limited thereto.

The first scan line SL1 and the second scan line SL2 may extend in the first direction DR1. The first scan line SL1 and the second scan line SL2 may be disposed adjacent to each other, and may be spaced apart from another first scan line SL1 and second scan line SL2 in the second direction DR2. The first scan line SL1 and the second scan line SL2 may be electrically connected to a scan line pad WPD_SC electrically connected to a scan driver (not illustrated). The first scan line SL1 and the second scan line SL2 may extend from the pad area PDA disposed in the non-display area NDA to the display area DPA.

The third scan line SL3 may extend in the second direction DR2, and may be spaced apart from another third scan line SL3 in the first direction DR1. Each third scan line SL3 may be electrically connected to one or more first scan lines SL1 or one or more second scan lines SL2. The scan lines SL may have a mesh structure in a surface (e.g., entire surface) of the display area DPA, but is not limited thereto.

The data lines DTL may extend in the first direction DR1. The data line DTL may include a first data line DTL1, a second data line DTL2, and a third data line DTL3. Each of the first to third data lines DTL1, DTL2, and DTL3 may form a pair (or group) and is disposed adjacent to each other. For example, each of the first data line DTL1, each of the second data line DTL2, and each of the third data line DTL3 may be adjacent to each other, and form each group (or pair). Each of the first to third data lines DTL1, DTL2, and DTL3 may extend from the pad area PDA disposed in the non-display area NDA to the display area DPA. However, the disclosure is not limited thereto, and the data lines DTL may be spaced apart from each other at equal intervals (or a constant interval) between a first voltage line VL1 and a second voltage line VL2. Description of the first voltage line VL1 and the second voltage line VL2 is provided below.

The initialization voltage line VIL may extend in the first direction DR1. The initialization voltage line VIL may be disposed between the data lines DTL and the first voltage line VL1. The initialization voltage line VIL may extend from the pad area PDA disposed in the non-display area NDA to the display area DPA.

The first voltage line VL1 and the second voltage line VL2 may extend in the first direction DR1, and the third voltage line VL3 and the fourth voltage line VL4 may extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may extend in the first direction DR1 to cross the display area DPA. Some of the third voltage line VL3 and the fourth voltage line VL4 may be disposed in the display area DPA, and another of the third voltage line VL3 and the fourth voltage line VL4 may be disposed in the non-display area NDA positioned on sides (e.g., both sides) of the display area DPA in the first direction DR1. The first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be electrically connected to at least one third voltage line VL3. The second voltage line VL2 may be electrically connected to at least one fourth voltage line VL4. The voltage lines VL may have a mesh structure in the display area DPA (e.g., entire display area DPA). However, the disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In an embodiment, each of the line pads WPD may be disposed in the pad area PDA positioned on a lower side, which is another side of the display area DPA in the first direction DR1. The first scan line SL1 and the second scan line SL2 may be electrically connected to the scan line pad WPD_SC disposed in the pad area PDA. The data lines DTL may be electrically connected to the data line pads WPD_DT different from each other, respectively. The initialization voltage line VIL may be electrically connected to an initialization line pad WPD_Vint. The first voltage line VL1 may be electrically connected to a first voltage line pad WPD_VL1. The second voltage line VL2 may be electrically connected to a second voltage line pad WPD_VL2. External devices may be mounted on the line pads WPD. The external devices may be mounted on the line pads WPD by applying an anisotropic conductive film, ultrasonic bonding or the like. In the drawing, each of the line pads WPD is disposed on the pad area PDA disposed on the lower side of the display area DPA, but is not limited thereto. In other embodiments, some of the line pads WPD may be disposed in any one area on an upper side or on left and right sides of the display area DPA.

Each pixel PX or a sub-pixel SPXn (n is an integer of 1 to 3) of the display device 10 may include a pixel driving circuit. The above-described wires may pass through each pixel PX or a periphery of the pixel PX to apply a driving signal to each pixel driving circuit. The pixel driving circuit may include transistors and one or more capacitors. The number of transistors and capacitors of each pixel driving circuit may be variously modified. According to an embodiment, in each sub-pixel SPXn of the display device 10, the pixel driving circuit may have a 3T1C structure including three transistors and one capacitor. Description of the pixel driving circuit of the 3T1C structure is provided below as an example, but the disclosure is not limited thereto, and various other modified structures such as a 2T1C structure, a 7T1C structure, and a 6T1C structure may be applied.

Figure 3:
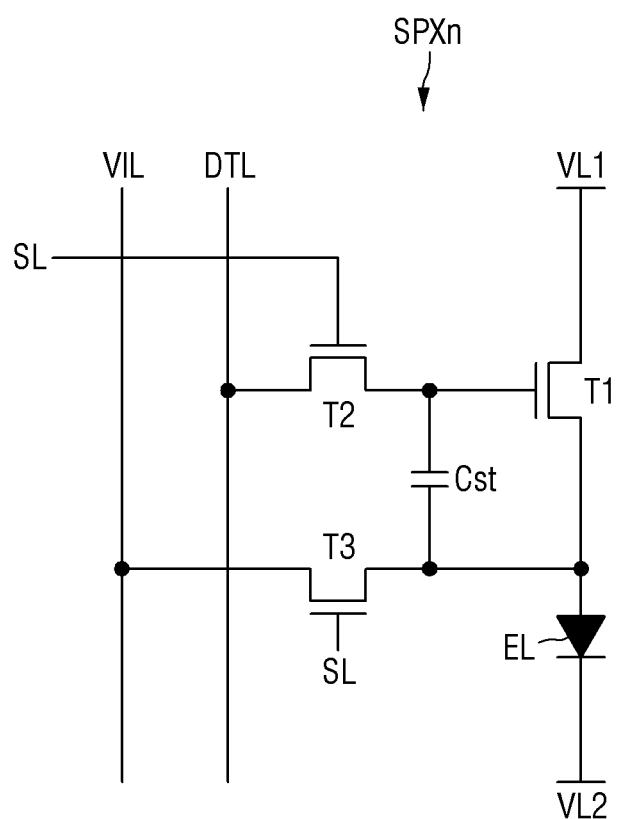
FIG. 3 is a schematic diagram of an equivalent circuit of a sub-pixel according to an embodiment.

FIG. 3 is a schematic diagram of an equivalent circuit of a sub-pixel according to an embodiment.

Referring to FIG. 3, each sub-pixel SPXn of the display device 10 according to an embodiment may include three transistors T1, T2 and T3, a storage capacitor Cst, and a light emitting diode EL.

The light emitting diode EL may emit light by a current supplied through a first transistor T1. The light emitting diode EL may include a first electrode, a second electrode, and at least one light emitting element disposed between the first electrode and the second electrode. The light emitting element may emit light of a wavelength band by electrical signals transmitted from the first electrode and the second electrode.

An end of the light emitting diode EL may be electrically connected to the source electrode of the first transistor T1, and another end thereof may be electrically connected to the second voltage line VL2 to which a low potential voltage (hereinafter, a second power voltage) lower than a high potential voltage (hereinafter, a first power voltage) of the first voltage line VL1 is supplied.

The first transistor T1 may adjust a current flowing from the first voltage line VL1, to which the first power voltage is supplied, to the light emitting diode EL according to the voltage difference between a gate electrode and a source electrode. For example, the first transistor T1 may be a driving transistor for driving the light emitting diode EL. The gate electrode of the first transistor T1 may be electrically connected to the source electrode of the second transistor T2. The source electrode of the first transistor T1 may be electrically connected to a first electrode of the light emitting diode EL. A drain electrode of the first transistor T1 may be electrically connected to the first voltage line VL1 to which the first power voltage is applied.

The second transistor T2 may be turned on by a scan signal of a first scan line SL1 to electrically connect the data line DTL to the gate electrode of the first transistor T1. A gate electrode of the second transistor T2 may be electrically connected to the first scan line SL1. A source electrode of the second transistor T2 may be electrically connected to the gate electrode of the first transistor T1. A drain electrode of the second transistor T2 may be electrically connected to the data line DTL.

The third transistor T3 may be turned on by a scan signal of the second scan line SL2 to electrically connect the initialization voltage line VIL to an end of the light emitting diode EL. A gate electrode of the third transistor T3 may be electrically connected to the second scan line SL2. A drain electrode of the third transistor T3 may be electrically connected to the initialization voltage line VIL. A source electrode of the third transistor T3 may be electrically connected to the end of the light emitting diode EL or to the source electrode of the first transistor T1.

In an embodiment, the source electrode and the drain electrode of each of the transistors T1, T2, and T3 are not limited to those described above, and vice versa. Each of the transistors T1, T2, and T3 may be formed of a thin film transistor. In FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. In other embodiments, some of the transistors T1, T2, and T3 may be formed of an N-type MOSFET and another of the transistors T1, T2, and T3 may be formed of a P-type MOSFET.

The storage capacitor Cst may be formed between the gate electrode and the source electrode of the first transistor T1. The storage capacitor Cst may store a voltage difference between the gate voltage and the source voltage of the first transistor T1.

Disclosure of a structure of each pixel PX of the display device 10 according to an embodiment is provided in detail with further reference to other drawings.

Figure 4:
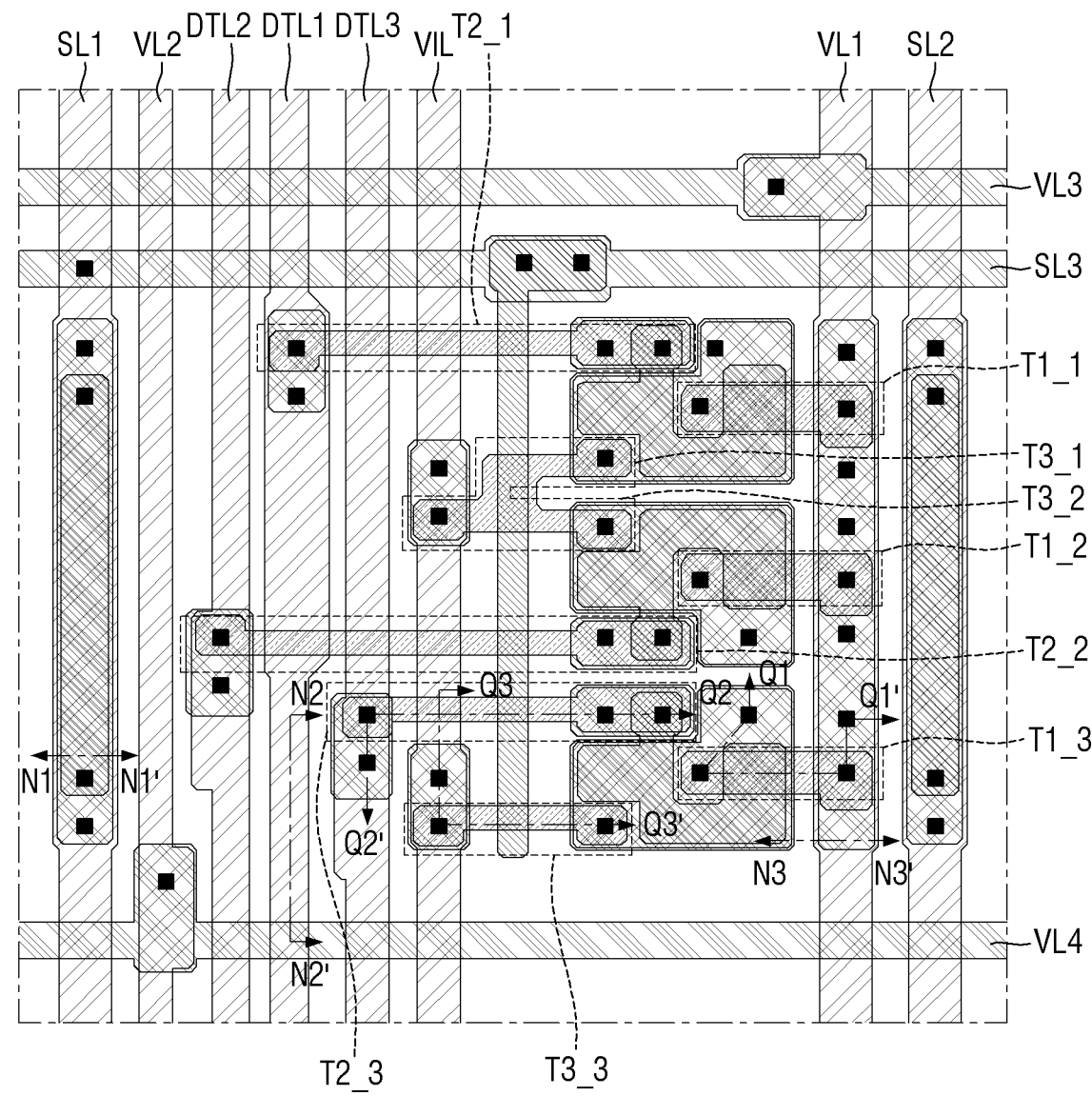
FIG. 4 is a schematic layout diagram illustrating arrangement of conductive layers and a semiconductor layer disposed in a display device according to an embodiment.
Figure 5:
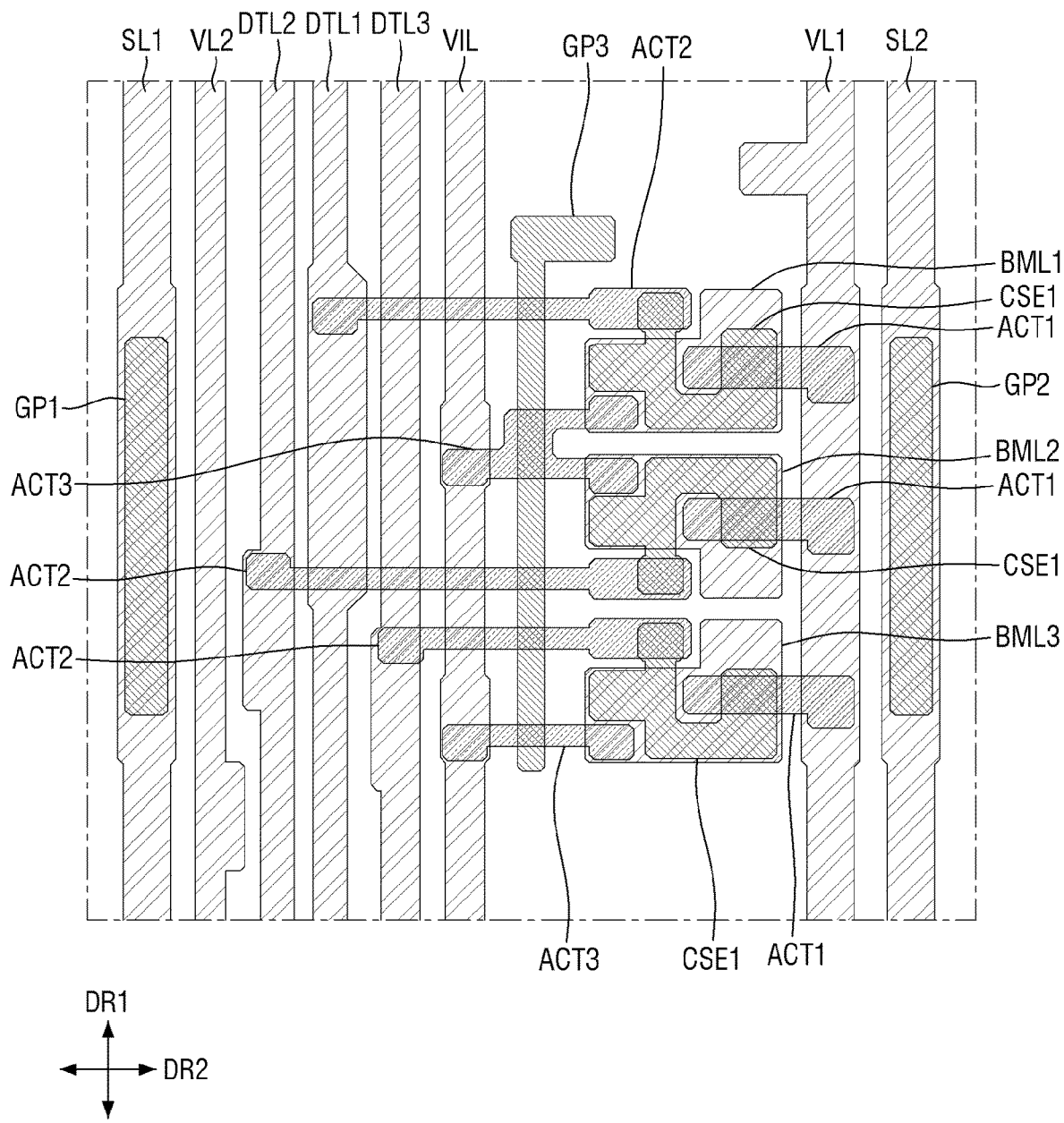
FIGS. 5 and 6 are schematic layout diagrams separately illustrating some of the conductive layers and the semiconductor layers of FIG. 4.
Figure 6:
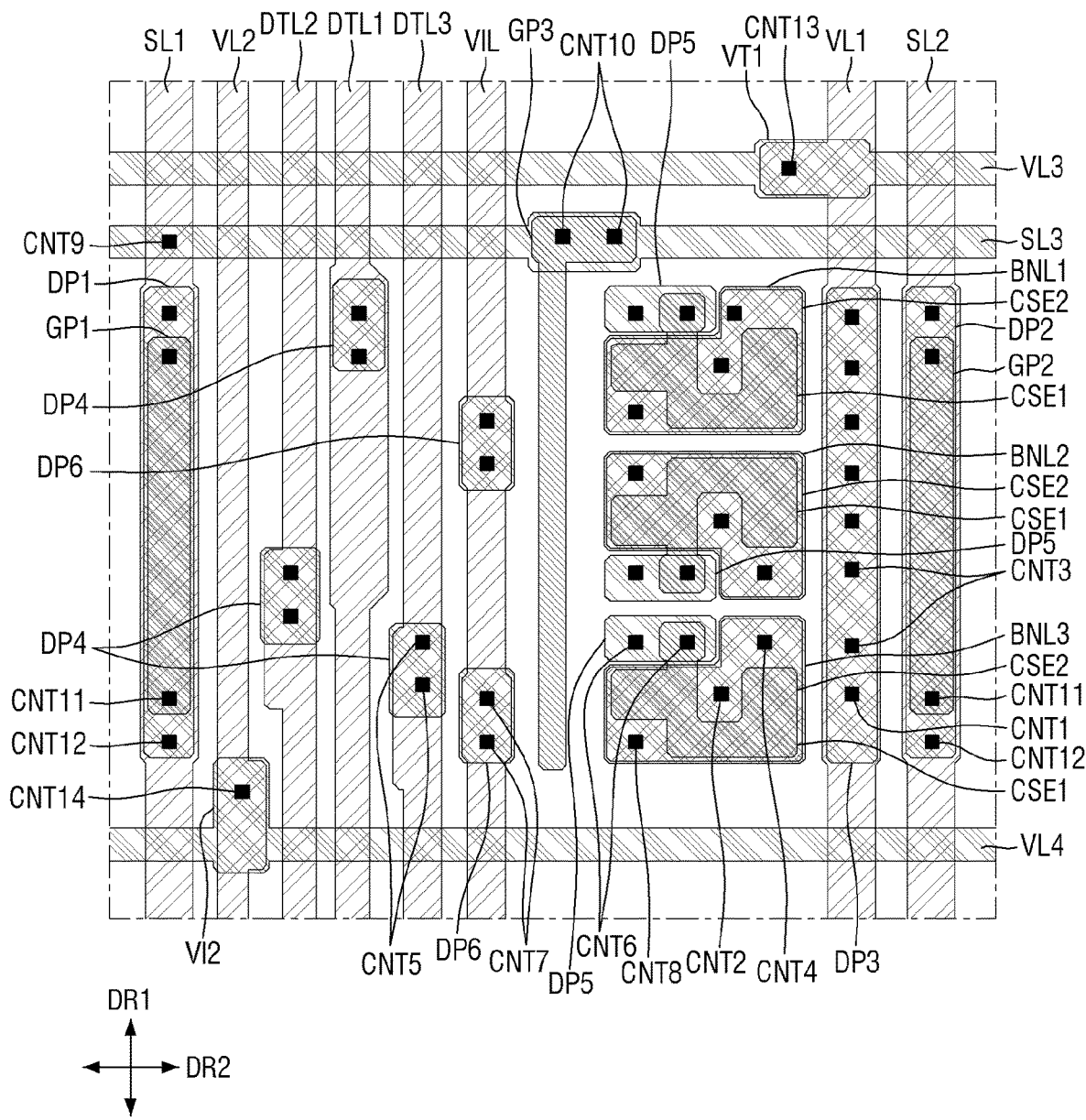
Figure 7:
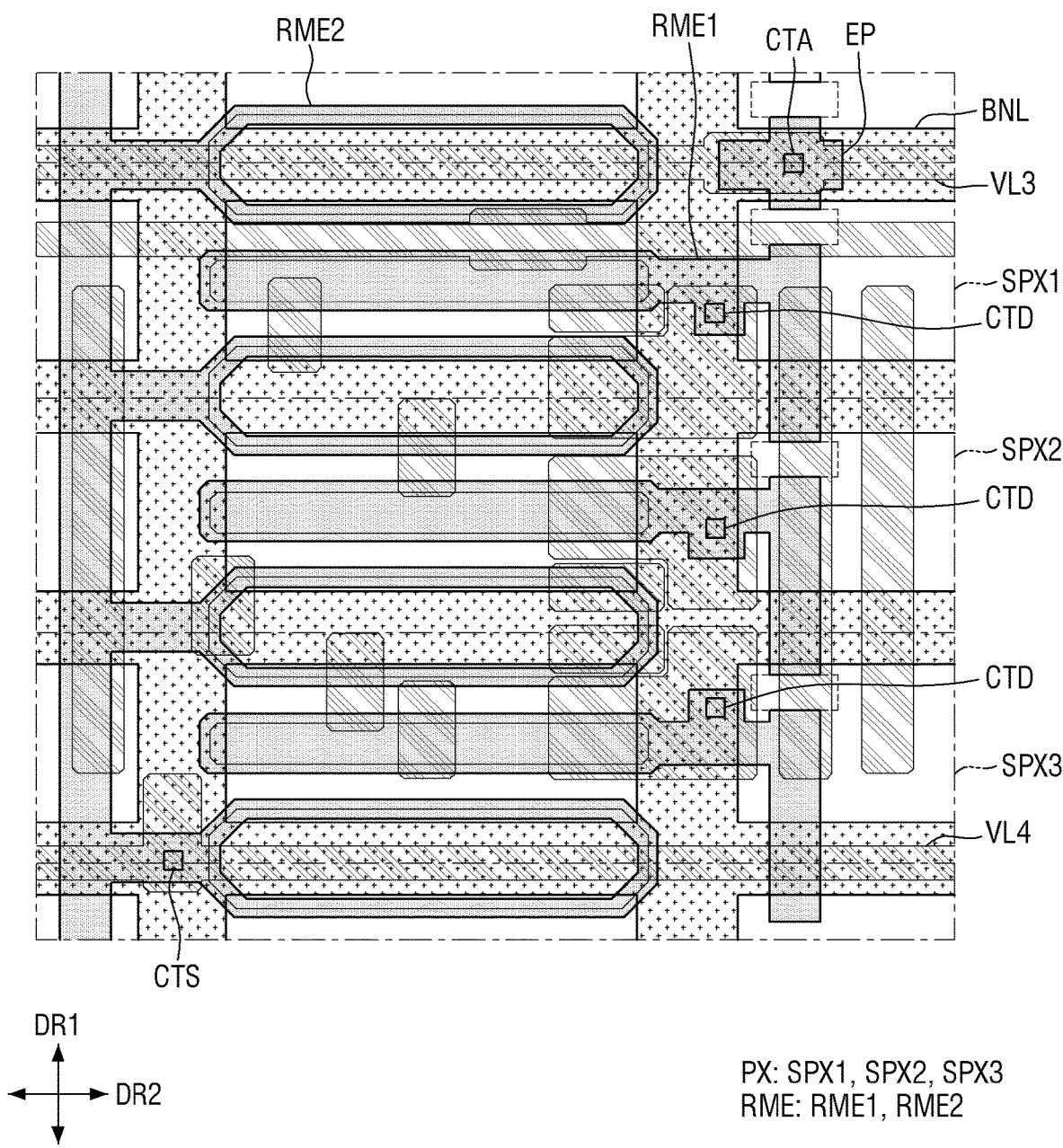
FIG. 7 is a schematic plan view illustrating arrangement of some of the conductive layers of FIG. 4 and electrodes disposed in a pixel.
Figure 8:
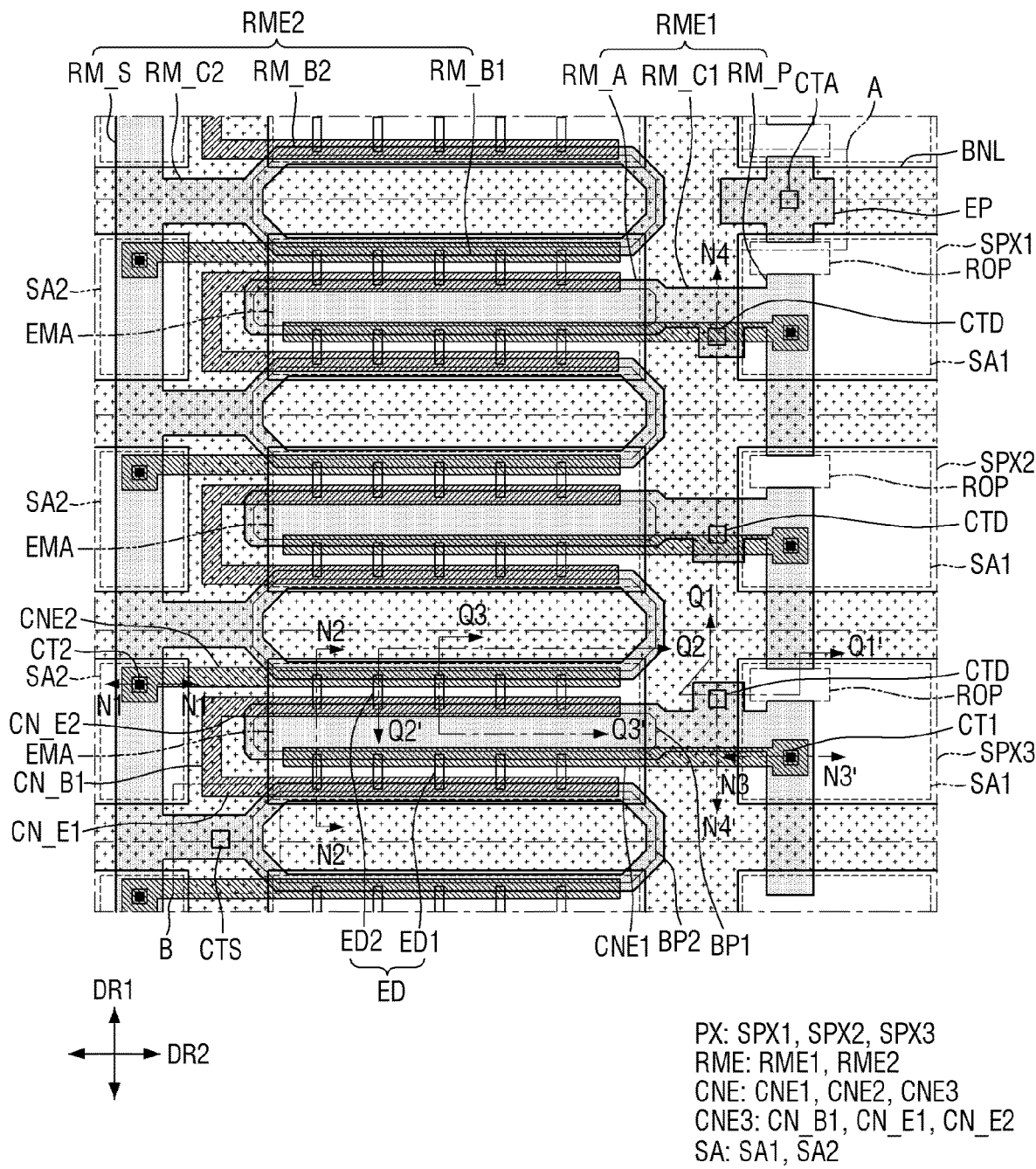
FIG. 8 is a schematic plan view illustrating electrodes and bank layers disposed in a pixel of a display device according to an embodiment.
Figure 9:
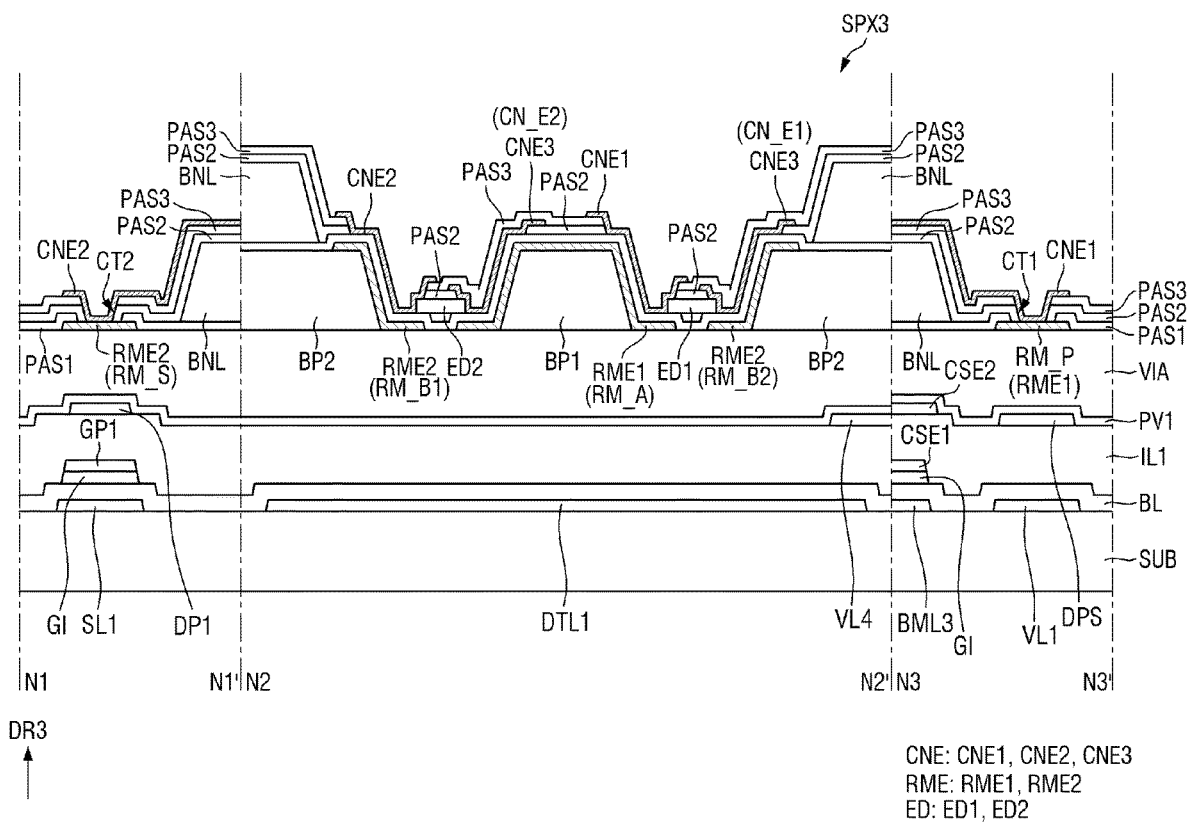
FIG. 9 is a schematic cross-sectional view taken along lines N1-N1', N2-N2', and N3-N3' of FIGS. 4 and 8.
Figure 10:
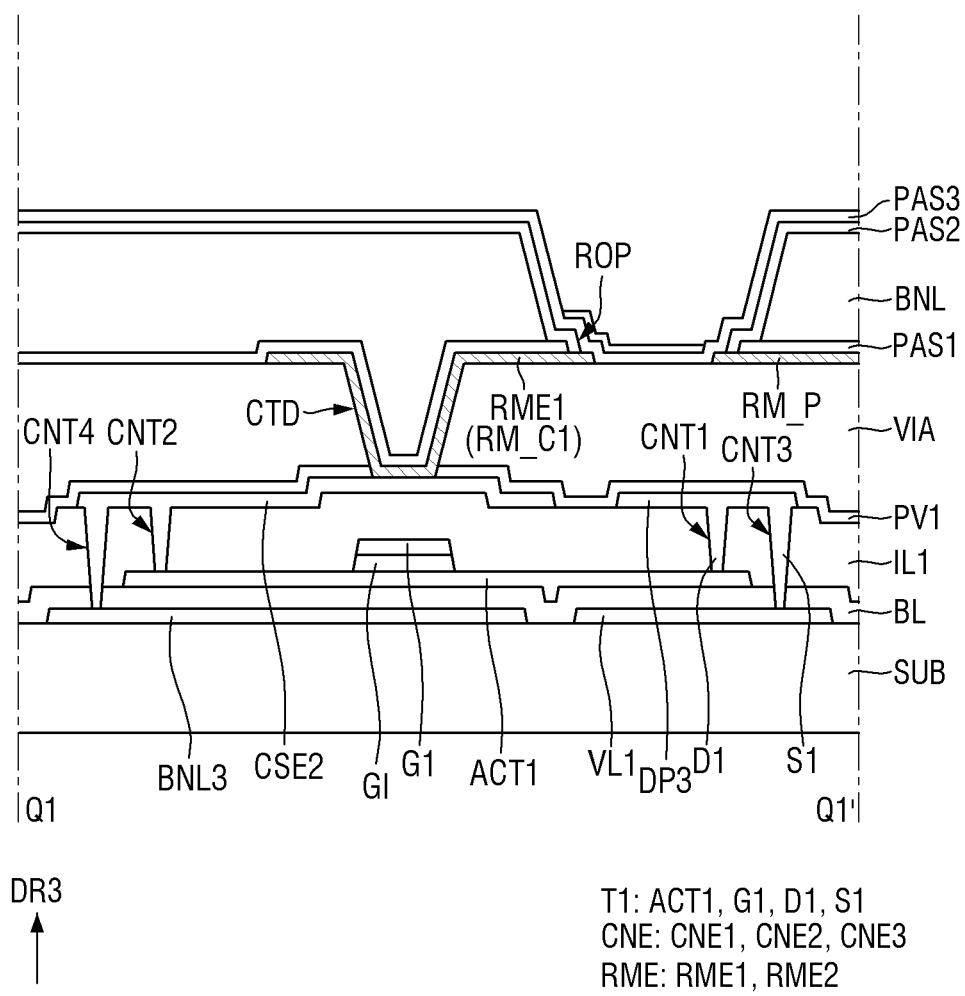
FIG. 10 is a schematic cross-sectional view taken along line Q1-Q1' of FIGS. 4 and 8.
Figure 11:
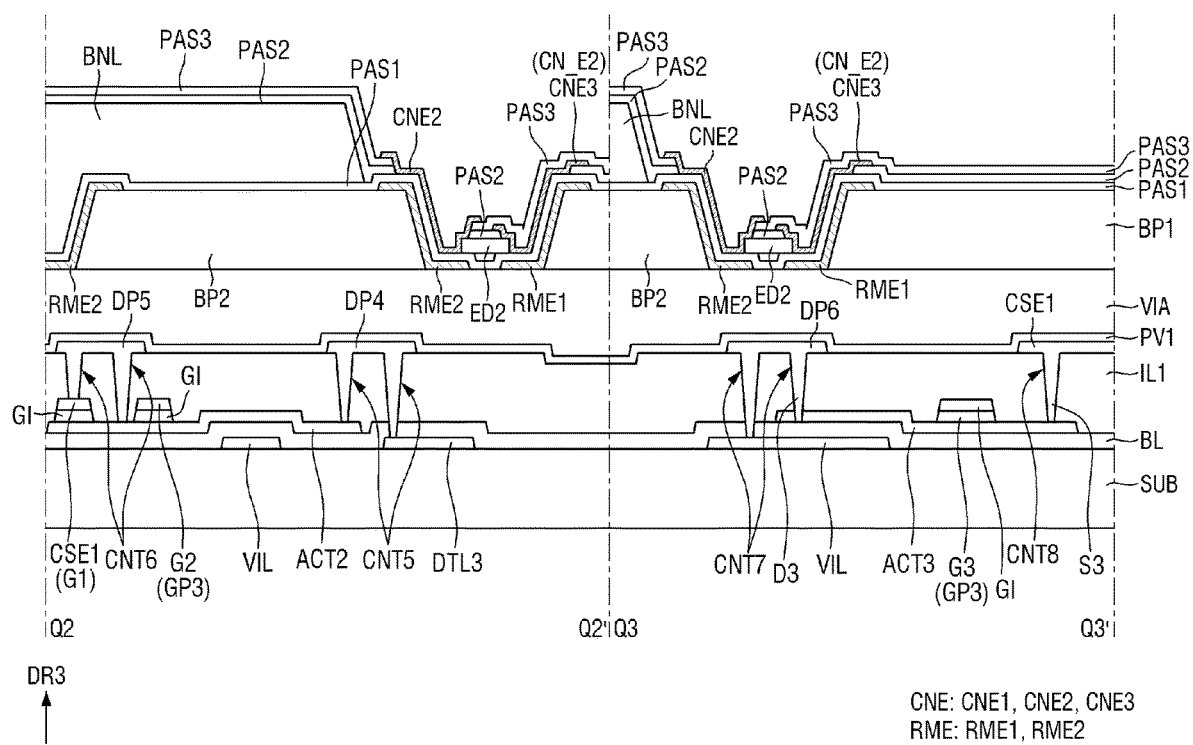
FIG. 11 is a schematic cross-sectional view taken along lines Q2-Q2' and Q3-Q3' of FIGS. 4 and 8.

FIG. 4 is a schematic layout diagram illustrating arrangement of conductive layers and a semiconductor layer disposed in a display device according to an embodiment. FIGS. 5 and 6 are schematic layout diagrams separately illustrating some of the conductive layers and the semiconductor layers of FIG. 4. FIG. 7 is a schematic plan view illustrating arrangement of some of the conductive layers of FIG. 4 and electrodes disposed in a pixel. FIG. 8 is a schematic plan view illustrating electrodes and bank layers disposed in a pixel of a display device according to an embodiment. FIG. 9 is a schematic cross-sectional view taken along lines N1-N1', N2-N2', and N3-N3' of FIGS. 4 and 8. FIG. 10 is a schematic cross-sectional view taken along line Q1-Q1' of FIGS. 4 and 8. FIG. 11 is a schematic cross-sectional view taken along lines Q2-Q2' and Q3-Q3' of FIGS. 4 and 8.

FIG. 4 is a schematic layout diagram illustrating wires of a first conductive layer, a second conductive layer, and a third conductive layer, and active layers ACT1, ACT2, and ACTS of a semiconductor layer, which are conductive layers and a semiconductor layer disposed in a pixel PX of the display device 10. FIG. 5 schematically illustrates the first conductive layer, the active layer of the semiconductor layer, and the second conductive layer. FIG. 6 schematically illustrates the first conductive layer, the second conductive layer, and the third conductive layer. FIG. 7 schematically illustrates the arrangement of the third conductive layer, and electrodes RME, and a bank layer BNL disposed on the third conductive layer. FIG. 8 schematically illustrates the arrangement of the electrodes RME, the bank layer BNL, light emitting elements ED, and connection electrodes CNE disposed on the wires. FIG. 9 schematically illustrates a cross section across ends (e.g., both ends) of the light emitting elements ED (e.g., a first light emitting element ED1 and a second light emitting element ED2) disposed in a first sub-pixel SPX1 and a cross section across contact portions CT1 and CT2. FIG. 10 schematically illustrates a cross section of the first transistor T1 electrically connected to a third sub-pixel SPX3 of a pixel PX. FIG. 11 schematically illustrates a cross section of the second transistor T2 and the third transistor T3 electrically connected to the third sub-pixel SPX3.

Referring to FIGS. 4 to 11, each of the pixels PX of the display device 10 may include sub-pixels SPXn (e.g., n ranging from 1 to 3). For example, each pixel PX may include a first sub-pixel SPX1, a second sub-pixel SPX2, and a third sub-pixel SPX3. The first sub-pixel SPX1 may emit light of a first color. The second sub-pixel SPX2 may emit light of a second color. The third sub-pixel SPX3 may emit light of a third color. For example, the first color may be red, the second color may be green, and the third color may be blue. However, the disclosure is not limited thereto, and the sub-pixels SPXn or some of the sub-pixels SPXn may emit light of a same color. For example, the sub-pixels SPXn may emit a same blue light. In other embodiments, two sub-pixels SPXn may emit the same blue light, and another sub-pixel SPXn may emit green light different from the blue light. Although each pixel PX includes three sub-pixels SPXn, the disclosure is not limited thereto, and the pixel PX may include a larger number of sub-pixels SPXn.

The sub-pixels SPXn may be arranged in the first direction DR1. The first sub-pixel SPX1 may be disposed on an upper side (or in an upper direction) from a center of the pixel PX, which is a side of the pixel PX in the first direction DR1. The second sub-pixel SPX2 may be disposed at a center of the pixel PX. The third sub-pixel SPX2 may be disposed on a lower side (or in a lower direction) from the center of the pixel PX, which is another side of the pixel PX in the first direction DR1. The arrangement of the first sub-pixel SPX1, the second sub-pixel SPX2, and the third sub-pixel SPX3 and the arrangement structure of the electrodes RME disposed in the respective sub-pixels SPXn may vary depending on the arrangement of wires and the transistors T1, T2, and T3 electrically connected to the sub-pixels SPXn. In accordance with an embodiment, in the display device 10, the sub-pixels SPXn constituting each pixel PX may be arranged in the same direction as the extension direction of the voltage lines VL1 and VL2 of the first conductive layer, and may be arranged in a direction different from the extension direction of the voltage lines VL3 and VL4 of the third conductive layer.

Each sub-pixel SPXn of the display device 10 may include an emission area EMA and a non-emission area. The emission area EMA may be an area in which the light emitting element ED emits light of a wavelength band. The non-emission area may be a region in which the light emitting element ED is not disposed, and the light may not be emitted because the light emitted from the light emitting element ED may not reach the non-emission area.

The emission area EMA may include the region in which the light emitting element ED is disposed, and a region adjacent to the light emitting element ED in which lights (e.g., portions of the light) emitted from the light emitting element ED are emitted. For example, the emission area EMA may further include a region in which the light emitted from the light emitting element ED is reflected or refracted by another member and emitted. The light emitting elements ED may be disposed in the respective sub-pixels SPXn, and the emission area EMA may include an area where the light emitting elements ED are disposed and an area adjacent thereto.

Although the sub-pixels SPXn have the emission areas EMA that are substantially identical in size, the disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include sub-regions SA1 and SA2 disposed in the non-emission area. The sub-regions SA1 and SA2 may include a first sub-region SA1 disposed on a right side of the emission area EMA, which is a side of the emission area EMA in the second direction DR2, and a second sub-region SA2 disposed on a left side of the emission area EMA, which is another side of the emission area EMA in the second direction DR2. The emission area EMA and the sub-regions SA1 and SA2 may be alternately arranged in the second direction DR2 depending on the arrangement of the pixel PX and the sub-pixels SPXn. The first sub-region SA1 or the second sub-region SA2 may be disposed between adjacent ones of the emission areas EMA spaced apart from each other in the second direction DR2. For example, the emission areas EMA may be repeatedly arranged in the second direction DR2 with the first sub-region SA1 or the second sub-region SA2 interposed therebetween. Each of the emission areas EMA, the first sub-regions SA1, and the second sub-region SA2 may be repeatedly disposed in the first direction DR1. The first sub-region SA1 and the second sub-region SA2 may be areas distinguished by the arrangement of a dummy pattern EP and the electrodes RME. Description of the dummy pattern EP is provided below. However, the disclosure is not limited thereto, and the arrangement of the emission areas EMA and the sub-regions SA1 and SA2 in the sub-pixels PX may be different from that of FIGS. 4 to 8.

The light may not be emitted from the sub-region SA because the light emitting element ED is not disposed in the sub-region SA, but an electrode RME disposed in each sub-pixel SPXn may be partially disposed in the sub-region SA. The electrodes RME disposed in adjacent ones of the sub-pixels SPXn may be separated by a separation portion ROP of the sub-region SA. For example, the separation portion ROP of the sub-region SA may be disposed between the electrodes RME disposed in the another sub-pixels SPXn.

The bank layer BNL may be adjacent to (e.g., surround) the sub-regions SA1 and SA2 and the emission areas EMA. The bank layer BNL may be disposed at a boundary between the sub-pixels SPXn adjacent in the first direction DR1 and the second direction DR2, and may also be disposed at a boundary between the emission area EMA and the sub-regions SA1 and SA2. The sub-pixels SPXn, the emission area EMA, and the sub-regions SA1 and SA2 of the display device 10 may be the areas distinguished by the arrangement of the bank layer BNL. Gaps between the sub-pixels SPXn, the emission areas EMA, and the sub-regions SA1 and SA2 may vary depending on a width of the bank layer BNL.

The bank layer BNL may include portions extending in the first direction DR1 and the second direction DR2 in a plan view. The bank layer BNL may be arranged in a grid pattern over a surface (e.g., entire surface) of the display area DPA. The bank layer BNL may be disposed along boundaries between the sub-pixels SPXn to delimit (or divide) the adjacent sub-pixels SPXn. The bank layer BNL may also be adjacent to (e.g., surround) the emission area EMA and the sub-region SA disposed for each sub-pixel SPXn to delimit (or divide) the emission areas EMA and the adjacent sub-regions SA in sub-pixels SPXn from each other.

The wires and the circuit elements of a circuit layer may be disposed on each pixel PX and electrically connected to the light emitting diode EL, and each of the wires and the circuit elements may be electrically connected to the first to third sub-pixels SPX1, SPX2, and SPX3. However, the wires and the circuit elements may not correspond to the area occupied by each sub-pixel SPXn or the emission area EMA, and may be disposed regardless of the position of the emission area EMA within the pixel PX.

In each pixel PX, a circuit layer electrically connected to the first to third sub-pixels SPX1, SPX2, and SPX3 may be disposed in a pattern, and multiple patterns may not be arranged in units of the sub-pixel SPXn (or not arranged in every sub-pixel SPXn) but repeatedly arranged in units of the pixel PX (or arranged in every pixel PX). For example, the sub-pixels SPXn disposed in the pixel PX may be areas distinguished based on (or divided by) the emission area EMA and the sub-regions SA1 and SA2. The circuit layer electrically connected to the sub-pixels SPXn may be disposed regardless of the position of the sub-pixel SPXn. The wires and elements of the circuit layer may not be disposed based on the sub-pixel SPXn but be disposed on the unit pixels PX, and the display device 10 may minimize the area occupied by the wires and the elements electrically connected to each sub-pixel SPXn.

Detailed description of the layers disposed on the pixel PX of the display device 10 is provided below. The display device 10 may include a first substrate SUB, a semiconductor layer, conductive layers, and insulating layers. The semiconductor layer, the conductive layers, and the insulating layers may be disposed on the first substrate SUB. The semiconductor layer, the conductive layers, and the insulating layers may each constitute the circuit layer and a display element layer of the display device 10.

The first substrate SUB may be an insulating substrate. The first substrate SUB may be made of at least one insulating material of glass, quartz, and polymer resin. For example, the first substrate SUB may be a rigid substrate, or may be a flexible substrate which may be bent, folded, or rolled. The first substrate SUB may include the display area DPA and the non-display area NDA adjacent to (e.g., surrounding) the display area DPA. The display area DPA may include the emission area EMA and the sub-regions SA1 and SA2 that are parts of the non-emission area.

A first conductive layer may be disposed on the first substrate SUB. The first conductive layer may include the first scan line SL1 and the second scan line SL2 that extend in the first direction DR1, the data lines DTL1, DTL2, and DTL3, the first voltage line VL1, the second voltage line VL2, the initialization voltage line VIL, and lower metal layers BML1, BML2, and BML3.

The first scan line SL1 and the second scan line SL2 may extend in the first direction DR1. Each first scan line SL1 and each second scan line SL2 may be disposed in each pixel PX. Each of the scan lines SL1 and SL2 may be disposed over the pixels PX arranged in the first direction DR1. The first scan line SL1 and the second scan line SL2 may be spaced apart from each other in the second direction DR2 and may be disposed on sides (e.g., both sides) of each pixel PX in the second direction DR2. One scan line of the first scan line SL1 and the second scan line SL2 may be electrically connected to each pixel PX, and the scan line electrically connected to the pixel PX may be electrically connected to each of the first to third sub-pixels SPX1, SPX2, and SPX3. The first scan line SL1 and the second scan line SL2 may be electrically connected to the second transistor T2 (e.g., refer to FIG. 4) and the third transistor T3 (e.g., refer to FIG. 4) through the third scan line SL3 and a conductive pattern disposed on another conductive layer. The first scan line SL1 and the second scan line SL2 may apply a scan signal to the second transistor T2 and the third transistor T3.

The first scan line SL1 and the second scan line SL2 may not correspond to each area occupied by the first to third sub-pixels SPX1, SPX2, and SPX3, and may be disposed in a position within the pixel PX (e.g., corresponding pixel PX). For example, the first scan line SL1 and the second scan line SL2 may correspond to each pixel PX. In an embodiment, the first scan line SL1 may be disposed over the second sub-regions SA2 on the left side of the emission areas EMA of the sub-pixels SPXn, and the second scan line SL2 may be disposed over the first sub-regions SA1 on the right side of the emission areas EMA of the sub-pixels SPXn. However, the disclosure is not limited thereto, and the relative arrangement of the first scan line SL1 and the second scan line SL2 may vary depending on the position of each pixel PX.

Among the scan lines SL1 and SL2 shown in FIGS. 4 and 5, the first scan line SL1 disposed on the left side of the emission areas EMA may be electrically connected to the sub-pixels SPXn of the corresponding pixel PX, and the second scan line SL2 disposed on the right side of the emission areas EMA may be electrically connected to a pixel PX in a pixel row and a pixel column, which are different from a pixel row and a pixel column of the corresponding pixel PX.

For example, in the pixel PX illustrated in FIG. 4, the first scan line SL1 may be electrically connected to the third scan line SL3 of the third conductive layer, and the pixels PX belonging to the same first pixel row as the corresponding pixel PX may receive the scan signal of the first scan line SL1 through the third scan line SL3. The second scan line SL2 disposed in the same first pixel column as the corresponding pixel PX may be electrically connected to the third scan line SL3 disposed in the pixel PX belonging to a second pixel row different from the first pixel row. The third scan lines SL3 may be electrically connected to at least one of the first scan line SL1 and the second scan line SL2 disposed in another pixel columns. The scan lines SL1, SL2, and SL3 may include wires extending in the first direction DR1 and the second direction DR2 to apply a scan signal to each of the pixels PX arranged in the display area DPA.

The data lines DTL1, DTL2, and DTL3 may extend in the first direction DR1. The first data line DTL1, the second data line DTL2, and the third data line DTL3 may be disposed in the pixel PX, and each of the data lines DTL1, DTL2, and DTL3 may be disposed over multiple pixels PX arranged in the first direction DR1. The first data line DTL1, the second data line DTL2, and the third data line DTL3 may be disposed adjacent to and spaced apart from each other in the second direction DR2. The second data line DTL2, the first data line DTL1, and the third data line DTL3 may be sequentially arranged in the second direction DR2, and may each be electrically connected to the first sub-pixel SPX1, the second sub-pixel SPX2, and the third sub-pixel SPX3. Each of the data lines DTL1, DTL2, and DTL3 may be electrically connected to a second transistor (e.g., 'T2' in FIG. 4) through a conductive pattern disposed on a different conductive layer from the data lines DTL1, DTL2, and DTL3 to apply a data signal to the second transistor T2.

The first to third data lines DTL1, DTL2, and DTL3 may not correspond to each area occupied by the first to third sub-pixels SPX1, SPX2, and SPX3, and may be disposed in a position within the pixel PX. In the drawings, the first to third data lines DTL1, DTL2, and DTL3 may be disposed across the emission areas EMA of the sub-pixels SPXn in each pixel PX in the first direction DR1 at the centers of the emission areas EMA. However, the disclosure is not limited thereto.

The initialization voltage line VIL may extend in the first direction DR1 and be disposed across the pixels PX arranged in the first direction DR1. The initialization voltage line VIL may be disposed between the lower metal layers BML1, BML2, and BML3 and the third data line DTL3, which is a right side of the third data line DTL3 in a plan view. However, the disclosure is not limited thereto. The initialization voltage line VIL may be electrically connected to a conductive pattern disposed on another conductive layer to be electrically connected to each of the sub-pixels SPXn. The initialization voltage line VIL may be electrically connected to the third transistor (e.g., 'T3' in FIG. 4) and may apply an initialization voltage to the third transistor T3.

The first voltage line VL1 and the second voltage line VL2 may extend in the first direction DR1, and may each be disposed across the pixels PX arranged in the first direction DR1. The first voltage line VL1 may be disposed between the lower metal layers BML1, BML2, and BML3 and the second scan line SL2, and may be spaced apart from the lower metal layers BML1, BML2, and BML3. The second voltage line VL2 may be disposed between the second data line DTL2 and the first scan line SL1, and be spaced apart from the second data line DTL2. Each of the first voltage line VL1 and the second voltage line VL2 may be electrically connected to the sub-pixels SPXn belonging to the pixel PX. The first voltage line VL1 may be electrically connected to the first electrode RME1 of each sub-pixel SPXn through a first transistor (e.g., 'T1' in FIG. 4). The second voltage line VL2 may be electrically connected to the second electrode RME2 through the fourth voltage line VL4 disposed on another conductive layer. However, the disclosure is not limited thereto. In some embodiments, the first voltage line VL1 and the second voltage line VL2 may not be electrically connected to the first electrode RME1 and the second electrode RME2, and may be electrically connected (e.g., directly connected) to the electrode CNE in contact with the light emitting element ED.

The first voltage line VL1 and the second voltage line VL2 may transmit a power voltage applied from the voltage line pads WPD_VL1 and WPD_VL2 to the electrodes RME1 and RME2 disposed in each sub-pixel SPXn, respectively. The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2.

The lower metal layers BML1, BML2, and BML3 may be disposed between the first voltage line VL1 and the initialization voltage line VIL. Each of the lower metal layers BML1, BML2, and BML3 may overlap a first active layer ACT1 of a semiconductor layer and a first electrode pattern CSE1 of the second conductive layer in a plan view. Description of the first active layer ACT1 and the first electrode pattern CSE1 is provided below. The first lower metal layer BML1 may partially overlap the first active layer ACT1 of a first transistor T1_1 in a plan view, which is electrically connected to the first sub-pixel SPX1. The second lower metal layer BML2 may partially overlap the first active layer ACT1 of a first transistor T1_2 in a plan view, which is electrically connected to the second sub-pixel SPX2. The third lower metal layer BML3 may partially overlap the first active layer ACT1 of a first transistor T1_3 in a plan view, which is electrically connected to the third sub-pixel SPX3. The first to third lower metal layers BML1, BML2, and BML3 may be spaced apart from each other in the first direction DR1 at a central portion (or center) of each pixel PX in a plan view. For example, the first lower metal layer BML1 may be disposed on the upper side (or in the upper direction) from the center of the pixel PX, the second lower metal layer BML2 may be disposed at the center of the pixel PX, and the third lower metal layer BML3 may be disposed on the lower side (or in the lower direction) from the center of the pixel PX.

The lower metal layers BML1, BML2, and BML3 may perform a function of preventing light from being incident on the active layer ACT1 of the first transistor T1. For example, the lower metal layers BML1, BML2, and BML3 may be electrically connected to the first active layer ACT1, and perform a function of stabilizing the characteristics of the first transistor T1. For example, the lower metal layers BML1, BML2, and BML3 may be formed of an opaque metal material that blocks light transmission. However, the disclosure is not limited thereto. In other embodiments, the lower metal layers BML1, BML2, and BML3 may be omitted.

A buffer layer BL may be disposed on the first conductive layer and the first substrate SUB. The buffer layer BL may be formed on the first substrate SUB to protect the transistors of the pixel PX from moisture permeating through the first substrate SUB, which is susceptible to moisture permeation. The buffer layer BL may perform a surface planarization function.

The semiconductor layer may be disposed on the buffer layer BL. The semiconductor layer may include the active layers ACT1, ACT2, and ACT3 of the transistors T1, T2, and T3.

The semiconductor layer may include polycrystalline silicon, monocrystalline silicon, oxide semiconductor, and the like. In another embodiment, the semiconductor layer may include polycrystalline silicon. The oxide semiconductor of the semiconductor layer may be an oxide semiconductor containing indium (In). For example, the oxide semiconductor of the semiconductor layer may be (or include) at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

The first active layers ACT1 of the first transistors T1_1, T1_2, and T1_3 electrically connected to each of the sub-pixels SPX1, SPX2, and SPX3 may be disposed on the right side (or in the right direction) from the center of each pixel PX. The first active layers ACT1 may be substantially disposed between the emission areas EMA and the first sub-regions SA1 of the sub-pixels SPXn. The first active layers ACT1 may be spaced apart from each other in the first direction DR1, and may partially overlap the lower metal layers BML1, BML2, and BML3, the first voltage line VL1, the first electrode pattern CSE1 of the second conductive layer, a third conductive pattern DP3 of the third conductive layer, and a second electrode pattern CSE2 of the third conductive layer in a plan view. For example, each first active layer ACT1 may include a first area overlapping the third conductive pattern DP3, a second area overlapping the first electrode pattern CSE1, and a third area overlapping the second electrode pattern CSE2 in a plan view. The third area may be a portion of the first active layer ACT1 other than the first are and the second area.

The second active layers ACT2 of second transistors T2_1, T2_2, and T2_3 electrically connected to each of the sub-pixels SPX1, SPX2, and SPX3 may be disposed adjacent to the center of each pixel PX. The second active layers ACT2 may be spaced apart from each other in the first direction DR1, and may partially overlap a third gate pattern GP3 of the second conductive layer, a fourth conductive pattern DP4 of the third conductive layer, and a fifth conductive pattern DP5 of the third conductive layer in a plan view. For example, the second active layer ACT2 may include a first area overlapping the fourth conductive pattern DP4, a second area overlapping the third gate pattern GP3, and a third area overlapping the fifth conductive pattern DP5 in a plan view. The third area may be a portion of the second active layer ACT2 other than the first area and the second area. The first area of the second active layer ACT2 may be in contact with the fourth conductive pattern DP4. The third area of the second active layer ACT2 may be in contact with the fifth conductive pattern DP5.

The second active layers ACT2 of the second transistors T2 may have lengths different from each other according to the disposition of the data lines DTL1, DTL2, and DTL3. For example, the third data line DTL3, the first data line DTL1, and the second data line DTL2 may be sequentially disposed in the second direction DR2 from the areas in which the second active layers ACT2 are disposed. The second active layer ACT2 of the second transistor T2_2 electrically connected to the second sub-pixel SPX2 may have the longest length measured in the second direction DR2 as the second data line DTL2 may be spaced apart most. The second active layer ACT2 of the second transistor T2_3 electrically connected to the third sub-pixel SPX3 may have the shortest length measured in the second direction DR2 as the third data line DTL3 is most adjacently disposed. For example, in FIGS. 4 and 5, the length of the second active layer ACT2 of the second transistor T2_2 may be greater than a length of the second active layer ACT2 of the second transistor T2_1, and the length of the second active layer ACT2 of the second transistor T2_1 may be greater than the length of the second active layer ACT2 of the second transistor T2_3. However, the relationship between the lengths of the second active layers ACT2 of the second transistors T2_1, T2_2, and T2_3 may vary according to the disposition of the sub-pixels SPXn and the disposition of the data lines DTL.

The third active layers ACT3 of the third transistors T3_1, T3_2, and T3_3 may be electrically connected to each of the sub-pixels SPX1, SPX2, and SPX3, and may be disposed at the center of the pixel PX. The third active layers ACT3 may be spaced apart from one another in the first direction DR1, and may be disposed side by side (or in parallel) with the second active layers ACT2 in the first direction DR1. The third active layers ACT3 may partially overlap the third gate pattern GP3 of the second conductive layer, a sixth conductive pattern DP6 of the third conductive layer, and the second electrode patterns CSE2 of the third conductive layer in a plan view. For example, the third active layer ACT3 may include a first area overlapping the sixth conductive pattern DP6, a second area overlapping the third gate pattern GP3, and a third area overlapping the second electrode pattern CSE2 in a plan view. The third area may be a portion of the third active layer ACT3 other than the first area and the second area. The first area of the third active layer ACT3 may be in contact with the sixth conductive pattern DP6, and the third area may be in contact with the second electrode pattern CSE2.

The third active layer ACT3 of the third transistors T3_1 and T3_2 may be electrically connected to the first sub-pixel SPX1 and the second sub-pixel SPX2. The first areas of the third active layer ACT3, which overlap the sixth conductive pattern DP6 in a plan view, may be integral with each other. The third active layers ACT3 of another transistors (e.g., the third transistors T3_1 and T3_2) of the sub-pixels SPXn may be partially integral with each other, and may be simultaneously turned on.

The first gate insulating layer GI may be disposed on the semiconductor layer and the buffer layer BL. The first gate insulating layer GI may serve as a gate insulating layer of the transistors T1, T2, and T3. Although the first gate insulating layer GI is patterned together with the patterns of the second conductive layer and partially disposed between the second conductive layer and the active layers ACT1, ACT2, and ACT3 of the semiconductor layer and the buffer layer BL of the semiconductor layer, the disclosure is not limited thereto. In some embodiments, the first gate insulating layer GI may be disposed on the buffer layer BL (e.g., entire buffer layer BL) to completely cover the semiconductor layer.

The second conductive layer may be disposed on the first gate insulating layer GI. The second conductive layer may include gate patterns GP1, GP2, and GP3, and the first electrode pattern CSE1.

The first gate pattern GP1 and the second gate pattern GP2 may have a shape extending in the first direction DR1, and may be disposed on the left and right sides of the pixel PX, respectively. The first gate pattern GP1 and the second gate pattern GP2 may overlap the first scan line SL1 and the second scan line SL2 in a plan view, respectively. The first gate pattern GP1 may be electrically connected (e.g., directly connected) to the first scan line SL1 through an eleventh contact hole CNT11 penetrating the buffer layer BL and the first gate insulating layer GI. The second gate pattern GP2 may be electrically connected (e.g., directly connected) to the second scan line SL2 through the eleventh contact hole CNT11 penetrating the buffer layer BL and the first gate insulating layer GI. Each of the first gate pattern GP1 and the second gate pattern GP2 may prevent the intensity of the scan signal applied from the pad area PDA through the first scan line SL1 and the second scan line SL2, from being lowered depending on the position of the display area DPA. Even if the scan lines SL1 and SL2 are cut off while extending in the first direction DR1, the scan signal may flow through the first and second gate patterns GP1 and GP2. For example, in case that the first scan line SL1 and/or the second scan line SL2 is disconnected, the scan signal may bypass through the first gate pattern GP1 and/or the second gate pattern GP2.

The third gate pattern GP3 may have a shape extending in the first direction DR1 and may be disposed at the center of each pixel PX. The third gate pattern GP3 may extend from the upper side of the pixel PX in the first direction DR1 to overlap the second active layers ACT2 and the third active layers ACT3 in a plan view. For example, the third gate pattern GP3 may overlap the second area of the second active layers ACT2 and the second area of the third active layers ACT3 in a plan view. The third gate pattern GP3 may serve as a second gate electrode G2 of the second transistor T2 and a third gate electrode G3 of the third transistor T3. The third gate pattern GP3 may be electrically connected to the first scan line SL1 or the second scan line SL2 through the third scan line SL3. The scan signal may be transferred to the second transistor T2 and the third transistor T3 through the third gate pattern GP3.

The first electrode patterns CSE1 may be spaced apart from each other in the first direction DR1, and may be disposed between the third gate pattern GP3 and the first voltage line VL1. Each of the first electrode patterns CSE1 may partially overlap the lower metal layers BML1, BML2, and BML3, the first active layer ACT1, and the second electrode pattern CSE2 of the third conductive layer in a plan view. For example, each of the first electrode patterns CSE1 may partially overlap the second area of the first active layer ACT1 in a plan view and serve as the first gate electrode G1 of the first transistor T1. The first electrode pattern CSE1 may be electrically connected to the fourth conductive pattern DP4, and may transfer a data signal applied through the second transistor T2 to the first gate electrode G1 of the first transistor T1. The first electrode pattern CSE1 may overlap the second electrode pattern CSE2 in a plan view to constitute the storage capacitor Cst. The first electrode pattern CSE1 may be a first capacitive electrode of the storage capacitor Cst, and the second electrode pattern CSE2 may be a second capacitive electrode thereof.

A first interlayer insulating layer IL1 may be disposed on the second conductive layer. The first interlayer insulating layer IL1 may function as an insulating film between the second conductive layer and other layers (e.g., third conductive layer) disposed thereon, and may protect the second conductive layer.

A third conductive layer may be disposed on the first interlayer insulating layer IL1. The third conductive layer may include a third scan line SL3, the third voltage line VL3, the fourth voltage line VL4, and conductive patterns DP1, DP2, DP3, DP4, DP5, and DP6.

The third scan line SL3 may extend in the second direction DR2 and may be disposed over the pixels PX arranged in the second direction DR2. The third scan line SL3 may be disposed across the first sub-pixel SPX1, and disposed on the upper side of each pixel PX in a plan view. The third scan line SL3 may be electrically connected to the first scan line SL1 or the second scan line SL2 of the first conductive layer. The third scan line SL3 may be electrically connected to the first scan line SL1 or the second scan line SL2 through a ninth contact hole CNT9 penetrating through the buffer layer BL, the first gate insulating layer GI, and the first interlayer insulating layer IL1.

When the third scan line SL3 (e.g., corresponding third scan line SL3) is electrically connected to the first scan line SL1 disposed in the pixel PX (e.g., corresponding pixel PX), the corresponding third scan line SL3 may not be electrically connected to another second scan lines SL2 disposed in the same row as the corresponding pixel PX. The corresponding third scan line SL3 and another third scan line SL3 spaced apart from each other in the first direction DR1 may be electrically connected to another scan lines SL1 and SL2 (e.g., another scan lines SL1 and SL2 disposed in another pixel PX) except for the first scan line SL1 disposed in the pixel PX.

The third scan line SL3 may be electrically connected to the third gate pattern GP3 of the second conductive layer and may be electrically connected to the second transistor T2 and the third transistor T3. The third scan line SL3 may be electrically connected to the third gate pattern GP3 through a tenth contact hole CNT10 penetrating the first interlayer insulating layer IL1. Each third scan line SL3 may be electrically connected to each of the third gate patterns GP3 disposed on the pixels PX in the same row. The third scan line SL3 may transmit a scan signal to the gate electrode of the second transistor T2 and the third transistor T3 through the first scan line SL1 (or the second scan line SL2) and the third gate pattern GP3.

The third voltage line VL3 and the fourth voltage line VL4 may extend in the second direction DR2 and may be disposed over the pixels PX arranged in the second direction DR2. The third voltage line VL3 may be disposed on the upper side of each pixel PX in a plan view. The fourth voltage line VL4 may be disposed on the lower side of each pixel PX in a plan view. The third voltage line VL3 and the fourth voltage line VL4 may be substantially disposed in the non-emission area of each pixel PX, and may overlap the bank layer BNL in a plan view. The third voltage line VL3 may be electrically connected to the first voltage line VL1, and the fourth voltage line VL4 may be electrically connected to the second voltage line VL2. The third voltage line VL3 and the fourth voltage line VL4 may be alternately and repeatedly disposed over the pixels PX and spaced apart from each other in the first direction DR1.

The voltage lines VL1, VL2, VL3, and VL4 may extend in the first direction DR1 and the second direction DR2, and may be disposed in a mesh structure in the display area DPA. The first voltage line VL1 and the second voltage line VL2 may be formed of the first conductive layer. The first voltage line VL1 and the second voltage line VL2 may be disposed for each pixel PX, and extend in the first direction DR1. The third voltage line VL3 and the fourth voltage line VL4 may be formed of the third conductive layer. The third voltage line VL3 and the fourth voltage line VL4 may be disposed in the pixels PX in multiple rows, and extend in the second direction DR2.

The pixel rows may be distinguished by the relative arrangement of the third voltage line VL3 and the fourth voltage line VL4. For example, as illustrated in the drawing, when the third voltage line VL3 is disposed on the upper side and the fourth voltage line VL4 is disposed on the lower side in the pixels PX in the first pixel row, the third voltage line VL3 may be disposed on the lower side and the fourth voltage line VL4 may be disposed on the upper side in another second pixel rows adjacent to the first pixel row in the first direction DR1. The third voltage line VL3 and the fourth voltage line VL4 may be disposed between multiple pixel rows adjacent in the first direction DR1, and the pixels PX in the pixel rows adjacent in the first direction DR1 may share the third voltage line VL3 or the fourth voltage line VL4. The display device 10 may reduce the number of wires disposed in the display area DPA, and may prevent a voltage drop of the voltage applied through a voltage line in a large display device. In the pixels PX in the pixel rows adjacent in the first direction DR1, the relative arrangement of the third voltage line VL3 and the fourth voltage line VL4 may be different from each other and, accordingly, the arrangement of the electrodes RME and the connection electrodes CNE disposed above the third conductive layer may also be different from each other.

For example, in the first pixel row, in which the third voltage line VL3 is disposed on the upper side (e.g., the upper side of the pixel PX), the third voltage line VL3 may be electrically connected to the first voltage line VL1 through a thirteenth contact hole CNT13 penetrating the buffer layer BL, the first gate insulating layer GI, and the first interlayer insulating layer IL1. The third voltage line VL3 may include a first line contact portion VT1 disposed at a portion of the third voltage line VL3, which intersects the first voltage line VL1 and has a width greater than that of another portion. The first line contact portion VT1 may be electrically connected to the first voltage line VL1 through the thirteenth contact hole CNT13. In the first pixel row, the fourth voltage line VL4 may be disposed on the lower side (e.g., the lower side of the pixel PX), and may be electrically connected to the second voltage line VL2 through a fourteenth contact hole CNT14 penetrating the buffer layer BL, the first gate insulating layer GI, and the first interlayer insulating layer IL1. The fourth voltage line VL4 may include a second line contact portion VT2 disposed at a portion of the fourth voltage line VL4, which intersects the second voltage line VL2 and protrudes in the first direction DR1. The second line contact portion VT2 may be electrically connected to the second voltage line VL2 through the fourteenth contact hole CNT14. Each of the first line contact portion VT1 and the second line contact portion VT2 may be electrically connected to the dummy pattern EP and the second electrode RME2. Description of the dummy pattern EP and the second electrode RME2 is provided below.

The second electrode patterns CSE2 may overlap the first electrode pattern CSE1 and the lower metal layers BML1, BML2, and BML3, and may be spaced apart from each other in the first direction DR1. The second electrode pattern CSE2 may overlap the first electrode pattern CSE1 with the first interlayer insulating layer IL1 interposed therebetween. The storage capacitor Cst may be formed between second electrode pattern CSE2 and the first electrode pattern CSE1. Among the second electrode patterns CSE2, the second electrode pattern CSE2 disposed on the upper side of the pixel PX may form the storage capacitor Cst of the first sub-pixel SPX1, the second electrode pattern CSE2 disposed on the lower side of the pixel PX may form the storage capacitor Cst of the second sub-pixel SPX2, and the second electrode pattern CSE2 disposed at the central portion of the pixel PX may form the storage capacitor Cst of the third sub-pixel SPX3.

The second electrode pattern CSE2 may partially overlap the first active layer ACT1 and the third active layer ACT3 in a plan view. Each second electrode pattern CSE2 may be electrically connected to the first active layer ACT1 through a second contact hole CNT2 penetrating the first gate insulating layer GI and the first interlayer insulating layer IL1 at a portion of the second electrode pattern CSE2, which overlaps the first active layer ACT1 in a plan view. The second electrode pattern CSE2 may partially serve as a first source electrode S1 of the first transistor T1. The second electrode pattern CSE2 may also be electrically connected to the lower metal layers BML1, BML2, and BML3 through a fourth contact hole CNT4 penetrating the buffer layer BL, the first gate insulating layer GI, and the first interlayer insulating layer IL1. Each second electrode pattern CSE2 may be electrically connected to the third active layer ACT3 through an eighth contact hole CNT8 penetrating the first gate insulating layer GI and the first interlayer insulating layer IL1 at a portion of the second electrode pattern CSE2, which overlaps the third active layer ACT3 in a plan view. The second electrode pattern CSE2 may partially serve as a third source S3 of the third transistor T3.

Each second electrode pattern CSE2 may be electrically connected to the first electrode RME1 disposed on the via layer VIA. The second electrode patterns CSE2 may be spaced apart from each other in the first direction DR1, and may be electrically connected to the first electrodes RME1 disposed in multiple sub-pixels SPXn. In the display device 10 according to an embodiment, the arrangement of the sub-pixels SPXn of the pixel PX may be designed in consideration of the connection between the first electrodes RME1 and the second electrode pattern CSE2. Since the second electrode patterns CSE2 are arranged in the first direction DR1, the sub-pixels SPXn of each pixel PX may also be arranged in the first direction DR1, and each of the second electrode patterns CSE2 may overlap each area occupied by the sub-pixels SPXn in a plan view. The first electrodes RME1 of the sub-pixels SPXn may also be spaced apart from each other in the first direction DR1, and the first electrodes RME1 of the sub-pixels SPXn may overlap multiple second electrode patterns CSE2 in a thickness direction. The contact holes (e.g., first electrode contact holes CTD) of the via layer VIA through which the first electrode RME1 and the second electrode pattern CSE2 are electrically connected to each other may be spaced apart from each other in the first direction DR1. The contact holes (e.g., first electrode contact holes CTD) of the vial layer VIA may be formed at the same position in each sub-pixel SPXn.

The first conductive pattern DP1 and the second conductive pattern DP2 may have a shape extending in the first direction DR1, and may be disposed on the left and right sides of the pixel PX, respectively. The first conductive pattern DP1 may overlap the first scan line SL1 and the first gate pattern GP1, and the second conductive pattern DP2 may overlap the second scan line SL2 and the second gate pattern GP2 in a plan view. The first conductive pattern DP1 may be electrically connected (e.g., directly connected) to the first scan line SL1 through a twelfth contact hole CNT12 penetrating the buffer layer BL and the first gate insulating layer GI. The second conductive pattern DP2 may be electrically connected (e.g., directly connected) to the second scan line SL2 through the twelfth contact hole CNT12 penetrating the buffer layer BL and the first gate insulating layer GI.

The third conductive pattern DP3 may have a shape extending in the first direction DR1 and may be disposed on the right side of the second electrode patterns CSE2. The third conductive pattern DP3 may partially overlap the first voltage line VL1 and the first active layer ACT1 in a plan view, and may be electrically connected to each of the first voltage line VL1 and the first active layer ACT1. The third conductive pattern DP3 may be in contact with the first voltage line VL1 through a third contact hole CNT3 penetrating the buffer layer BL, the first gate insulating layer GI, and the first interlayer insulating layer IL1. The third conductive pattern DP3 may be in contact with the first active layer ACT1 through the first contact hole CNT1 penetrating the first gate insulating layer GI and the first interlayer insulating layer IL1, respectively. A part of the third conductive pattern DP3 may serve as a first drain electrode D1 of the first transistor T1. The third conductive pattern DP3 may be electrically connected to the third voltage line VL3, or may be spaced apart from the third voltage line VL3.

The fourth conductive patterns DP4 may overlap any one of the second active layer ACT2 and the data lines DTL in a plan view. The fifth conductive patterns DP5 may overlap the second active layer ACT2 and the first electrode pattern CSE1 in a plan view. The fourth conductive patterns DP4 may be in contact with the data line DTL through the fifth contact hole CNT5 penetrating the buffer layer BL, the first gate insulating layer GI, and the first interlayer insulating layer IL1. The fourth conductive patterns DP4 may be in contact with the second active layer ACT2 through the fifth contact hole CNT5 penetrating the first gate insulating layer GI and the first interlayer insulating layer IL1. The fourth conductive pattern DP4 may serve as the second drain electrode D2 of the second transistor T2. The fifth conductive patterns DP5 may be in contact with the first electrode pattern CSE1 through a sixth contact hole CNT6 penetrating the first interlayer insulating layer IL1. The fifth conductive patterns DP5 may be in contact with the second active layer ACT2 through the sixth contact hole CNT6 penetrating the first gate insulating layer GI and the first interlayer insulating layer IL1. The fifth conductive pattern DP5 may serve as a second source electrode S2 of the second transistor T2.

The sixth conductive patterns DP6 may overlap the initialization voltage line VIL and the third active layer ACT3 in a plan view. The sixth conductive patterns DP6 may be in contact with the initialization voltage line VIL through the seventh contact hole CNT7 penetrating the buffer layer BL, the first gate insulating layer GI, and the first interlayer insulating layer IL1. The sixth conductive patterns DP6 may be in contact with the third active layer ACT3 through the seventh contact hole CNT7 penetrating the first gate insulating layer GI and the first interlayer insulating layer IL1. The sixth conductive pattern DP6 may serve as a third drain electrode D3 of the third transistor T3.

A first passivation layer PV1 may be disposed on the third conductive layer. The first passivation layer PV1 may function as an insulating film between the third conductive layer and other layers disposed thereon, and may protect the third conductive layer.

In the drawing, the conductive layer below the via layer VIA may be formed of the first to third conductive layers, but is not limited thereto. In some embodiments, the display device 10 may further include a fourth conductive layer disposed between the third conductive layer and the via layer VIA, and the fourth conductive layer may include several conductive patterns.

Each of the buffer layer BL, the first gate insulating layer GI, the first interlayer insulating layer IL1, and the first passivation layer PV1 may be formed of inorganic layers stacked each other in an alternating manner. For example, each of the buffer layer BL, the first gate insulating layer GI, the first interlayer insulating layer IL1, and the first passivation layer PV1 may be formed as a double layer formed by stacking inorganic layers, or a multilayer formed by alternately stacking inorganic layers. The inorganic layers of the buffer layer BL, the first gate insulating layer GI, the first interlayer insulating layer IL1 and the first passivation layer PV1 may include at least one of silicon oxide ($SiO_x$), silicon nitride ($SiN_x$), and silicon oxynitride ($SiO_xN_y$). However, the disclosure is not limited thereto, and each of the buffer layer BL, the first gate insulating layer GI, the first interlayer insulating layer IL1, and the first passivation layer PV1 may be formed as a single inorganic layer containing the above-described insulating material. In some embodiments, the first interlayer insulating layer IL1 may be made of an organic insulating material such as polyimide (PI) or the like.

Each of the second conductive layer and the third conductive layer may be formed as a single layer or multiple layers made of at least one of molybdenum (Mo), aluminum (Al), chromium (Cr), gold (Au), titanium (T1), nickel (Ni), neodymium (Nd) and copper (Cu) and an alloy thereof. However, the disclosure is not limited thereto.

A via layer VIA may be disposed on the first passivation layer PV1 in the display area DPA. The via layer VIA may include an organic insulating material, for example, polyimide (PI), to perform a surface planarization function.

The electrodes RME (e.g., the first electrode RME1 and the second electrode RME2), bank patterns BP (e.g., first bank pattern BP1 and second bank pattern BP2), the bank layer BNL, the light emitting elements ED, and the connection electrodes CNE (e.g., a first connection electrode CNE1, a second connection electrode CNE2, and a third connection electrode CNE3) may be disposed as the display element layer on the via layer VIA. Insulating layers PAS1, PAS2, and PAS3 may be disposed on the via layer VIA.

The bank patterns BP1 and BP2 may be disposed on the via layer VIA. The bank patterns BP1 and BP2 may have a width in the first direction DR1 and may have a shape extending in the second direction DR2. The bank patterns BP1 and BP2 may have different widths measured in the first direction DR1. The bank patterns BP1 and BP2 may be disposed across the emission areas EMA of multiple sub-pixels SPXn or may correspond to the emission area EMA of any one sub-pixel SPXn. For example, the bank patterns BP1 and BP2 may include the first bank pattern BP1 corresponding to the emission area EMA of each sub-pixel SPXn and the second bank pattern BP2 disposed across the emission areas EMA of the sub-pixels SPXn.

The first bank pattern BP1 may be disposed at the central portion of the emission area EMA. Adjacent ones of the second bank patterns BP2 may be spaced apart from the first bank pattern BP1 with the first bank pattern BP1 interposed therebetween. The first bank pattern BP1 and the second bank pattern BP2 may be alternately disposed in the first direction DR1. Each second bank pattern BP2 may be disposed across multiple emission areas EMA. A portion of the bank layer BNL extending in the second direction DR2 may overlap the second bank pattern BP2 in the thickness direction. The bank patterns BP1 and BP2 may be disposed in an island-like pattern on a surface (e.g., entire surface) of the display area DPA.

The first bank pattern BP1 and the second bank pattern BP2 may have a same length in the second direction DR2, but may have different widths measured in the first direction DR1. For example, the width of the first bank pattern BP1 may be smaller than the width of the second bank pattern BP2. A length of the bank patterns BP1 and BP2 extending in the second direction DR2 may be greater than a length of the emission area EMA adjacent to (or surrounded by) the bank layer BNL in the second direction DR2. The portion of the bank layer BNL extending in the first direction DR1 may partially overlap the bank patterns BP1 and BP2 in a plan view. However, the disclosure is not limited thereto. The bank patterns BP1 and BP2 may have a same width. Each of the bank patterns BP1 and BP2 and the bank layer BNL may be integral with each other. In an embodiment, the length of the bank patterns BP1 and BP2 measured in the second direction DR2 may be smaller than or equal to the length of the emission area EMA. Sides (e.g., both sides) of the bank patterns BP1 and BP2 in the second direction DR2 may not overlap the portion of the bank layer BNL extending in the first direction DR1.

The bank patterns BP1 and BP2 may be directly disposed on the via layer VIA. At least a part of each of the bank patterns BP1 and BP2 may protrude with respect to a top surface of the via layer VIA. The protruding parts of the bank patterns BP1 and BP2 may have inclined or curved surfaces. The light emitted from the light emitting element ED may be reflected by the electrode RME disposed on the bank patterns BP1 and BP2 and emitted in an upward direction of the via layer VIA. Unlike the example illustrated in the drawing, the bank patterns BP1 and BP2 may have a shape of a semi-circle whose outer surface is curved in a cross-sectional view. The bank patterns BP1 and BP2 may include an organic insulating material such as polyimide (PI), but is not limited thereto.

The electrodes RME may include portions disposed in the sub-regions SA1 and SA2, and extend in the first direction DR1. Portions of the electrodes RME may be disposed in the emission area EMA, and extend from the emission area EMA in the second direction DR2. The portions of the electrodes RME extending in the first direction DR1 may be disposed in the sub-regions SA1 and SA2 of the pixel PX. The portions of the electrodes RME may extend in the second direction DR2, and may be partially disposed in the emission area EMA.

The electrodes RME may include the first electrodes RME1, and the second electrode RME2. The second electrode RME1 may be spaced apart from the first electrode RME1.

The first electrode RME1 may include an electrode main portion RM_A disposed in the emission area EMA, an electrode piece portion RM_P disposed in any one of the sub-regions SA1 and SA2, and a first electrode connection portion RM_C1 electrically connecting the electrode main portion RM_A to the electrode piece portion RM_P. In the pixel PX illustrated in FIGS. 4 to 8, the electrode piece portion RM_P of the first electrode RME1 may be disposed in the first sub-region SA1 disposed on the right side of the emission area EMA.

The electrode main portion RM_A of the first electrode RME1 may have a shape extending in the second direction DR2 and may be disposed on the first bank pattern BP1 at the center of each sub-pixel SPXn. A width of the electrode main portion RM_A of the first electrode RME1 measured in the first direction DR1 may be greater than a width of the first bank pattern BP1. Thus, the electrode main portion RM_1 may cover the first bank pattern BP1. However, the disclosure is not limited thereto, and the electrode main portion RM_A of the first electrode RME1 may have a width smaller than that of the first bank pattern BP1. Thus, the electrode main portion RM_A may cover at least an edge of the first bank pattern BP1 or only the edge of the first bank pattern BP1.

The electrode piece portion RM_P of the first electrode RME1 may extend in a direction in the first sub-region SA1, and may be spaced apart from the electrode piece portion RM_P disposed in another first sub-region SA1 of another sub-pixel SPXn. For example, the electrode piece portions RM_P of the first electrodes RME1 may extend in the first direction DR1 at the separation portion ROP of the first sub-region SA1 and extend to another separation portion ROP of another first sub-region SA1 over the bank layer BNL. The electrode piece portions RM_P of the first electrodes RME1 may be disposed side by side (or in parallel) in the first direction DR1. The electrode piece portions RM_P may overlap the bank layer BNL disposed between the first sub-regions SA1 adjacent to each other.

The first electrode connection portion RM_C1 may be disposed between the electrode main portion RM_A and the electrode piece portion RM_P to electrically connect the electrode main portion RM_A to the electrode piece portion RM_P. The first electrode connection portion RM_C1 may overlap the portion of the bank layer BNL extending in the first direction DR1. In the first electrode RME1, the electrode main portion RM_A, the first electrode connection portion RM_C, and the electrode piece portion RM_P may be integral with one another (or be formed as one integrated pattern), and the electrode main portion RM_A, the first electrode connection portion RM_C1, and the electrode piece portion RM_P may be portions distinguished by the positions thereof.

In the first electrodes RME1, the electrode main portion RM_A may be disposed in the emission area EMA, and spaced apart from the second electrode RME2 and another electrode main portion RM_A of another first electrode RME1 in the first direction DR1. The electrode piece portion RM_P may be disposed in the first sub-region SA1, and spaced apart from another electrode piece portion RM_P of another sub-pixel SPXn in the first direction DR1. In the first electrodes RME1 of the respective sub-pixels SPXn, the electrode main portion RM_A may be disposed in the emission area EMA, and the electrode piece portion RM_P may be disposed in the first sub-region SA1. Multiple first electrodes RME1 may be formed as an electrode line by electrically connecting the electrode piece portions RM_P, and separated from each other at the separation portion ROP in the manufacturing process of the display device 10. For example, in the manufacturing process of the display device 10, the electrode line electrically connecting the electrode piece portions RM_P may be formed, and the electrode line may be separated from each other by the separation portion ROP to form the another first electrodes RME1.

The second electrode RME2 may include electrode branch portions RM_B1 and RM_B2 disposed in the emission area EMA, an electrode stem portion RM_S disposed in any one of the sub-regions SA1 and SA2, and a second electrode connection portion RM_C2 electrically connecting the electrode stem portion RM_S to the electrode branch portions RM_B1 and RM_B2. In each pixel PX illustrated in FIGS. 4 to 8, the electrode stem portion RM_S of the second electrode RME2 may be disposed in the second sub-region SA2 disposed on the left side of the emission area EMA. The second electrode RME2 may include the electrode stem portion RM_S and extend substantially in the first direction DR1. The second electrode RME2 may have a shape branched in the second direction DR2 toward the emission area EMA of each sub-pixel SPXn.

The electrode stem portion RM_S of the second electrode RME2 may extend in the first direction DR1 in the second sub-region SA2, and may be disposed across the sub-regions SA1 and SA2 of the pixels PX and sub-pixels SPXn. The electrode stem portion RM_S may be disposed across the portion of the bank layer BNL extending in the second direction DR2. Unlike the first electrode RME1, in the second electrode RME2, an electrode stem portion RM_S may not be partially separated in the second sub-region SA2. Thus, the portions of the second electrode RME2 disposed in the sub-pixels SPXn may be electrically connected by the electrode stem portion RM_S.

The second electrode connection portions RM_C2 of the second electrode RME2 may be branched from the electrode stem portion RM_S in the second direction DR2. The second electrode connection portion RM_C2 may be disposed at a portion where the portion of the bank layer BNL extending in the first direction DR1 and the portion of the bank layer BNL extending in the second direction DR2 intersect with each other. Each of the second electrode connection portions RM_C2 may protrude from the electrode stem portion RM_S at the portion of the bank layer BNL extending in the second direction DR2. Each of the second electrode connection portions RM_C2 may electrically connect the electrode branch portions RM_B1 and RM_B2 to the electrode stem portion RM_S disposed in the emission area EMA.

The electrode branch portions RM_B1 and RM_B2 of the second electrode RME2 may be branched from the second electrode connection portion RM_C2. The electrode branch portions RM_B1 and RM_B2 may be bent toward sides (e.g., both sides) in the first direction DR1, or toward the upper side and the lower side at the second electrode connection portion RM_C2. The electrode branch portions RM_B1 and RM_B2 may be disposed across the emission area EMA in the second direction DR2. The electrode branch portions RM_B1 and RM_B2 may be bent again at a portion of the electrode branch portions RM_B1 and RM_B2, which overlaps the bank layer BNL in a plan view and is connected (e.g., electrically and physically connected) to each other. The electrode branch portions RM_B1 and RM_B2 of the second electrode RME2 may be branched on the left side of the emission area EMA of any one sub-pixel SPXn, and may be connected (e.g., electrically and physically connected) to each other again on the right side thereof.

The second electrode RME2 may include a first electrode branch portion RM_B1 disposed on the lower side of the electrode main portion RM_A of the first electrode RME1 and a second electrode branch portion RM_B2 disposed on the upper side of the electrode main portion RM_A of the first electrode RME1. The pair of electrode branch portions RM_B1 and RM_B2 connected (e.g., electrically and physically connected) to each other may be disposed in the emission areas EMA of multiple sub-pixels SPXn adjacent in the first direction DR1. First electrode branch portions RM_B1 and second electrode branch portions RM_B2 of multiple second electrodes RME2 may be disposed in each sub-pixel SPXn. The first electrode branch portion RM_B1 between a pair of electrode branch portions RM_B1 and RM_B2 may be disposed on the lower side with respect to the electrode main portion RM_A of the first electrode RME1. The second electrode branch portion RM_B2 between another pair of electrode branch portions RM_B1 and RM_B2 may be disposed on the upper side with respect to the electrode main portion RM_A.

The electrode branch portions RM_B1 and RM_B2 of the second electrode RME2 may be disposed on a side of the second bank pattern BP2. The first electrode branch portion RM_B1 may be disposed on the second bank pattern BP2 disposed on the lower side of the first bank pattern BP1. The second electrode branch portion RM_B2 may be disposed on the second bank pattern BP2 disposed on the upper side of the first bank pattern BP1. Sides (e.g., both sides) of the electrode main portion RM_A of the first electrode RME1 may face and be spaced apart from another electrode branch portions RM_B1 and RM_B2 of another pair to face each other. A gap between the electrode main portion RM_A and the electrode branch portions RM_B1 and RM_B2 of the first electrode RME1 may be smaller than a gap between the bank patterns BP1 and BP2. The electrode main portion RM_A of the first electrode RME1 and the electrode branch portions RM_B1 and RM_B2 of the second electrode RME2 may be at least partially directly disposed on the via layer VIA. Thus, the electrode main portion RM_A of the first electrode RME1 and the electrode branch portions RM_B1 and RM_B2 of the second electrode RME2 may be disposed on a same plane.

The width of the electrode main portion RM_A of the first electrode RME1 measured in the first direction DR1 may be greater than the widths of the electrode branch portions RM_B1 and RM_B2 of the second electrode RME2. The electrode main portion RM_A of the first electrode RME1 may cover sides (e.g., both sides) of the first bank pattern BP1, and the electrode branch portions RM_B1 and RM_B2 of the second electrode RME2 may cover only a side edge (or only a side) of the second bank pattern BP2 due to relatively small widths of the electrode branch portions RM_B1 and RM_B2. The first electrode RME1 and the second electrode RME2 may cover at least one side surface of the bank patterns BP1 and BP2 and may reflect the light emitted from the light emitting element ED.

Figure 12:
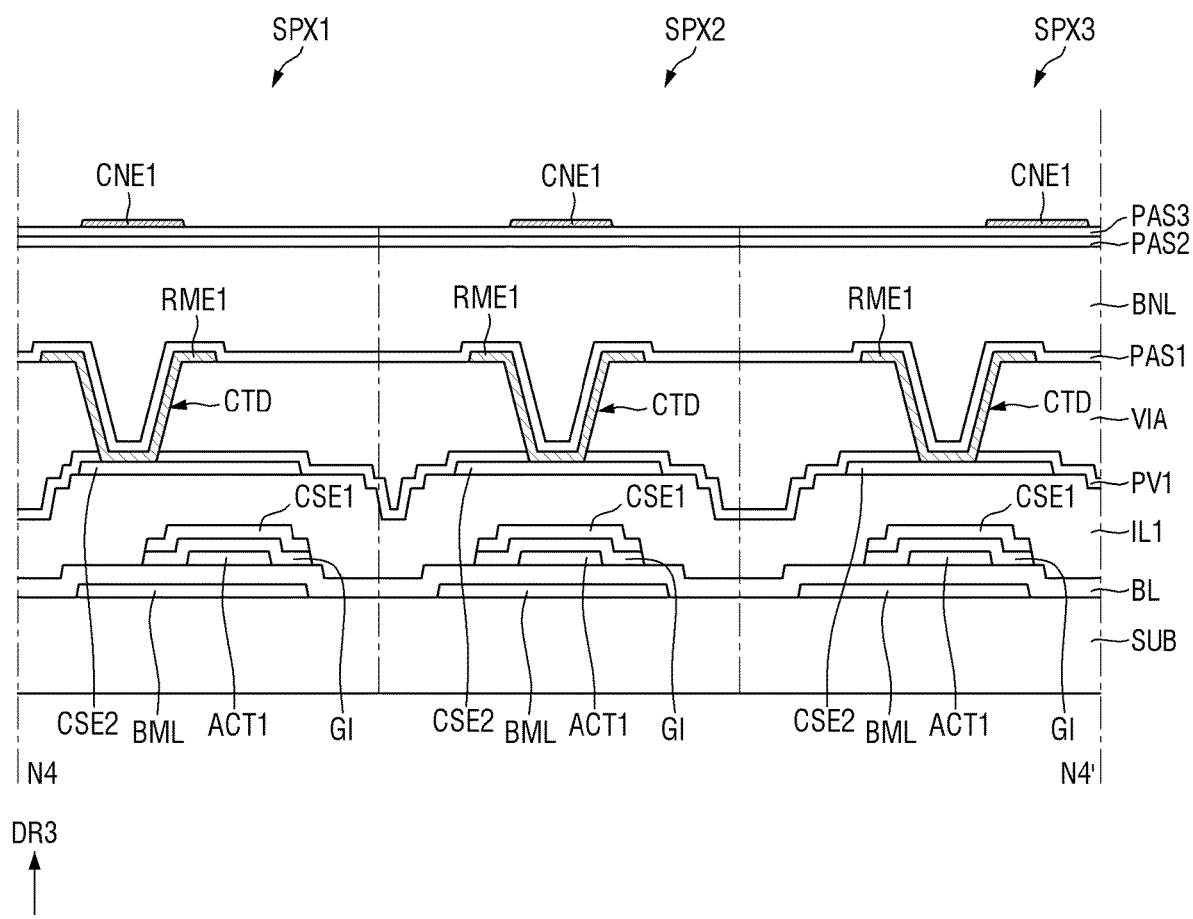
FIG. 12 is a schematic cross-sectional view taken along line N4-N4' of FIG. 8.

FIG. 12 is a schematic cross-sectional view taken along line N4-N4' of FIG. 8. FIG. 12 illustrates a cross section across first electrode contact holes CTDs disposed in a pixel PX in the first direction DR1.

Referring to FIGS. 10 and 12, the first electrode RME1 may be electrically connected to the first voltage line VL1 through the first transistor T1. The first electrode connection portion RM_C1 of the first electrode RME1 may be disposed under the bank layer BNL, and may be in contact with the second electrode pattern CSE2 of the third conductive layer through the first electrode contact hole CTD penetrating the via layer VIA and the first passivation layer PV1. The first electrode RME1 may be electrically connected to the first transistor T1 through the second electrode pattern CSE2, and the first power voltage may be transmitted through the first voltage line VL1.

In the display device 10 (e.g., refer to FIG. 1) according to an embodiment, the arrangement of the sub-pixels SPXn and the electrodes RME disposed in each sub-pixel SPXn may correspond to a structure in which the second electrode patterns CSE2 of the third conductive layer and the first transistors T1 are spaced apart from each other in the first direction DR1. The second electrode patterns CSE2 of the third conductive layer may be disposed under the via layer VIA.

For example, the second electrode patterns CSE2 of the third conductive layer may be spaced apart from each other in the first direction DR1 on the right side (or in the right direction) from the center of the pixel PX. The second electrode patterns CSE2 may be disposed in areas occupied by multiple sub-pixels SPXn. The first voltage line VL1 and the second voltage line VL2 of the first conductive layer may extend in the first direction DR1. The second electrode pattern CSE2 of the third conductive layer and the first transistors T1 may also be arranged in the first direction DR1. Accordingly, the sub-pixels SPXn of each pixel PX may also be arranged in the first direction DR1.

Multiple second electrode patterns CSE2 may be electrically connected to the first transistors T1, which are electrically connected to the sub-pixels SPXn. Multiple first electrodes RME1 disposed in the sub-pixels SPXn may be in contact with the second electrode patterns CSE2. The first electrode RME1 disposed in the first sub-pixel SPX1 may be in contact with the second electrode pattern CSE2 electrically connected to the first transistor T1, which is electrically connected to the first sub-pixel SPX1. The first electrodes RME1 disposed in the second sub-pixel SPX2 and the third sub-pixel SPX3 (e.g., corresponding sub-pixels SPX2 and SPX3) may be in contact with the second electrode patterns CSE2 electrically connected to the first transistors T1, which are electrically connected to the corresponding sub-pixels SPX2 and SPX3. The first electrodes RME1 disposed in each pixel PX (e.g., corresponding pixel PX) may have the arrangement structure corresponding to the arrangement of the second electrode patterns CSE2 disposed in the corresponding pixel PX. In case that the second electrode patterns CSE2 are spaced apart from each other in the first direction DR1, the first electrodes RME1 of the corresponding pixel PX may also be spaced apart from each other in the first direction DR1.

Since the second electrode patterns CSE2 are disposed side by side (or in parallel) in the first direction DR1, the first electrodes RME1 and the first electrode contact holes CTD may also be disposed side by side (or in parallel) in the first direction DR1. Accordingly, the display device 10 may be advantageous in that the first electrode contact holes CTD penetrating the via layer VIA may be designed to be disposed side by side (or in parallel). The first electrode contact hole CTD may overlap the second electrode pattern CSE2 and the lower metal layers BML1, BML2, and BML3 in a plan view. Thus, a lower stepped portion may be formed in a flat area. Accordingly, when the first electrode RME1 is in contact with the second electrode pattern CSE2, disconnection of a material may be prevented.

Figure 13:
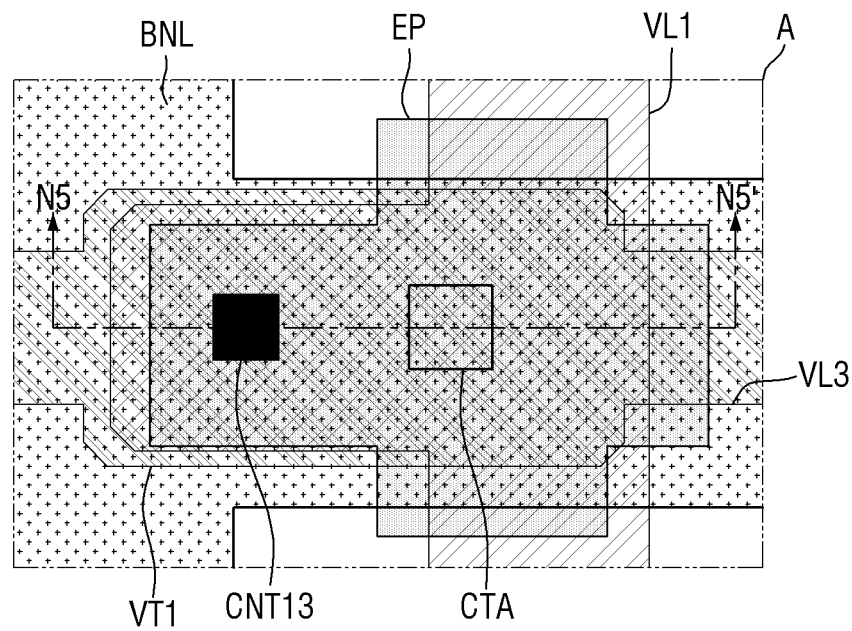
FIG. 13 is a schematic enlarged view of area A and area B of FIG. 8.
Figure 13:
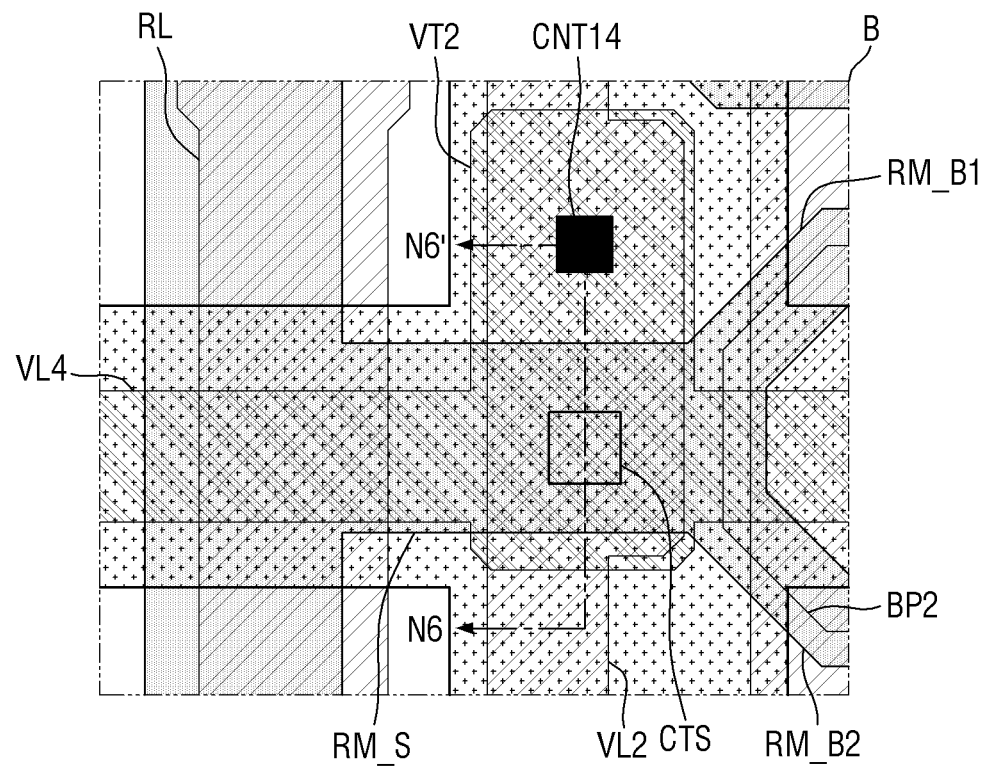
Figure 14:
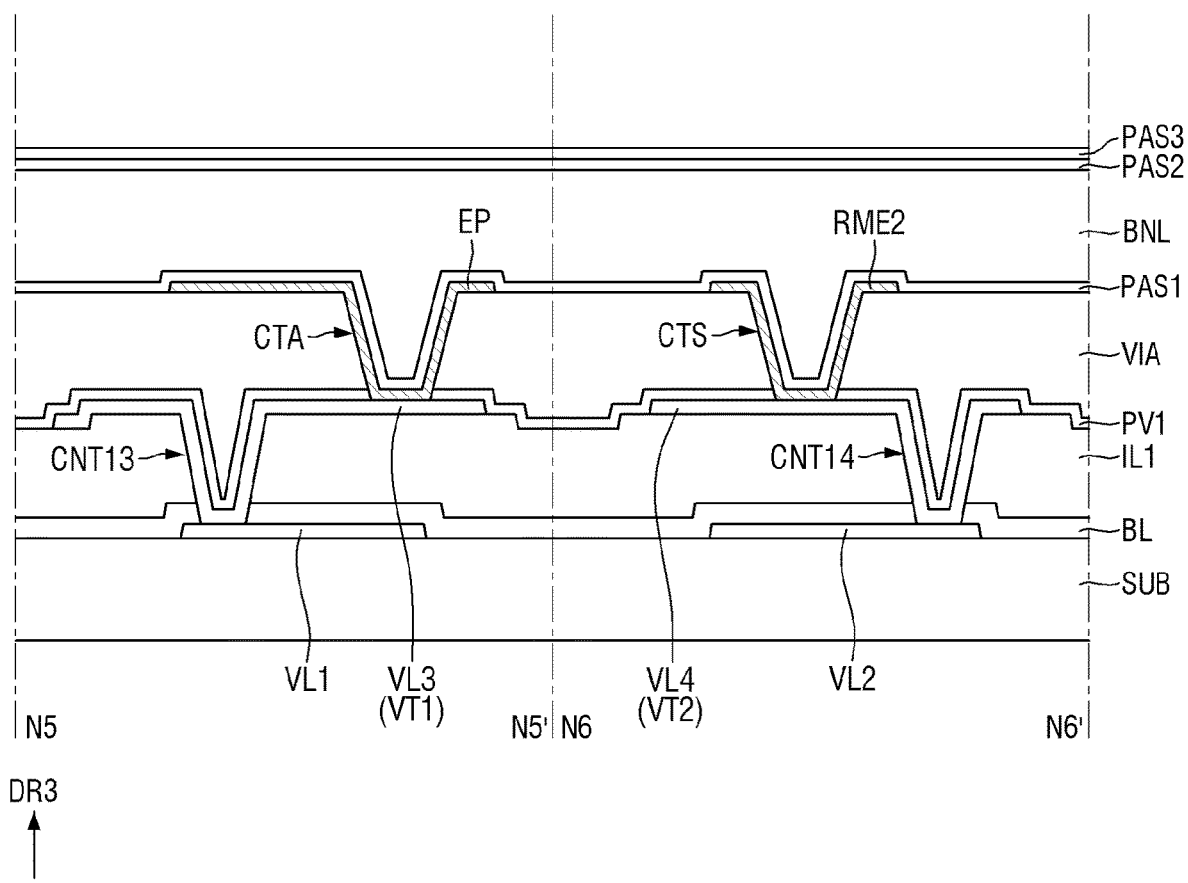
FIG. 14 is a schematic cross-sectional view taken along lines N5-N5' and N6-N6' of FIG. 13.

FIG. 13 is a schematic enlarged view of area A and area B of FIG. 8. FIG. 14 is a schematic cross-sectional view taken along lines N5-N5' and N6-N6' of FIG. 13. FIG. 13 is a schematic enlarged view of areas where the dummy pattern EP, a part of the second electrode RME2, a second electrode contact hole CTS, and a third electrode contact hole CTA of a pixel PX are disposed. FIG. 14 schematically illustrates a cross section across the second electrode contact hole CTS and the third electrode contact hole CTA.

Referring to FIGS. 8, 13, and 14, the third voltage line VL3 may be electrically connected to the first voltage line VL1 through the thirteenth contact hole CNT13 penetrating the buffer layer BL, the first gate insulating layer GI, and the first interlayer insulating layer IL1. The third voltage line VL3 may include the first line contact portion VT1 disposed at a portion of the third voltage line VL3, which intersects the first voltage line VL1 and has a width greater than that of another portion of the third voltage line VL3. The first line contact portion VT1 may be electrically connected to the first voltage line VL1 through the thirteenth contact hole CNT13. The fourth voltage line VL4 may be disposed on the lower side (e.g., the lower side of the pixel PX). The fourth voltage line VL4 may be electrically connected to the second voltage line VL2 through the fourteenth contact hole CNT14 penetrating the buffer layer BL, the first gate insulating layer GI, and the first interlayer insulating layer IL1. The fourth voltage line VL4 may include the second line contact portion VT2 disposed at a portion of the fourth voltage line VL4, which intersects the second voltage line VL2 and protrudes in the first direction DR1. The second line contact portion VT2 may be electrically connected to the second voltage line VL2 through the fourteenth contact hole CNT14.

The second electrode RME2 may be electrically connected to the second voltage line VL2. The second electrode connection portion RM_C2 of the second electrode RME2 may be in contact with the second line contact portion VT2 of the fourth voltage line VL4 of the third conductive layer through the second electrode contact hole CTS penetrating the via layer VIA and the first passivation layer PV1. The second electrode RME2 may be electrically connected to the second voltage line VL2 through the fourth voltage line VL4, and the second power voltage may be transmitted to the second electrode RME2. Since the second electrode RME2 includes the electrode branch portions RM_B1 and RM_B2 branched from each electrode stem portion RM_S and disposed in the sub-pixels SPXn, the electrode branch portions RM_B1 and RM_B2 disposed in the sub-pixels SPXn may receive the second power voltage through the electrode stem portion RM_S.

The display device 10 according to an embodiment may include the dummy pattern EP disposed between the electrode piece portions RM_P of the first electrodes RME1 and between the pixels PX adjacent in the first direction DR1. The dummy pattern EP may be disposed between the first electrode RME1 disposed in the first sub-pixel SPX1 of the pixel PX (or any one pixel PX of FIG. 8) and the first electrode RME1 disposed in another third sub-pixel SPX3 of another pixel PX. The dummy pattern EP may overlap the portion of the bank layer BNL extending in the second direction DR2 adjacent to (e.g., surrounding) the first sub-region SA1, and may be spaced apart from the electrode piece portions RM_P of the first electrodes RME1 with the separation portion ROP interposed therebetween. The dummy pattern EP may also be integral with the electrode piece portions RM_P of the first electrodes RME1, and separated from the first electrode RME1 at the separation portion ROP. For example, in the manufacturing process of the display device 10, the dummy pattern EP and the electrode piece portions RM_P may be integral with each other, and the dummy pattern EP may be separated from the electrode piece portions RM_P by the separation portion ROP.

The dummy pattern EP may be electrically connected to the first voltage line VL1 through the third voltage line VL3. The dummy pattern EP may be in contact with the first line contact portion VT1 of the third voltage line VL3 of the third conductive layer through the third electrode contact hole CTA penetrating the via layer VIA and the first passivation layer PV1. The dummy pattern EP may be electrically connected to the first voltage line VL1 through the third voltage line VL3, and the signal applied to the first voltage line VL1 may be transmitted to the dummy pattern EP.

In the manufacturing process of the display device 10, the first electrodes RME1 may be electrically connected to the electrode piece portions RM_P and another first electrodes RME1. The signal applied to the first voltage line VL1 may be transmitted to the first electrode RME1 through the third voltage line VL3 and the dummy pattern EP. A same signal may be transmitted to the first electrodes RME1 electrically connected to each other. In case that the electrode piece portions RM_P of the first electrodes RME1 and the dummy pattern EP are separated by the separation portion ROP, the first electrodes RME1 may be electrically connected to the first transistor T1 through the first electrode contact hole CTD. A common signal may be applied to the first electrodes RME1 through the dummy pattern EP in case that the electrode piece portions RM_P are electrically connected to each other. Different signals may be individually applied to the first electrodes RME1 through the first transistor T1 in case that the electrode piece portions RM_P are separated from each other.

The electrode RME disposed on the via layer VIA and the third conductive layer disposed under the via layer VIA may be in contact with each other through the electrode contact holes CTD, CTS, and CTA. The arrangement of the electrode contact holes CTD, CTS, and CTA may be designed in consideration of the positions of the voltage lines VL3 and VL4 and the electrode patterns CSE2. For example, the first electrode contact holes CTD may be spaced apart from each other in the first direction DR1 in each pixel PX in response to the arrangement of the second electrode patterns CSE2 of the third conductive layer. The first electrode contact holes CTD may overlap the first electrode connection portion RM_C1 of the first electrode RME1 overlapping the bank layer BNL in a plan view.

The second electrode contact holes CTS may be disposed based on the position of the fourth voltage line VL4 of the third conductive layer. The second electrode contact holes CTS may be disposed at a portion of the via layer VIA where the fourth voltage line VL4 passes and the second electrode RME2 and the bank layer BNL overlap each other. For example, the second electrode contact holes CTS may be disposed on the portion of the fourth voltage line VL4, at which the second electrode RME2 and the bank layer BNL overlap each other. For example, the second electrode contact hole CTS may overlap the second electrode connection portion RM_C2 of the second electrode RME2 disposed at the boundary between the third sub-pixel SPX3 of the pixel PX and another pixel PX adjacent to the third sub-pixel SPX3. In other embodiments, the second electrode contact hole CTS may correspond to an area where the second voltage line VL2 and the fourth voltage line VL4 intersect with each other.

The dummy pattern EP and the third electrode contact holes CTA may correspond to the position of the third voltage line VL3. For example, the dummy pattern EP and the third electrode contact hole CTA may be disposed under the bank layer BNL positioned between the first sub-regions SA1 and disposed at the boundary between the first sub-pixel SPX1 of the pixel PX and another pixel PX adjacent the first sub-pixel SPX1. In other embodiments, the dummy pattern EP and the third electrode contact holes CTA may correspond to an area where the first voltage line VL1 and the third voltage line VL3 intersect with each other.

However, the disclosure is not limited thereto. The arrangement of the electrode contact holes CTD, CTS, and CTA may vary depending on the arrangement of the conductive layers (e.g., the second electrode patterns CSE2, the third voltage line VL3, and the fourth voltage line VL4) disposed thereunder. Further, the shapes of the electrodes RME1 and RME2 and the shape of the bank layer BNL may vary in response thereto. For example, the shapes of the electrodes RME1 and RME2 and the shape of the bank layer BNL may vary depending on the arrangement of the conductive layers disposed thereunder.

In the display device 10 according to an embodiment, the electrode contact holes CTD, CTS, and CTA, through which the layers disposed above and under the via layer VIA may be electrically connected to each other, may correspond to the position of the conductive layer disposed under the via layer VIA. In the display device 10, since the first electrode contact hole CTD among the electrode contact holes CTD, CTS, and CTA overlaps the electrode patterns CSE1 and CSE2 in a plan view, a connection defect, a pattern defect, or the like that may occur due to a lower stepped portion may be prevented. Further, since the arrangement of the electrodes RME1 and RME2 is designed to correspond to the arrangement of the conductive layers under the via layer VIA, the structure of the pixel PX may have various arrangement designs.

In case that the display device 10 is driven and the light emitting element ED (e.g., refer to FIG. 9) emits light, a power voltage may be applied to the first transistors T1 and the fourth voltage line VL4 of each sub-pixel SPXn. Multiple first electrodes RME1 disposed in the respective sub-pixels SPXn may be electrically connected to the first transistor T1 through multiple first electrode contact holes CTD. In the second electrode RME2, multiple electrode branch portions RM_B1 and RM_B2 may be disposed in the sub-pixels SPXn, and may be electrically connected to each other by an electrode stem portion RM_S. The second electrode RME2 may be electrically connected to the second voltage line VL2 and the fourth voltage line VL4 through the second electrode contact hole CTS. The power voltage transmitted to the first electrode RME1 and the second electrode RME2 may be transmitted to the light emitting element ED through the connection electrodes CNE1, CNE2, and CNE3.

The display device 10 may be manufactured by a process of applying electrical signals (e.g., alignment signals) to the electrodes RME disposed in the emission area EMA and arranging (or aligning) the light emitting elements ED on the electrodes RME. In the manufacturing process of the display device 10, the first electrodes RME1 and the dummy patterns EP disposed in the sub-pixels SPXn may be electrically connected to each other, and may be electrically connected to the first voltage line VL1 and the third voltage line VL3 through the third electrode contact hole CTA. An alignment signal for aligning the light emitting elements ED may be applied to the first voltage line VL1 and the second voltage line VL2, or to the third voltage line VL3 and the fourth voltage line VL4. The alignment signal may be transmitted to the first electrode RME1 and the second electrode RME2, and the light emitting elements ED may be disposed (or aligned) in the emission area EMA of each sub-pixel SPXn.

The electrodes RME and dummy patterns EP may include a conductive material having high reflectivity. For example, the electrodes RME and the dummy patterns EP may contain a metal including at least one of silver (Ag), copper (Cu), and aluminum (Al). The electrodes RME and the dummy patterns EP may contain an alloy including aluminum (Al), nickel (Ni), lanthanum (La), or the like. In other embodiments, the electrodes RME may have a structure in which metal layers including at least one of titanium (T1), molybdenum (Mo), niobium (Nb), and the alloy are stacked each other. In some embodiments, the electrodes RME and the dummy patterns EP may be formed as a double layer or a multilayer formed by stacking at least one metal layer, which includes at least one of titanium (T1), molybdenum (Mo), niobium (Nb), and an alloy including aluminum (Al).

The disclosure is not limited thereto, and the electrodes RME and the dummy patterns EP may further include a transparent conductive material. For example, the electrodes RME and the dummy patterns EP may include at least one material of ITO, IZO, and ITZO. However, the electrodes RME and the dummy patterns EP may include other suitable transparent conductive materials. In some embodiments, the electrodes RME and the dummy patterns EP may have a structure in which at least one transparent conductive material and at least one metal layer having high reflectivity are stacked each other, or may be formed as a layer including the above-described materials. For example, each electrode RME may have a stacked structure of ITO/Ag/ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the first substrate SUB.

The first insulating layer PAS1 may be disposed in the display area DPA (e.g., entire display area DPA) and may be disposed on the via layer VIA and multiple electrodes RME. The first insulating layer PAS1 may protect the electrodes RME and electrically insulate the electrodes RME from each other. The first insulating layer PAS1 may cover the electrodes RME before the bank layer BNL is formed, and the damage of the electrodes RME in a process of forming the bank layer BNL may be prevented. The first insulating layer PAS1 may prevent the light emitting element ED disposed thereon from being damaged by direct contact with other members.

In an embodiment, the first insulating layer PAS1 may have stepped portions, and a top surface of the first insulating layer PAS1 may be partially depressed between the electrodes RME spaced apart from each other in the second direction DR2. The light emitting element ED may be disposed on the top surface of the first insulating layer PAS1, where the stepped portions are formed, and thus a space may remain between the light emitting element ED and the first insulating layer PAS1.

In accordance with an embodiment, the first insulating layer PAS1 may include the contact portions CT1 and CT2. The contact portions CT1 and CT2 of the first insulating layer PAS1 may be disposed at a portion where the connection electrode CNE and the electrode RME are connected (e.g., electrically and physically connected) to each other. The first insulating layer PAS1 may be disposed on the via layer VIA (e.g., entire via layer VIA), and may partially expose the layers (e.g., the third conductive layer) disposed thereunder at the portions in which the contact portions CT1 and CT2 are formed.

The contact portions CT1 and CT2 may respectively overlap multiple electrodes RME in a plan view. For example, the contact portions CT1 and CT2 may include the first contact portions CT1 and the second contact portions CT2. The first contact portions CT1 may be disposed in the first sub-region SA1 and overlap the electrode piece portion RM_P of the first electrode RME1. The second contact portions CT2 may be disposed in the second sub-region SA2 and overlap the electrode stem portion RM_S of the second electrode RME2 in a plan view. The first contact portions CT1 and the second contact portions CT2 may penetrate the first insulating layer PAS1 to partially expose a top surface of the first electrode RME1 and/or the second electrode RME2, which is disposed under the first insulating layer PAS1. Each of the first contact portion CT1 and the second contact portion CT2 may further penetrate some of another insulating layers disposed on the first insulating layer PAS1. The electrode RME exposed by each of the contact portions CT1 and CT2 may be in contact with the connection electrode CNE.

The bank layer BNL may be disposed on the first insulating layer PAS1. In a plan view, the bank layer BNL may include portions extending in the first direction DR1 and the second direction DR2, and may be adjacent to (e.g., surround) the sub-pixels SPXn. The bank layer BNL may be adjacent to (e.g., surround) the emission area EMA and the sub-regions SA1 and SA2 of each sub-pixel SPXn and distinguish the emission area EMA and the sub-regions SA1 and SA2 of each sub-pixel SPXn. The bank layer BNL may be adjacent to (e.g., surround) the outermost part of the display area DPA and distinguish the display area DPA and the non-display area NDA. The bank layer BNL may be disposed in the display area DPA (e.g., entire display area DPA) to form a grid pattern. The regions exposed by the bank layer BNL in the display area DPA may be the emission area EMA and the sub-regions SA1 and SA2.

Similar to the bank patterns BP1 and BP2, the bank layer BNL may have a height. In some embodiments, the top surface of the bank layer BNL may be higher than that of the bank patterns BP1 and BP2, and the thickness of the bank layer BNL may be equal to or greater than that of the bank patterns BP1 and BP2. The bank layer BNL may prevent ink from overflowing to adjacent sub-pixels SPXn in an inkjet printing process during the manufacturing process of the display device 10. Similar to the bank patterns BP1 and BP2, the bank layer BNL may include an organic insulating material such as polyimide.

The light emitting elements ED may be arranged in the emission area EMA. The light emitting elements ED may be disposed between the bank patterns BP1 and BP2, and may be spaced apart from each other in the first direction DR1. In an embodiment, the light emitting elements ED may have a shape extending in a direction, and ends (e.g., both ends) of the light emitting elements ED may be disposed on multiple electrodes RME. A length of the light emitting element ED may be greater than a gap between the electrodes RME spaced apart from each other in the second direction DR2. An extension direction of the light emitting elements ED may be substantially perpendicular to the first direction DR1 in which the electrodes RME extend. However, the disclosure is not limited thereto, and the light emitting element ED may extend in the second direction DR2 or in a direction oblique to the second direction DR2.

The light emitting elements ED may be arranged on the first insulating layer PAS1. The light emitting element ED may have a shape extending in a direction. The extension direction of the light emitting element ED may be parallel to the top surface of the first substrate SUB. The light emitting element ED may include semiconductor layers arranged in the direction in which the light emitting element ED extends, and the semiconductor layers may be sequentially arranged in the direction parallel to the top surface of the first substrate SUB. Description of the light emitting element ED is provided below. However, the disclosure is not limited thereto, and the semiconductor layers of the light emitting element ED may be arranged in the direction perpendicular to the first substrate SUB, and the light emitting element ED may have another structure.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of a same material and emit light of a same color.

The light emitting element ED may include a first light emitting element ED1 and a second light emitting element ED2. The first light emitting element ED1 may have a first end disposed on the electrode main portion RM_A of the first electrode RME1 and a second end disposed on the second electrode branch portion RM_B2 of the second electrode RME2. The second light emitting element ED2 may have a first end disposed on the electrode main portion RM_A of the first electrode RME1 and a second end disposed on the first electrode branch RM_B1 of the second electrode RME2. The first light emitting elements ED1 may be disposed on the lower side with respect to the electrode main portion RM_A of the first electrode RME1. The second light emitting elements ED2 may be disposed on the upper side with respect to the electrode main portion RM_A of the first electrode RME1.

The light emitting elements ED may be in contact with the connection electrodes CNE (e.g., the first connection electrode CNE1, the second connection electrode CNE2, and the third connection electrode CNE3), and electrically connected to the electrodes RME and the conductive layers below the via layer VIA. The light emitting elements ED may receive an electrical signal, and emit light of a wavelength band. The light emitting elements ED may emit the light toward ends (e.g., both ends) in the extension direction, and the light may be reflected by the electrodes RME on the bank patterns BP1 and BP2.

The second insulating layer PAS2 may be disposed on the light emitting elements ED, the first insulating layer PAS1, and the bank layer BNL. The second insulating layer PAS2 may extend in the first direction DR1 between the bank patterns BP1 and BP2, and include a pattern portion disposed on the light emitting elements ED. The pattern portion of the second insulating layer PAS2 may be adjacent to (or partially surround) the outer surface of the light emitting element ED, and may not cover both sides (or both ends) of the light emitting element ED. The pattern portion of the second insulating layer PAS2 may form a linear or island-like pattern in each sub-pixel SPXn in a plan view. The pattern portion of the second insulating layer PAS2 may protect the light emitting element ED and fix the light emitting elements ED during a manufacturing process of the display device 10. Further, the second insulating layer PAS2 may fill a space between the light emitting element ED and the second insulating layer PAS2, which is disposed under the light emitting element ED. Further, a part of the second insulating layer PAS2 may be disposed on the bank layer BNL and in the sub-regions SA1 and SA2.

The second insulating layer PAS2 may include the contact portions CT1 and CT2. The contact portions CT1 and CT2 of the second insulating layer PAS2 may be disposed at a portion where the connection electrode CNE and the electrode RME are connected (e.g., electrically and physically connected) to each other. The second insulating layer PAS2 may be disposed on the first insulating layer PAS1 (e.g., entire first insulating layer PAS1), and may partially expose the layers (e.g., the via layer VIA) disposed thereunder at the portions in which the openings are formed.

The contact portions CT1 and CT2 may overlap multiple electrodes RME in a plan view. For example, the contact portions CT1 and CT2 may include the first contact portions CT1 and the second contact portions CT2. The first contact portions CT1 may be disposed in the first sub-region SA1 and overlap the electrode piece portion RM_P of the first electrode RME1 in a plan view. The second contact portions CT2 may be disposed in the second sub-region SA2 and overlap the electrode stem portion RM_S of the second electrode RME2 in a plan view. The first contact portions CT1 and the second contact portions CT2 may penetrate the second insulating layer PAS2 and the first insulating layer PAS1. The first contact portions CT1 and the second contact portions CT2 may partially expose the top surface of the first electrode RME1 and/or the second electrode RME2, which is disposed under the first insulating layer PAS1.

The connection electrodes CNE (e.g., the first connection electrode CNE1, the second connection electrode CNE2, and the third connection electrode CNE3) may be disposed on the electrodes RME. The connection electrodes CNE may be in contact with any one of the ends of the light emitting elements ED, and some of the connection electrodes CNE may be electrically connected to at least one of the voltage lines VL1, VL2, VL3, and VL4 under the via layer VIA. For example, the connection electrodes CNE (e.g., the first connection electrode CNE1, the second connection electrode CNE2, and the third connection electrode CNE3) may include a first connection electrode CNE1, a second connection electrode CNE2, and a third connection electrode CNE3. The first connection electrode CNE1 and the second connection electrode CNE2 may be electrically connected (e.g., directly connected) to the electrode RME, which is disposed under the first and second connection electrodes CNE1 and CNE2. The third connection electrode CNE3 may not be directly connected to the electrode (e.g., the electrode RME) disposed thereunder. For example, the first connection electrode CNE1 and the second connection electrode CNE2 may be first type connection electrodes, and the third connection electrode CNE3 may be a second type connection electrode.

The first connection electrode CNE1 may have a shape extending in the second direction DR2 and may be disposed on the first electrode RME1. A portion of the first connection electrode CNE1 disposed on the first bank pattern BP1 may overlap the electrode main portion RM_A of the first electrode RME1 in a plan view, and may extend therefrom in the second direction DR2 to the sub-regions SA1 and SA2 over the bank layer BNL. For example, in the pixel PX in which the electrode piece portions RM_P of the first electrodes RME1 are disposed in the first sub-region SA1, the first connection electrode CNE1 may extend from the emission area EMA to the first sub-region SA1 over the bank layer BNL. The first connection electrode CNE1 may be in contact with the electrode piece portions RM_P of the first electrodes RME1 in the first sub-region SAL The first connection electrode CNE1 may be included in a second connection electrode layer disposed on the third insulating layer PAS3, and may be in contact with the electrode piece portion RM_P of the first electrode RME1 through the first contact portion CT1 penetrating the first insulating layer PAS1, the second insulating layer PAS2, and the third insulating layer PAS3.

The second connection electrode CNE2 may have a shape extending in the second direction DR2 and may be disposed on the second electrode RME2. A portion of the second connection electrode CNE2 disposed on the second bank pattern BP2 may overlap the first electrode branch portion RM_B1 in a plan view, and may extend therefrom in the second direction DR2 to the second sub-region SA2 over the bank layer BNL. The second connection electrode CNE2 may be in contact with the electrode stem portion RM_S of the second electrode RME2 in the second sub-region SA2. The second connection electrode CNE2 may be included in the second connection electrode layer disposed on the third insulating layer PAS3, and may be in contact with the electrode stem portion RM_S of the second electrode RME2 through the second contact portion CT2 penetrating the first insulating layer PAS1, the second insulating layer PAS2, and the third insulating layer PAS3.

The third connection electrode CNE3 may include the extension portions CN_E1 and CN_E2 extending in the second direction DR2 and a first connection portion CN_B1 electrically connecting the extension portions CN_E1 and CN_E2. A first extension portion CN_E1 may be disposed on the second electrode branch RM_B2 of the second electrode RME2, and face the first connection electrode CNE1 in the emission area EMA. A second extension portion CN_E2 may be disposed on the first electrode RME1, and face the second connection electrode CNE2 in the emission area EMA. The first connection portion CN_B1 may extend in the first direction DR1 on the bank layer BNL to electrically connect the first extension portion CN_E1 to the second extension portion CN_E2. In the third connection electrode CNE3, the first connection portion CN_B1 may be disposed on the bank layer BNL between the emission area EMA and the second sub-region SA2. The third connection electrode CNE3 may be included in the first connection electrode layer disposed between the second insulating layer PAS2 and the third insulating layer PAS3.

The first connection electrode CNE1 may be in direct contact with the first electrode RME1, and may be electrically connected to the first transistor T1 electrically connected to each sub-pixel SPXn. Since the first transistor T1 is electrically connected to the first voltage line VL1, the first power voltage applied to the first voltage line VL1 may be transmitted to the light emitting elements ED through the first transistor T1, the first electrode RME1, and the first connection electrode CNE1. The first connection electrode CNE1 may be in contact with the first light emitting element ED1, and the first power voltage may be transmitted to the first light emitting element ED1.

The second connection electrode CNE2 may be electrically connected to the fourth voltage line VL4 and the second voltage line VL2 through the second electrode RME2. The second power voltage applied to the second voltage line VL2 may be transmitted to the light emitting elements ED through the fourth voltage line VL4, the second electrode RME2, and the second connection electrode CNE2. The second connection electrode CNE2 may be in contact with the second light emitting element ED2, and the second power voltage may be transmitted to the second light emitting element ED2. The second light emitting element ED2 may be disposed between the first bank pattern BP1 and the second bank pattern BP2 disposed on the upper side of the first bank pattern BP1.

Unlike the first connection electrode CNE1 and the second connection electrode CNE2, the third connection electrode CNE3 may not be directly connected to the electrode RME disposed thereunder (e.g., disposed under the third connection electrode CNE3). The first extension portion CN_E1 of the third connection electrode CNE3 may be in contact with the first light emitting element ED1, and the second extension portion CN_E2 may be in contact with the second light emitting element ED2. The first power voltage transferred to the first connection electrode CNE1 may flow through the first light emitting element ED1, the third connection electrode CNE3, the second light emitting element ED2, and the second connection electrode CNE2. The first light emitting element ED1 and the second light emitting element ED2 may be electrically connected in series through the third connection electrode CNE3, and luminous efficiency per unit area may be improved.

The third insulating layer PAS3 may be disposed on the third connection electrode CNE3 and the second insulating layer PAS2. The third insulating layer PAS3 may be disposed (e.g., entirely disposed) on the second insulating layer PAS2 and cover the third connection electrode CNE3. The first connection electrode CNE1 and the second connection electrode CNE2 may be disposed on the third insulating layer PAS3. The third insulating layer PAS3 may be disposed on the via layer VIA (e.g., entire via layer VIA) except the region where the third connection electrode CNE3 is disposed. The third insulating layer PAS3 may electrically insulate the first connection electrode CNE1 and the second connection electrode CNE2 from each other. Thus, the first connection electrode CNE1 and the second connection electrode CNE2 may not directly contact the third connection electrode CNE3.

Although not illustrated in the drawings, another insulating layer may be further disposed on the third insulating layer PAS3 and the first connection electrode CNE1. The insulating layer may function to protect the members disposed on the first substrate SUB against the external environment.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2, and the third insulating layer PAS3 may contain an inorganic insulating material. In other embodiments, the first insulating layer PAS1 and the third insulating layer PAS3 may contain an inorganic insulating material, and the second insulating layer PAS2 may contain an organic insulating material. Each or at least one of the first insulating layer PAS1, the second insulating layer PAS2, and the third insulating layer PAS3 may have a structure in which insulating layers are alternately or repeatedly stacked each other. In an embodiment, each of the first insulating layer PAS1, the second insulating layer PAS2, and the third insulating layer PAS3 may include at least one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of a same material or different materials. In other embodiments, some of the first insulating layer PAS1, the second insulating layer PAS2, and the third insulating layer PAS3 may be made of a same material and some of the first insulating layer PAS1, the second insulating layer PAS2, and the third insulating layer PAS3 may be made of different materials.

Figure 15:
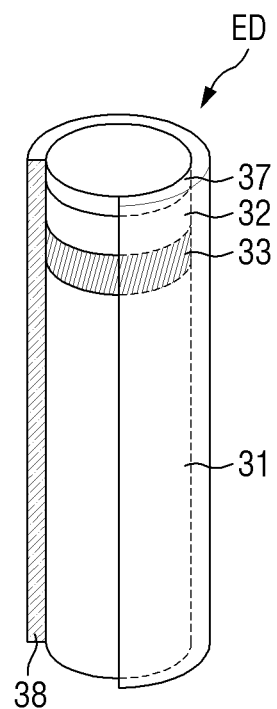
FIG. 15 is a schematic view of a light emitting element according to an embodiment.

FIG. 15 is a schematic view of a light emitting element according to an embodiment.

Referring to FIG. 15, the light emitting element ED may be a light emitting diode. For example, the light emitting element ED may be an inorganic light emitting diode made of an inorganic material and having a size of nano-meter to micro-meter. The light emitting element ED may be aligned between two electrodes having polarity in case that an electric field is formed in a direction between two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped, a hexagonal prism, or the like. In other embodiments, the light emitting element ED may have various shapes such as a shape elongated in a direction and having an outer surface partially inclined.

The light emitting element ED may include a semiconductor layer doped with any conductivity type (e.g., p-type or n-type) dopant. An electrical signal may be applied from an external power source, and the semiconductor layer may emit light of a wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be at least one of AlGaInN, GaN, AlGaN, InGaN, AlN, and InN, which is doped with an n-type dopant. The n-type dopant doped into the first semiconductor layer 31 may be Si, Ge, Sn, or the like.

The second semiconductor layer 32 may be disposed on the first semiconductor layer 31 with the light emitting layer 36 interposed therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be at least one of AlGaInN, GaN, AlGaN, InGaN, AlN, and InN, which is doped with a p-type dopant. The p-type dopant doped into the second semiconductor layer 32 may be Mg, Zn, Ca, Ba, or the like.

Although the first semiconductor layer 31 and the second semiconductor layer 32 are configured as a layer, the disclosure is not limited thereto. Depending on the material of the light emitting layer 36, the first semiconductor layer 31, and the second semiconductor layer 32 may further include a larger number of layers, such as a cladding layer, a tensile strain barrier reducing (TSBR) layer, or the like. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be at least one of AlGaInN, GaN, AlGaN, InGaN, AlN, InN, and SLs, which is doped with an n-type dopant, and the semiconductor layer disposed between the second semiconductor layer 32 and the light emitting layer 36 may be at least one of AlGaInN, GaN, AlGaN, InGaN, AlN, and InN, which is doped with a p-type dopant.

The light emitting layer 36 may be disposed between the first semiconductor layer 31 and the second semiconductor layer 32. The light emitting layer 36 may include a material having a single or multiple quantum well structure. When the light emitting layer 36 includes a material having the multiple quantum well structure, barrier layers and well layers may be alternately stacked each other. Electron-hole pairs may be coupled according to an electrical signal applied through the first semiconductor layer 31 and the second semiconductor layer 32, and the light emitting layer 36 may emit light. The light emitting layer 36 may include at least one material of AlGaN, AlGaInN, and InGaN. In case that the light emitting layer 36 has the multiple quantum well structure in which barrier layers and well layers are alternately stacked each other, the barrier layer may include a material such as AlGaN or AlGaInN, and the well layer may include a material such as GaN, InGaN, or AlInN.

The light emitting layer 36 may have a structure in which semiconductor materials having large band gap energy and semiconductor materials having small band gap energy are alternately stacked each other. The light emitting layer 36 may include other group III to V semiconductor materials according to the wavelength band of the emitted light. The light emitted by the light emitting layer 36 may not be limited to the light of the blue wavelength band. In other embodiments, the light emitting layer 36 may also emit light of a red or green wavelength band.

The electrode layer 37 may be an ohmic connection electrode. However, the disclosure is not limited thereto, and the electrode layer 37 may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, when the light emitting element ED is electrically connected to an electrode or a connection electrode, the electrode layer 37 may reduce a resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, and ITZO.

The insulating film 38 may be adjacent to (e.g., surround) outer surfaces of the semiconductor layers and electrode layers described above. For example, the insulating film 38 may be adjacent to (e.g., surround) at least the outer surface of the light emitting layer 36, and may expose ends (e.g., both ends) of the light emitting element ED in a longitudinal direction. In a cross-sectional view, the insulating film 38 may have a top surface, which is rounded in a region adjacent to at least one end of the light emitting element ED.

The insulating film 38 may include at least one insulating material of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). Although the insulating film 38 is formed as a single layer, but the disclosure is not limited thereto. In some embodiments, the insulating film 38 may be formed in a multilayer structure having layers stacked therein.

The insulating film 38 may perform a function of protecting the semiconductor layers and the electrode layer of the light emitting element ED. The insulating film 38 may prevent an electrical short circuit that is likely to occur at the light emitting layer 36 in case that an electrode, to which an electrical signal is transmitted, is in direct contact with the light emitting element ED. The insulating film 38 may prevent a decrease in luminous efficiency of the light emitting element ED.

The insulating film 38 may have an outer surface which is surface-treated. The light emitting elements ED may be aligned in such a way of spraying the ink in which the light emitting elements ED are dispersed on the electrodes. For example, the ink including the light emitting elements ED dispersed therein may be sprayed, and the light elements ED may be aligned. The surface of the insulating film 38 may be treated to have a hydrophobic property or hydrophilic property, and the light emitting elements ED in the dispersed state may not be aggregated with adjacent light emitting elements ED in the ink.

Referring again to FIGS. 12 to 14, in the display device 10 according to an embodiment, the electrode contact holes CTD, CTS, and CTA, through which the layers disposed above and under the via layer VIA are electrically connected to each other, may correspond to the position of the conductive layer disposed under the via layer VIA. For example, each of the first electrode contact hole CTD, the second electrode contact hole CTS, and the third electrode contact hole CTA may correspond to the positions of the fourth voltage line VL4 and the third voltage line VL3. As described above, the second electrode pattern CSE2, the third voltage line VL3, and the fourth voltage line VL4 of the third conductive layer may be spaced apart from each other at regular intervals in the display area DPA (e.g., refer to FIG. 2), and the pixels PX may be classified into different types of pixels PX depending on the electrode contact holes CTD, CTS, and CTA.

Figure 16:
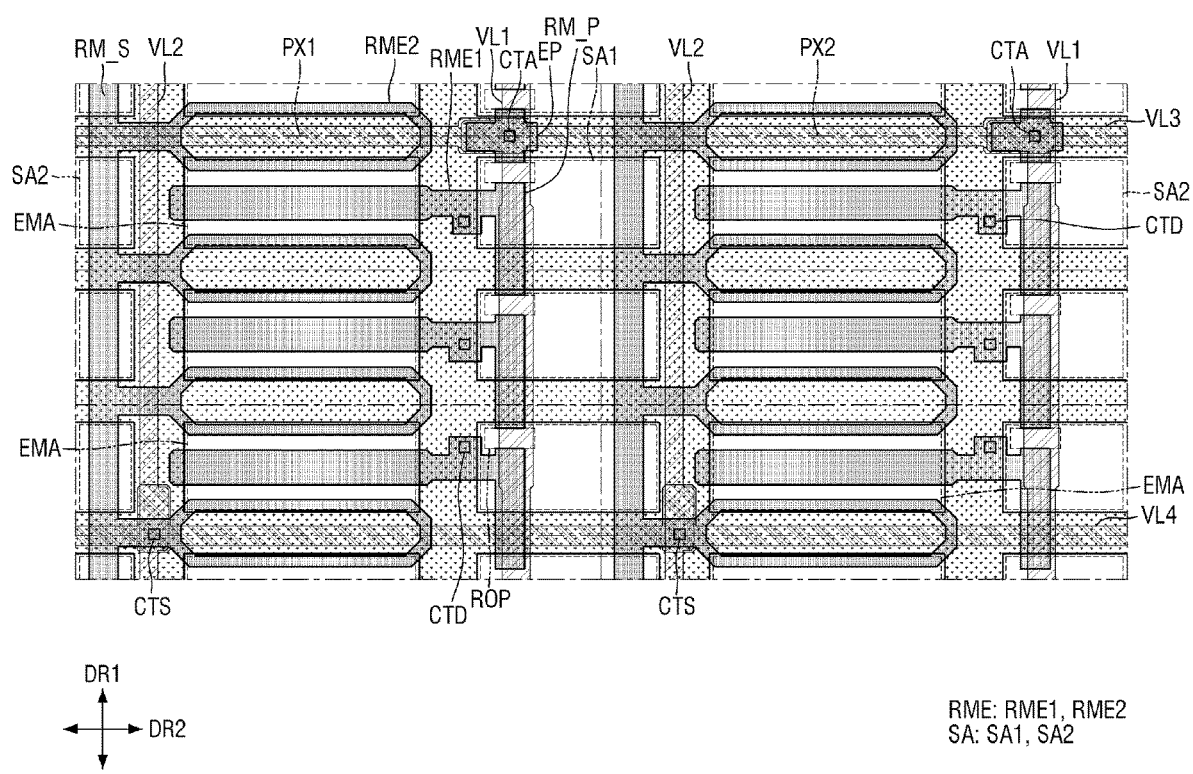
FIG. 16 is a schematic plan view illustrating relative arrangement of some wires, electrodes, and a bank layer disposed in multiple pixels of a display device according to an embodiment.

FIG. 16 is a schematic plan view illustrating relative arrangement of some wires, electrodes, and a bank layer disposed in multiple pixels of a display device according to an embodiment.

Referring to FIG. 16, in the display device 10, each pixel PX may include the sub-pixels SPXn, and the sub-pixels SPXn may include the emission area EMA and the sub-regions SA1 and SA2. The emission area EMA and the sub-regions SA1 and SA2 may be alternately arranged in the second direction DR2, and another pixels PX adjacent in the second direction DR2 may share any one of the sub-regions SA1 and SA2. For example, a first pixel PX1 and a second pixel PX2 adjacent in the second direction DR2 may share the first sub-region SAL In the sub-pixels SPXn of the first pixel PX1, the first sub-region SA1 may be disposed on a side (e.g., a right) of the emission area EMA in the second direction DR2, and the second sub-region SA2 may be disposed on another side (e.g., a left side) of the emission area EMA in the second direction DR2. In the sub-pixels SPXn of the second pixel PX2, the second sub-region SA2 may be disposed on a side (e.g., a right side) of the emission area EMA in the second direction DR2, and the first sub-region SA1 may be disposed on another side (e.g., a left side) of the emission area EMA in the second direction DR2.

The first voltage line VL1 of the first pixel PX1 may be disposed across the first sub-region SA1 in the first direction DR1. The second voltage line VL2 may extend in the first direction DR1 under the bank layer BNL adjacent to the second sub-region SA2. The third voltage line VL3 may extend in the second direction DR2 at a boundary between the first pixel PX1 and another pixel PX disposed on a side (e.g., an upper side) of the first pixel PX1 in the first direction DR1. The fourth voltage line VL4 may extend in the second direction DR2 at a boundary between the first pixel PX1 and another pixel PX disposed on another side (e.g., a lower side) of the first pixel PX1 in the first direction DR1. The first voltage line VL1 may be disposed on the right side of the emission area EMA, and the second voltage line VL2 may be disposed on the left side of the emission area EMA. The third voltage line VL3 may be disposed on the upper side of the first sub-pixel SPX1, and the fourth voltage line VL4 may be disposed on the lower side of the third sub-pixel SPX3.

In the first electrode RME1 of the first pixel PX1, the electrode piece portions RM_P may be disposed in the first sub-region SA1, and the electrode main portions RM_A may extend to a left side (or in a left direction) from the electrode piece portion RM_P. In the second electrode RME2 of the first pixel PX1, the electrode stem portion RM_S may be disposed in the second sub-region SA2, and the electrode branch portions RM_B1 and RM_B2 may extend to a right side (or in a right direction) from the electrode stem portion RM_S.

The first voltage line VL1 of the second pixel PX2 may be disposed across the second sub-region SA2 in the first direction DR1. The second voltage line VL2 of the second pixel PX2 may extend in the first direction DR1 under the bank layer BNL adjacent to the first sub-region SAL The third voltage line VL3 may extend in the second direction DR2 at a boundary between the second pixel PX2 and another pixel PX disposed on a side (e.g., an upper side) of the second pixel PX2 in the first direction DR1. The fourth voltage line VL4 may extend in the second direction DR2 at a boundary between the second pixel PX2 and another pixel PX disposed on another side (e.g., a lower side) of the second pixel PX2 in the first direction DR1. The first voltage line VL1 may be disposed on the right side of the emission area EMA, and the second voltage line VL2 may be disposed on the left side of the emission area EMA. The third voltage line VL3 may be disposed on the upper side of the first sub-pixel SPX1, and the fourth voltage line VL4 may be disposed on the lower side of the third sub-pixel SPX3.

In the first electrode RME1 of the second pixel PX2, the electrode piece portions RM_P may be disposed in the second sub-region SA2, and the electrode main portions RM_A may extend to the left side (or in the left direction) from the electrode piece portion RM_P. In the second electrode RME2 of the second pixel PX2, the electrode stem portion RM_S may be disposed in the first sub-region SA1, and the electrode branch portions RM_B1 and RM_B2 may extend to the right side (or in the right direction) from the electrode stem portion RM_S.

In the first pixel PX1 and the second pixel PX2, the voltage lines VL1, VL2, VL3, and VL4 and the electrodes RME1 and RME2 may have a substantially same arrangement. Since the first sub-region SA1 and the second sub-region SA2 adjacent to (or surrounded by) the bank layer BNL are distinguished (or divided), the arrangement of the electrodes RME may be the same except that the sub-regions SA1 and SA2, where the electrode piece portion RM_P of the first electrode RME1 and the electrode stem portion RM_S of the second electrode RME2 are disposed are different from each other.

The first electrode contact holes CTD of the first pixel PX1 and the second pixel PX2 may overlap the bank layer BNL disposed on the right side of the emission area EMA and may overlap the electrode connection portion RM_C1 of the first electrode RME1 in a plan view. The second electrode contact hole CTS may be disposed at a boundary between the third sub-pixel SPX3 and another pixel PX adjacent in the first direction DR1, at which the second voltage line VL2 and the fourth voltage line VL4 intersect each other. The dummy pattern EP and the third electrode contact hole CTA may be disposed at the boundary between the first sub-pixel SPX1 and another pixel PX adjacent in the first direction DR1, at which the first voltage line VL1 and the third voltage line VL3 intersect each other. The second electrode contact hole CTS may be disposed on a lower left side of each of the pixels PX1 and PX2, and the dummy pattern EP and the third electrode contact hole CTA may be disposed on an upper right side of each of the pixels PX1 and PX2.

In the first pixel PX1 and the second pixel PX2 illustrated in FIG. 16, which are the pixels adjacent to each other in the second direction DR2, the electrodes RME and the voltage lines VL1, VL2, VL3, and VL4 may have a same arrangement. A gap between the second electrode contact hole CTS of the first pixel PX1 and the second electrode contact hole CTS of the second pixel PX2 may be the same as a gap between the dummy pattern EP and the third electrode contact hole CTA of the first pixel PX1 and/or a gap between the dummy pattern EP and the third electrode contact hole CTA of the second pixel PX2.

However, in pixels adjacent in the first direction DR1, the arrangement of the electrodes RME and the voltage lines VL1, VL2, VL3, and VL4 may be different from each other.

Figure 17:
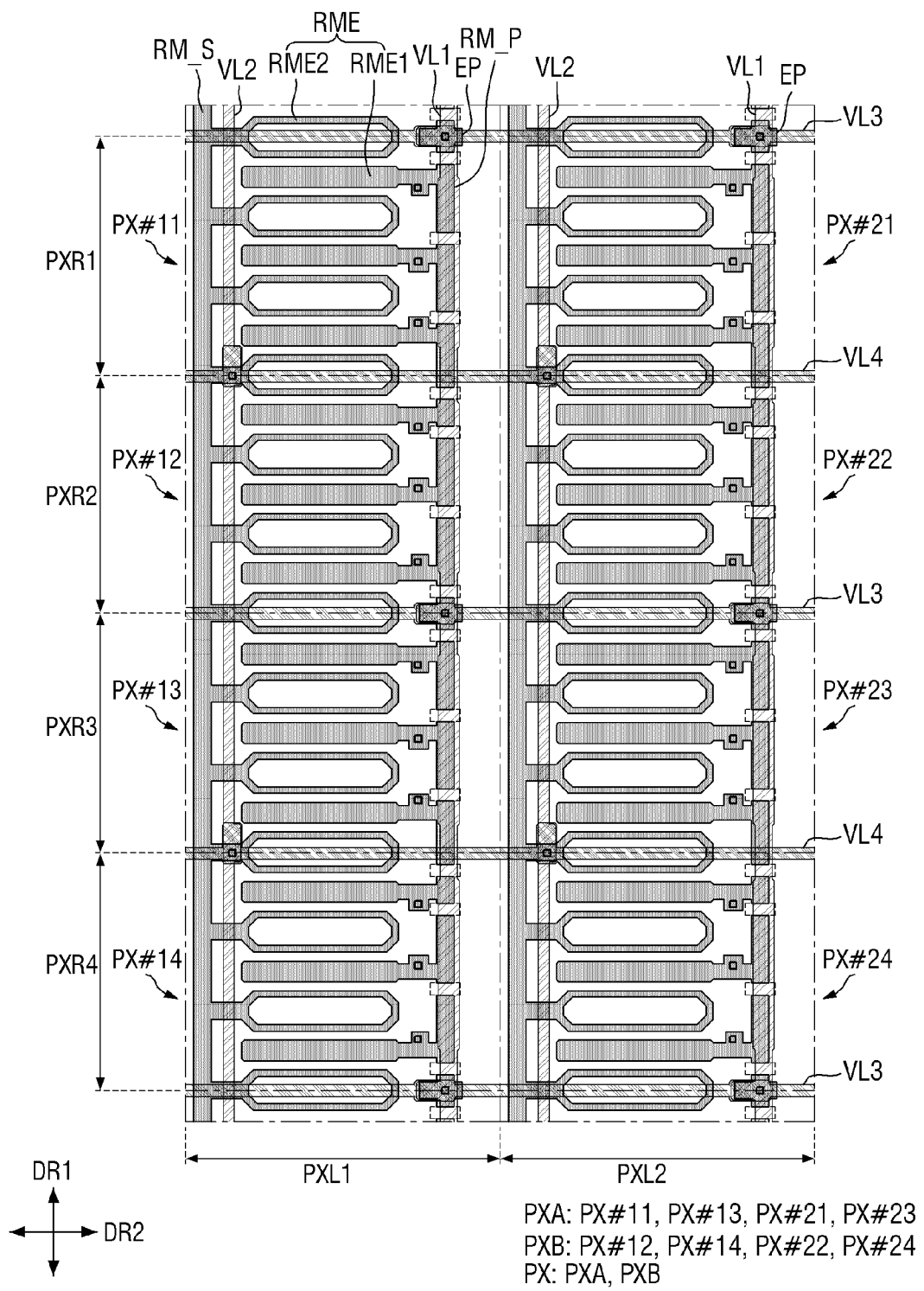
FIG. 17 is a schematic plan view illustrating relative arrangement of some wires and electrodes disposed in pixels of the display device of FIG. 16.

FIG. 17 is a schematic plan view illustrating relative arrangement of some wires and electrodes disposed in pixels of the display device of FIG. 16.

Referring to FIGS. 16 and 17, the display device 10 may include pixels PX arranged in the first direction DR1 and the second direction DR2, and the pixels PX may form pixel rows PXR1, PXR2, PXR3, and PXR4, and pixel columns PXL1 and PXL2. The pixels PX in the pixel rows PXR1, PXR2, PXR3, and PXR4 and the pixel columns PXL1 and PXL2 may be classified into multiple pixels (e.g., pixels of multiple types) depending on the arrangement of the voltage lines VL1, VL2, VL3 and VL4 and the electrodes RME.

For example, the first voltage line VL1 and the second voltage line VL2 may extend in the first direction DR1 and may be spaced apart from each other in the second direction DR2. In the first pixel column PXL1 and the second pixel column PXL2, the first voltage line VL1 may be disposed on the right side (or in the right direction) from the center of the pixel PX, and the second voltage line VL2 may be disposed on the left side (or in the left direction) from the center of the pixel PX. At a boundary between the first pixel column PXL1 and the second pixel column PXL2, the first voltage line VL1 of the first pixel column PXL1 and the second voltage line VL2 of the second pixel column PXL2 may be spaced apart from each other.

The third voltage line VL3 and the fourth voltage line VL4 may extend in the second direction DR2 and may be spaced apart from each other in the first direction DR1. However, the third voltage line VL3 and the fourth voltage line VL4 may be alternately disposed in the first direction DR1 and may be disposed at the boundary of each pixel PX.

In the first pixel row PXR1 and the third pixel row PXR3, the third voltage line VL3 may be disposed on the upper side (or in the upper direction) from the center of the pixel PX, and the fourth voltage line VL4 may be disposed on the lower side (or in the lower direction) from the center of the pixel PX. In the second pixel row PXR2 and the fourth pixel row PXR4, the third voltage line VL3 may be disposed on the lower side (or in the lower direction) from the center of the pixel PX, and the fourth voltage line VL4 may be disposed on the upper side (or in the lower direction) from the center of the pixel PX. The fourth voltage line VL4 may be disposed at the boundary between the first pixel row PXR1 and the second pixel row PXR2, and the third voltage line VL3 may be disposed at a boundary between the second pixel row PXR2 and the third pixel row PXR3.

The arrangement of the electrodes RME and the electrode contact holes CTD, CTS, and CTS may vary depending on the arrangement of the voltage lines VL1, VL2, VL3, and VL4 disposed in the pixel PX. In the first pixel column PXL1 and the second pixel column PXL2, the electrode piece portions RM_P of the first electrodes RME1 may be disposed on the right side (or in the right direction) from the center of the pixel PX, and the electrode stem portions RM_S of the second electrodes RME2 may be disposed on the left side (or in the left direction) from the center of the pixel PX. The first electrode contact holes CTD may be arranged in the first direction DR1 on the right side (or in the right direction) from the center of the pixel PX depending on the arrangement of the first electrode RME1. In the pixels PX of the first pixel column PXL1 and the second pixel column PXL2, the electrodes RME and the first electrode contact holes CTD may have a substantially same arrangement.

In the first pixel row PXR1 and the third pixel row PXR3, the third voltage line VL3 may be disposed on the upper side of the pixel PX, and the dummy pattern EP and the third electrode contact hole CTA may be disposed on the upper right side of the pixel PX. In the first pixel row PXR1 and the third pixel row PXR3, the fourth voltage line VL4 may be disposed on the lower side of the pixel PX, and the second electrode contact hole CTS may be disposed on the lower left side of the pixel PX. In the second pixel row PXR2 and the fourth pixel row PXR4, the third voltage line VL3 may be disposed on the lower side of the pixel PX, and the dummy pattern EP and the third electrode contact hole CTA may be disposed on the lower right side of the pixel PX. In the second pixel row PXR2 and the fourth pixel row PXR4, the fourth voltage line VL4 may be disposed on the upper side of the pixel PX, and the second electrode contact hole CTS may be disposed on the upper left side of the pixel PX.

Pixels PX #11 and PX #13 may belong to (or be disposed in) the first pixel row PXR1 and the third pixel row PXR3 of the first pixel column PXL1. Pixels PX #21 and PX #23 may belong to (or be disposed in) the first pixel row PXR1 and the third pixel row PXR3 of the second pixel column PXL2. The pixels PX #11, PX #13, PX #21, and PX #23 may be first type pixels PXA having a same structure. Pixels PX #12 and PX #14 may belong to (or be disposed in) the second pixel row PXR2 and the fourth pixel row PXR4 of the first pixel column PXL1. Pixels PX #22 and PX #24 may belong to (or be disposed in) the second pixel row PXR2 and the fourth pixel row PXR4 of the second pixel column PXL2. The pixels PX #12, PX #14, PX #22, and PX #24 may be second type pixels PXB having a same structure.

In the display device 10 according to an embodiment, the pixels may be classified into the first type pixels PXA and the second type pixels PXB, in which the arrangement of the second electrode contact hole CTS, the dummy pattern EP, and the third electrode contact hole CTA is different depending on the arrangement of the voltage lines VL1, VL2, VL3, and VL4. However, the arrangement of the second electrode pattern CSE2 disposed in each pixel PX may be the same regardless of the pixel columns PXL1 and PXL2 and the pixel rows PXR1, PXR2, PXR3, and PXR4, and the position of the first contact hole CTD may be substantially the same in each pixel PX.

Figure 18:
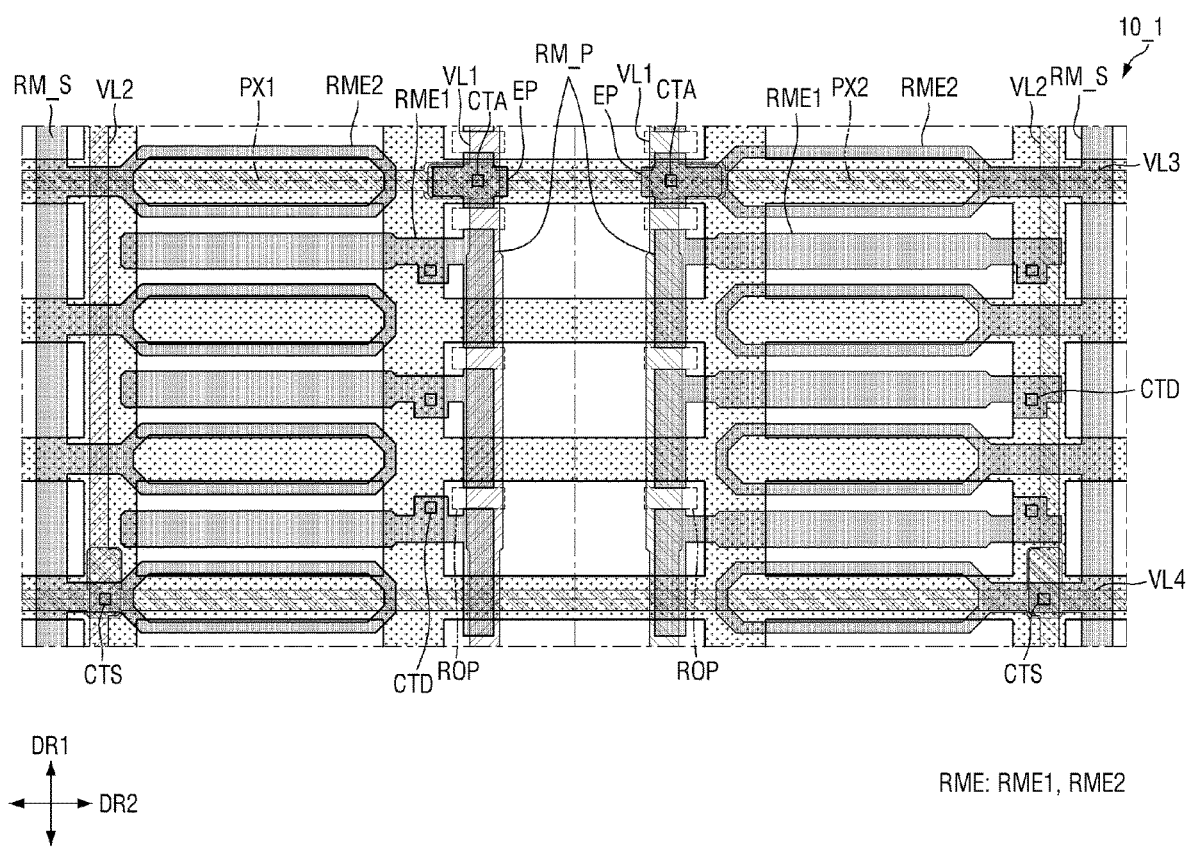
FIG. 18 is a schematic plan view illustrating relative arrangement of some wires, electrodes, and a bank layer disposed in multiple pixels of a display device according to another embodiment.
Figure 19:
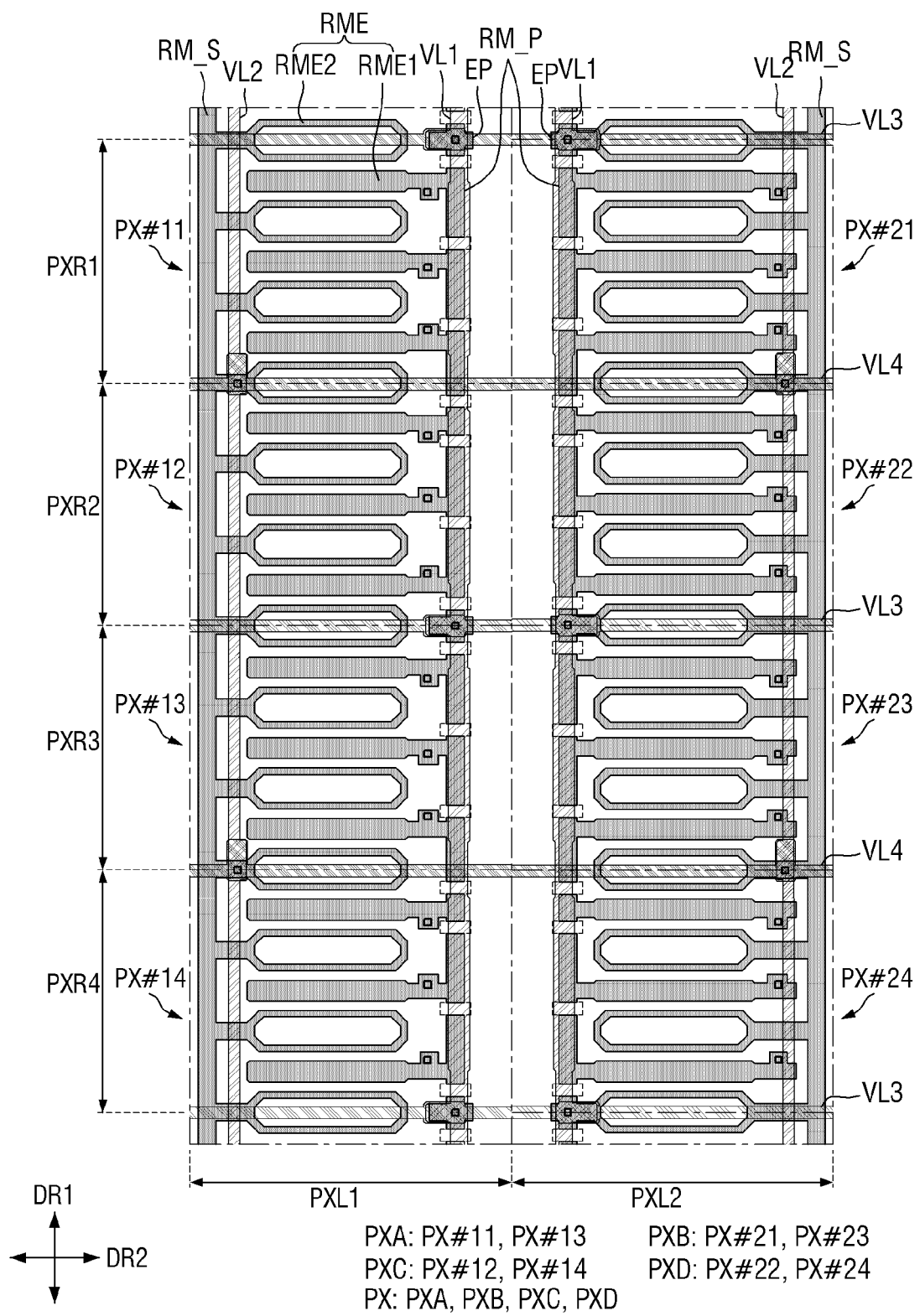
FIG. 19 is a schematic plan view illustrating relative arrangement of some wires and electrodes disposed in pixels of the display device of FIG. 18.

FIG. 18 is a schematic plan view illustrating relative arrangement of some wires, electrodes, and a bank layer disposed in multiple pixels of a display device according to another embodiment. FIG. 19 is a schematic plan view illustrating relative arrangement of some wires and electrodes disposed in pixels of the display device of FIG. 18.

Referring to FIGS. 18 and 19, in a display device 10_1 according to an embodiment, arrangements of electrodes RME1 and RME2 and voltage lines VL1, VL2, VL3, and VL4 may be different in pixels PX1 and PX2 adjacent in a second direction DR2. The embodiment of FIGS. 18 and 19 is different from the embodiment of FIGS. 16 and 17 in that the arrangement of the electrodes RME and the electrode contact holes CTD, CTS, and CTA is different in pixels disposed in multiple pixel columns PXL1 and PXL2.

For example, in the display device 10_1, in sub-pixels SPXn of a first pixel PX1, a first sub-region SA1 may be disposed on a side (e.g., a right side) of an emission area EMA in the second direction DR2, and a second sub-region SA2 may be disposed on another side (e.g., a left side) of the emission area EMA in the second direction DR2. In sub-pixels SPXn of a second pixel PX2, a second sub-region SA2 may be disposed on a side (e.g., a right side) of an emission area EMA in the second direction DR2, and a first sub-region SA1 may be disposed on another side (e.g., a left side) of the emission area EMA in the second direction DR2.

A first voltage line VL1 of the first pixel PX1 may be disposed across the first sub-region SA1 in a first direction DR1. A second voltage line VL2 thereof may extend in the first direction DR1 under a bank layer BNL adjacent to the second sub-region SA2. A third voltage line VL3 may extend in the second direction DR2 at a boundary between the first pixel PX1 and another pixel PX disposed on a side (e.g., an upper side) of the first pixel PX1 in the first direction DR1. A fourth voltage line VL4 may extend in the second direction DR2 at the boundary between the first pixel PX1 and another pixel PX disposed on another side (e.g., a lower side) of the first pixel PX1 in the first direction DR1. The first voltage line VL1 may be disposed on the right side of the emission area EMA. The second voltage line VL2 may be disposed on the left side of the emission area EMA. The third voltage line VL3 may be disposed on the upper side of the first sub-pixel SPX1. The fourth voltage line VL4 may be disposed on the lower side of the third sub-pixel SPX3.

In a first electrode RME1 of the first pixel PX1, an electrode piece portions RM_P may be disposed in the first sub-region SA1, and an electrode main portions RM_A may extend to a left side (or in a left direction) from the electrode piece portion RM_P. In the second electrode RME2 of the first pixel PX1, an electrode stem portion RM_S may be disposed in the second sub-region SA2, and electrode branch portions RM_B1 and RM_B2 may extend to a right side (or in a right direction) from the electrode stem portion RM_S.

The first voltage line VL1 of the second pixel PX2 may be disposed across the first sub-region SA1 in the first direction DR1. The second voltage line VL2 may extend in the first direction DR1 under the bank layer BNL adjacent to the second sub-region SA2. The third voltage line VL3 may extend in the second direction DR2 at a boundary between the second pixel PX2 and another pixel PX disposed on a side (e.g., an upper side) of the second pixel PX2 in the first direction DR1. The fourth voltage line VL4 may extend in the second direction DR2 at a boundary between the second pixel PX2 and another pixel PX disposed on another side (e.g., the lower side) of the second pixel PX2 in the first direction DR1. The first voltage line VL1 may be disposed on the left side of the emission area EMA. The second voltage line VL2 may be disposed on the right side of the emission area EMA. The third voltage line VL3 may be disposed on the upper side of the first sub-pixel SPX1. The fourth voltage line VL4 may be disposed on the lower side of the third sub-pixel SPX3.

In a first electrode RME1 of the second pixel PX2, an electrode piece portions RM_P may be disposed in the first sub-region SA1, and an electrode main portions RM_A may extend to the right side (or in the right direction) from the electrode piece portion RM_P. In a second electrode RME2 of the second pixel PX2, an electrode stem portions RM_S may be disposed in the second sub-region SA2, and electrode branch portions RM_B1 and RM_B2 may extend to the left side (or in the left direction) from the electrode stem portion RM_S.

In the first pixel PX1 and the second pixel PX2, the arrangement structure of the voltage lines VL1, VL2, VL3, and VL4 and the electrodes RME1 and RME2 may be different from each other. In the first pixel PX1 and the second pixel PX2, the arrangement of the first voltage line VL1 and the second voltage line VL2 may be symmetrical with respect to a boundary between the two pixels PX1 and PX2. Accordingly, in the first pixel PX1 and the second pixel PX2, the arrangement of the first electrode RME1, the second electrode RME2, and a dummy pattern EP may also be symmetrical with respect to the boundary between the two pixels PX1 and PX2. For example, the arrangement of the first electrode RME1, the second electrode RME2, and the dummy pattern EP of the first pixel PX1 may be symmetrical to the arrangement of the first electrode RME1, the second electrode RME2, and the dummy pattern EP of the second pixel PX2. At the boundary between the first pixel PX1 and the second pixel PX2, the first voltage lines VL1 of the pixels PX1 and PX2 and the electrode piece portions RM_P of the first electrodes RME1 may be spaced apart from each other, and face each other.

A gap between a second electrode contact hole CTS of the first pixel PX1 and a second electrode contact hole CTS of the second pixel PX2 may be greater than a gap between the dummy pattern EP of the first pixel PX1 and a third electrode contact hole CTA and/or a gap between the dummy pattern EP of the second pixel PX2 and the third electrode contact hole CTA. However, first electrode contact holes CTD of the first pixel PX1 and the second pixel PX2 may overlap the bank layer BNL disposed on the right side of the emission area EMA, and may overlap the first electrodes RME1 in a plan view. Unlike the arrangement of the first voltage line VL1 and the second voltage line VL2, second electrode patterns CSE2 of the first pixel PX1 and the second pixel PX2 may have a same arrangement. Accordingly, the first electrode contact holes CTD may be arranged in the first direction DR1 on the right side (or in the right direction) from a center of the pixel PX. The first electrode contact holes CTD of the first pixel PX1 may overlap a first electrode connection portion RM_C1 of the first electrode RME1. The first electrode contact holes CTD of the second pixel PX2 may overlap a part of the first electrode RME1, which protrudes in the second direction DR2 from the electrode main portion RM_A of the first electrode RME1.

The second electrode contact hole CTS may be disposed at a boundary between the third sub-pixel SPX3 and another pixel PX adjacent in the first direction DR1, at which the second voltage line VL2 and the fourth voltage line VL4 intersect each other. The dummy pattern EP and the third electrode contact hole CTA may be formed at a boundary between the first sub-pixel SPX1 and another pixel PX adjacent in the first direction DR1, at which the first voltage line VL1 and the third voltage line VL3 intersect each other. The second electrode contact hole CTS may be disposed on a lower left side of the first pixel PX1 and a lower right side of the second pixel PX2. The dummy pattern EP and the third electrode contact hole CTA may be disposed on an upper right side of the pixel PX1 and an upper left side of the second pixel PX2.

In the first pixel PX1 and the second pixel PX2 illustrated in FIG. 18, which are pixels adjacent to each other in the second direction DR2, the arrangements of the electrodes RME and the voltage lines VL1, VL2, VL3, and VL4 may be different from each other. In pixels adjacent in the first direction DR1, the arrangement of the electrodes RME and the voltage lines VL1, VL2, VL3, and VL4 may be different from each other.

The display device 10_1 may include the pixels PX arranged in the first direction DR1 and the second direction DR2. The pixels PX may form pixel rows PXR1, PXR2, PXR3, and PXR4 and pixel columns PXL1 and PXL2. The pixels PX in the pixel rows PXR1, PXR2, PXR3, and PXR4 and the pixel columns PXL1 and PXL2 may be classified into multiple pixels (e.g., pixels of multiple types) depending on the arrangement of the voltage lines VL1, VL2, VL3 and VL4 and the electrodes RME.

For example, the first voltage line VL1 and the second voltage line VL2 may extend in the first direction DR1, and may be spaced apart from each other in the second direction DR2. In a first pixel column PXL1, the first voltage line VL1 may be disposed on the right side (or in the right direction) from the center of the pixel PX, and the second voltage line VL2 may be disposed on the left side (or in the left direction) from the center of the pixel PX. In the second pixel column PXL2, the first voltage line VL1 may be disposed on the left side (or in the left direction) from the center of the pixel PX, and the second voltage line VL2 may be disposed on the right side (or in the right direction) from the center of the pixel PX. At the boundary between the first pixel column PXL1 and the second pixel column PXL2, the first voltage line VL1 of the first pixel column PXL1 and the first voltage line VL1 of the second pixel column PXL2 may be spaced apart from each other to face each other.

The third voltage line VL3 and the fourth voltage line VL4 may extend in the second direction DR2 and may be spaced apart from each other in the first direction DR1. The third voltage line VL3 and the fourth voltage line VL4 may be alternately disposed in the first direction DR1, and may be disposed at the boundary of each pixel PX.

In the first pixel row PXR1 and a third pixel row PXR3, the third voltage line VL3 may be disposed on the upper side (or in the upper direction) from the center of the pixel PX, and the fourth voltage line VL4 may be disposed on the lower side (or in the lower direction) from the center of the pixel PX. In the second pixel row PXR2 and a fourth pixel row PXR4, the third voltage line VL3 may be disposed on the lower side (or in the lower direction) from the center of the pixel PX, and the fourth voltage line VL4 may be disposed on the upper side (or in the upper direction) from the center of the pixel PX. The fourth voltage line VL4 may be disposed at a boundary between the first pixel row PXR1 and the second pixel row PXR2. The third voltage line VL3 may be disposed at a boundary between the second pixel row PXR2 and the third pixel row PXR3.

The arrangement of the electrodes RME and the electrode contact holes CTD, CTS, and CTS may vary depending on the arrangement of the voltage lines VL1, VL2, VL3, and VL4 disposed in the pixel PX. In the first pixel row PXR1 and the third pixel row PXR3 of the first pixel column PXL1, the third voltage line VL3 may be disposed on the upper side of the pixel PX, and the dummy pattern EP and the third electrode contact hole CTA may be disposed on the upper right side of the pixel PX. In the first pixel row PXR1 and the third pixel row PXR3, the fourth voltage line VL4 may be disposed on the lower side of the pixel PX, and the second electrode contact hole CTS may be disposed on the lower left side of the pixel PX. In the first pixel row PXR1 and the third pixel row PXR3 of the second pixel column PXL2, the third voltage line VL3 is disposed on the upper side of the pixel PX, and the dummy pattern EP and the third electrode contact hole CTA may be disposed on the upper left side of the pixel PX. In the first pixel row PXR1 and the third pixel row PXR3, the fourth voltage line VL4 is disposed on the lower side of the pixel PX, and the second electrode contact hole CTS may be disposed on the lower right side of the pixel PX.

In the second pixel row PXR2 and the fourth pixel row PXR4 of the first pixel column PXL1, the third voltage line VL3 is disposed on the lower side of the pixel PX, and the dummy pattern EP and the third electrode contact hole CTA may be disposed on the lower right side of the pixel PX. In the second pixel row PXR2 and the fourth pixel row PXR4, the fourth voltage line VL4 is disposed on the upper side of the pixel PX, and the second electrode contact hole CTS may be disposed on the upper left side of the pixel PX. In the second pixel row PXR2 and the fourth pixel row PXR4 of the second pixel column PXL2, the third voltage line VL3 is disposed on the lower side of the pixel PX, and the dummy pattern EP and the third electrode contact hole CTA may be disposed on the lower left side of the pixel PX. In the second pixel row PXR2 and the fourth pixel row PXR4, the fourth voltage line VL4 is disposed on the upper side of the pixel, and the second electrode contact hole CTS may be disposed on the right side of the pixel PX.

Pixels PX #11 and PX #13 may belong to (or be disposed in) the first pixel row PXR1 and the third pixel row PXR3 of the first pixel column PXL1. The pixels PX #11 and PX #13 may be first type pixels PXA. Pixels PX #21 and PX #23 may belong to (or be disposed in) the first pixel row PXR1 and the third pixel row PXR3 of the second pixel column PXL2. The pixels PX #21 and PX #23 may be second type pixels PXB. The first voltage line VL1, the second voltage line VL2, the second electrode contact hole CTS, the third electrode contact hole CTA, and the dummy pattern EP may be disposed symmetrically with respect to a boundary between the first type pixel PXA and the second type pixel PXB. In other embodiments, in the first type pixel PXA and the second type pixel PXB, the position of the first electrode contact hole CTD may be the same, and the shape of the first electrode RME1 may be different from each other. For example, a position of a first electrode contact hole CTD in the first type pixel PXA may be the same as a position of a first electrode contact hole CTD in the second type pixel PXB, and a shape of a first electrode RME1 in the first type pixel PXA may be different from a shape of a first electrode RME1 in the second type pixel PXB.

Pixels PX #12 and PX #14 may belong to (or be disposed in) the second pixel row PXR2 and the fourth pixel row PXR4 of the first pixel column PXL1. The pixels PX #12 and PX #14 may be third type pixels PXC. Pixels PX #22 and PX #24 may belong to (or be disposed in) the second pixel row PXR2 and the fourth pixel row PXR4 of the second pixel column PXL2. The pixels PX #22 and PX #24 may be fourth type pixels PXD. The first voltage line VL1, the second voltage line VL2, the second electrode contact hole CTS, and the third electrode contact hole CTA, and the dummy pattern EP may be disposed symmetrically with respect to a boundary between the third type pixel PXD and the fourth type pixel PXD. In other embodiments, in the third type pixel PXC and the fourth type pixel PXD, the positions of the first electrode contact holes CTD may be the same, and the shapes of the first electrodes RME1 may be different from each other. For example, a position of a first electrode contact hole CTD in the third type pixel PXC may be the same as a position of a first electrode contact hole CTD in the fourth type pixel PXD, and a shape of a first electrode RME1 in the third type pixel PXC may be different from a shape of a first electrode RME1 in the fourth type pixel PXD.

A separation portion ROP between the electrode piece portions RM_P of the first electrodes RME1 may be disposed in the sub-pixels SPXn of each pixel PX. The separation portion ROP may separate the first electrodes RME1 of adjacent ones of the sub-pixels SPXn belonging to each pixel PX. In an embodiment, the separation portion ROP may separate the first electrodes RME1 of adjacent ones of the pixels PX. In other embodiments, the separation portion ROP may separate the first electrode RME1 from the dummy pattern EP.

At the boundary between the first pixel row PXR1 and the second pixel row PXR2 and at a boundary between the third pixel row PXR3 and the fourth pixel row PXR4, the third voltage line VL3 and the dummy pattern EP may be disposed. In other embodiments, at a boundary between the second pixel row PXR2 and the third pixel row PXR3, the fourth voltage line VL4 may be disposed and the dummy pattern EP may not be disposed. Since the corresponding pixel rows PXR1, PXR2, PXR3, and PXR4 are arranged in the first direction DR1, and the sub-pixels SPXn of each pixel PX are also arranged in the first direction DR1, the boundary between the pixel rows PXR1, PXR2, PXR3, and PXR4 may be a boundary between the first sub-pixel SPX1 and the third sub-pixel SPX3.

At a portion of the boundary between the first sub-pixel SPX1 and the third sub-pixel SPX3 of two pixels PX (e.g., pixels of two types) where the dummy pattern EP is disposed, the separation portion ROP may be disposed on an upper side and a lower side with respect to the dummy pattern EP. However, at a portion of the boundary between the first sub-pixel SPX1 and the third sub-pixel SPX3 of two pixels PX where the dummy pattern EP is not disposed, the separation portion ROP may be disposed in only the pixel PX. For example, the dummy pattern EP may be disposed at a boundary between the third sub-pixel SPX3 of the second pixel row PXR2 and the first sub-pixel SPX1 of the third pixel row PXR3 illustrated in FIG. 19, and the separation portion ROP may be disposed on the upper side and the lower side of the dummy pattern EP. In other embodiments, the dummy pattern EP may not be disposed at a boundary between the third sub-pixel SPX3 of the first pixel row PXR1 and the first sub-pixel SPX1 of the second pixel row PXR2, and two separation portions ROP may be disposed in the first sub-pixel SPX1 of the second pixel row PXR2.

Depending on whether or not the dummy pattern EP is disposed at the boundary of the pixels PX, the pixels PX may have different numbers and arrangements of the separation portions ROP disposed in the sub-regions SA1 and SA2. For example, the pixels PX may be classified into different types (e.g., the first type pixel PXA, the second type pixel PXB, the third type pixel PXC, the fourth type pixel PXD, or the like). Three separation portions ROP may be disposed in the pixel PX belonging to the first pixel row PXR1 of the first pixel column PXL1, and four separation portions ROP may be disposed in the pixel PX belonging to the second pixel row PXR2 of the first pixel column PXL1. Gaps between the separation portions ROP of the pixel PX may also be different from each other. The gaps between the separation portions ROP of the pixel PX may be different from each other because the dummy pattern EP is not disposed on the boundary and the separation portion ROP does not overlap the bank layer BNL in a plan view.

In accordance with an embodiment, the arrangement design of the bank layer BNL may be changed, and the number of separation portions ROP formed in another pixels PX and the gap interposed therebetween may be constant regardless of whether or not the dummy pattern EP is disposed.

Figure 20:
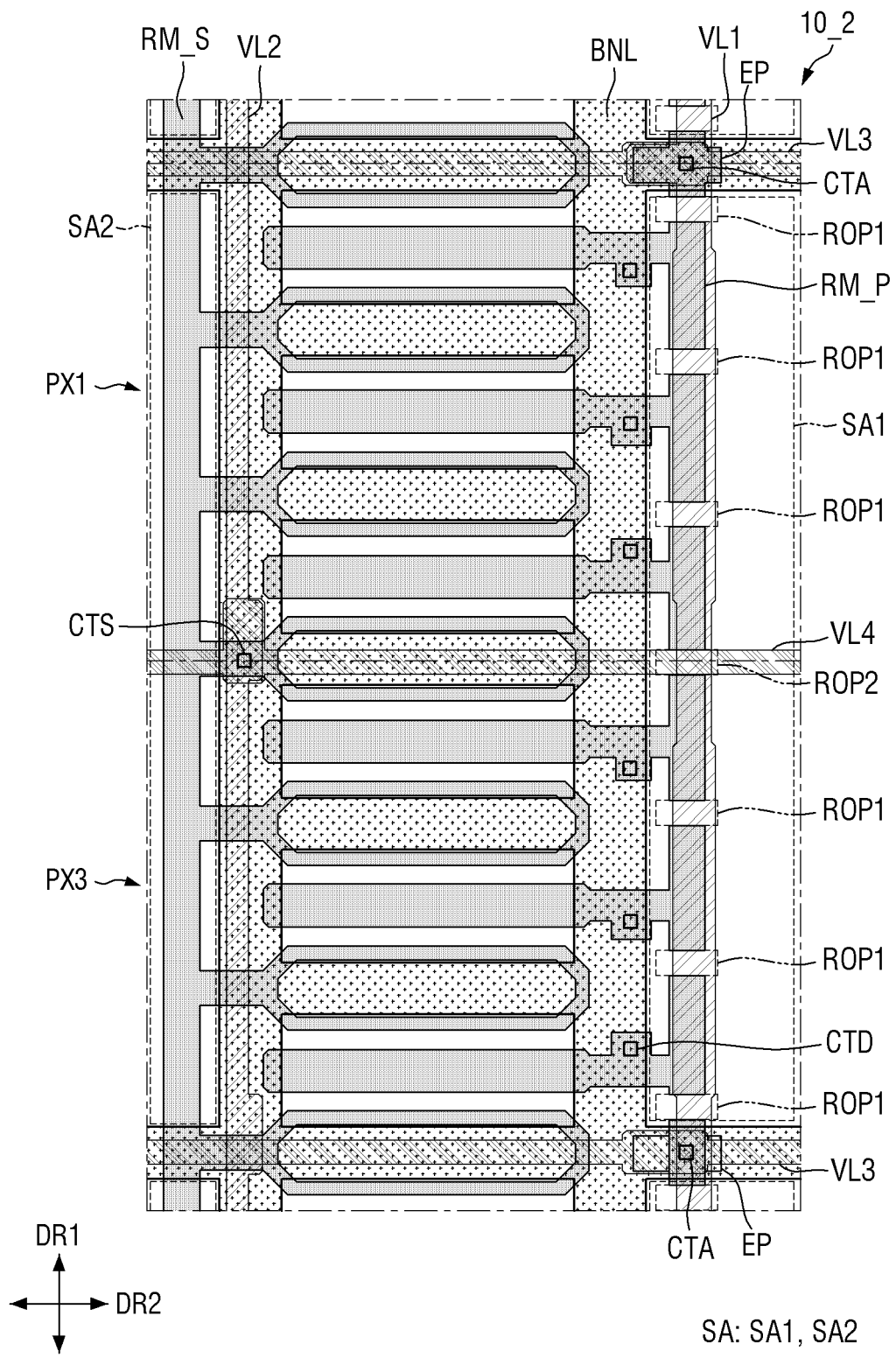
FIGS. 20 and 21 are schematic plan views illustrating the relative arrangement of some wires, electrodes, and a bank layer disposed in multiple pixels of a display device according to another embodiment.
Figure 21:
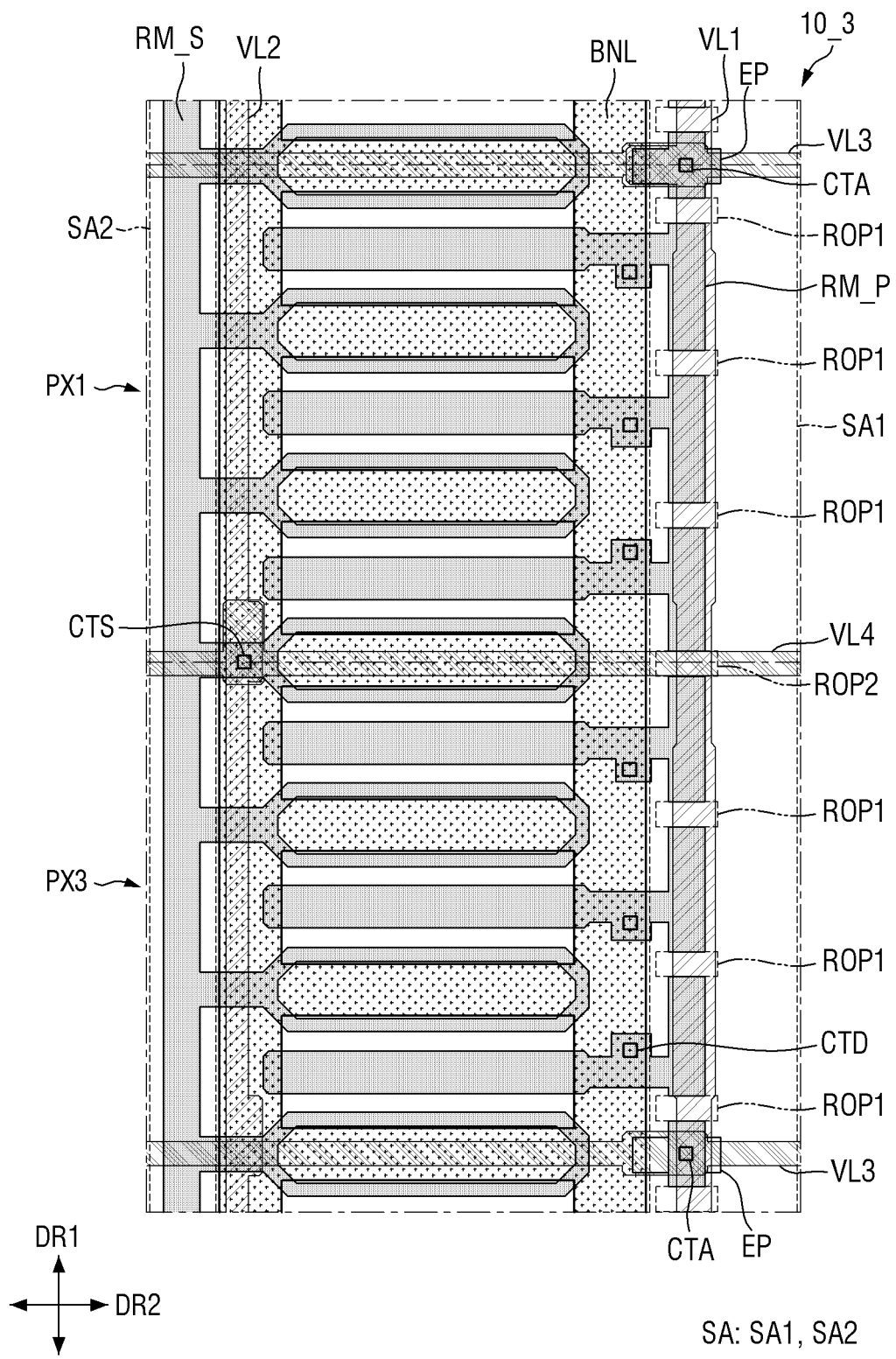

FIGS. 20 and 21 are schematic plan views illustrating the relative arrangement of some wires, electrodes, and a bank layer disposed in multiple pixels of a display device according to another embodiment.

Referring to FIGS. 20 and 21, in display devices 10_2 and 10_3 according to embodiments, a portion of a bank layer BNL extending in a second direction DR2, which is disposed between sub-regions SA1 and SA2 arranged in a first direction DR1, may be omitted.

In the display device 10_2 of FIG. 20, a portion of the bank layer BNL extending in the first direction DR1, which overlaps a third voltage line VL3 may extend in the second direction DR2, and divide the sub-regions SA1 and SA2 of multiple pixels PX. In the display device 10_2 of FIG. 20, a first pixel PX1 and a third pixel PX3 may be disposed adjacent in the first direction DR1, and the sub-regions SA1 and SA2 may not be divided in sub-pixels SPXn of each of the pixels PX1 and PX3. However, in each of the first pixel PX1 and the third pixel PX3, the sub-regions SA1 and SA2 may be divided by the bank layer BNL at a boundary between the pixel PX (e.g., the first pixel PX1 and the third pixel PX3) and another pixel PX adjacent in the first direction DR1. The bank layer BNL may include portions extending in the first direction DR1 and the second direction DR2. In the portion of the bank layer BNL extending in the second direction DR2, the gap between the portions disposed between the emission areas EMA and the gap between the portions disposed between the sub-regions SA1 and SA2 may be different from each other. Accordingly, a width of the emission area EMA measured in the first direction DR1 may be different from widths of the first sub-region SA1 and the second sub-region SA2 measured in the first direction DR1.

In the display device 10_3 of FIG. 21, a portion of a bank layer BNL extending in a first direction DR1 may be disposed only between emission areas EMA of sub-pixels SPXn, and may not be disposed between sub-regions SA1 and SA2 of multiple pixels PX and sub-pixels SPXn. In the display device 10_3 of FIG. 21, a first pixel PX1 and a third pixel PX3 may be disposed adjacent in the first direction DR1, and the sub-regions SA1 and SA2 may be integral with each other in each of the pixels PX1 and PX3 and the sub-pixels SPXn of each of the pixels PX1 and PX3. The bank layer BNL may include portions extending in the first direction DR1 and the second direction DR2, and the portion extending in the second direction DR2 may be disposed only between the emission areas EMA. A width of the emission area EMA measured in the first direction DR1 may be different from widths of the first sub-region SA1 and the second sub-region SA2 measured in the first direction DR1.

Separation portions ROP1 and ROP2 may be disposed in the sub-regions SA1 and SA2 (e.g., the first sub-region SA1), where an electrode piece portion RM_P of a first electrode RME1 (e.g., refer to FIG. 8) is disposed. A first separation portion ROP1 may be a separation portion disposed in an area occupied by the pixel PX, and a second separation portion ROP2 may be a separation portion disposed at a boundary of the pixel PX where the dummy pattern EP is not disposed. Unlike the above-described embodiments, at the boundary of the pixel PX where the dummy pattern EP is not disposed or at the portion overlapping the fourth voltage line VL4 in a plan view, the bank layer BNL may not be disposed in the sub-regions SA1 and SA2 and the second separation portion ROP2 may be disposed at the boundary. Three first separation portions ROP1 may be disposed in each of the first pixel PX1 and the third pixel PX3, and the second separation portion ROP2 may be disposed at the boundary between the first pixel PX1 and the third pixel PX3.

Accordingly, the first separation portion ROP1 and the second separation portion ROP2 disposed in the sub-regions SA1 and SA2 may be spaced apart from each other by a relatively similar gap between adjacent ones of the dummy patterns EP. In a process of forming the separation portions ROP1 and ROP2, a separation defect of the first electrode RME1 that may occur due to an error between a design value and a gap between the separation portions ROP1 and ROP2 may be prevented.

In the display devices 10_2 and 10_3, an arrangement of electrode contact holes CTD, CTS, and CTA, and the dummy pattern EP, and an arrangement of the electrode RME (e.g., the first electrode RME1) may be different depending on an arrangement of the voltage lines VL1, VL2, VL3, and VL4. Furthermore, an arrangement design of the bank layer BNL may be changed, and the arrangement of the electrodes RME or an arrangement of the separation portions ROP1 and ROP2 may be designed to be advantageous in the manufacturing process. Further, a defect caused by the residue that may occur in the separation process of the first electrode RME1 may be prevented.

Figure 22:
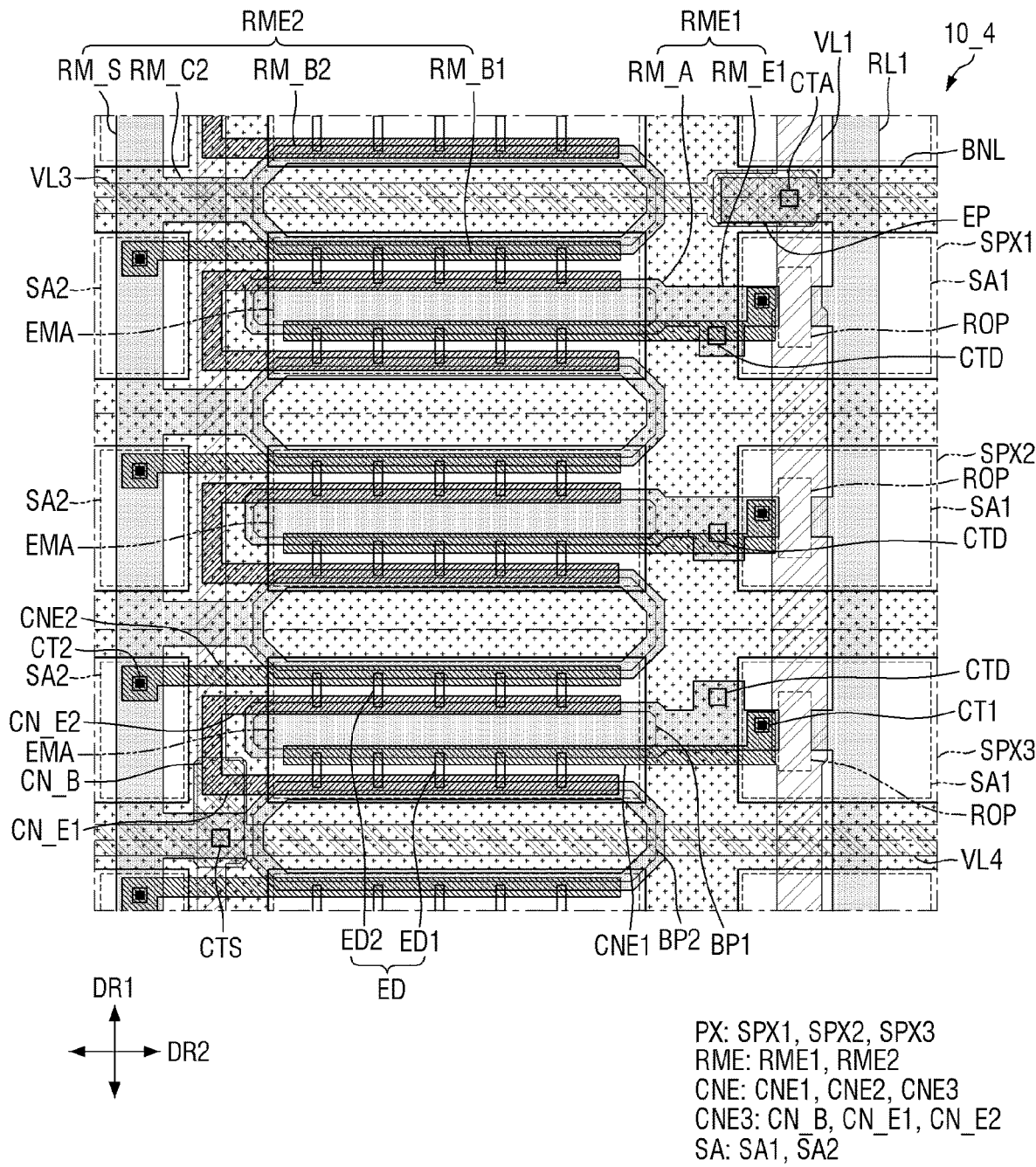
FIG. 22 is a schematic plan view illustrating electrodes disposed in a pixel of a display device according to another embodiment.

FIG. 22 is a schematic plan view illustrating electrodes disposed in a pixel of a display device according to another embodiment.

Referring to FIG. 22, a display device 10_4 according to an embodiment may further include a first electrode line RL1 disposed in sub-regions SA1 and SA2. First electrodes RME1 disposed in respective sub-pixels SPXn may be spaced apart from a first electrode line RL1. The display device 10_4 may be different from the display devices of the above-described embodiments in that the separation portion ROP separating the first electrodes RME1 disposed in multiple sub-pixels SPXn is disposed between the first electrode line RL1 and the first electrode RME1.

In the display device 10_4, the first electrode RME1 may include an electrode main portion RM_A and an electrode extension portion RM_E1. The electrode main portion RM_A may be disposed in an emission area EMA. The electrode extension portion RM_E1 may be electrically connected to the electrode main portion RM_A and disposed in a bank layer BNL and a part of the sub-regions SA1 and SA2. The electrode main portion RM_A may be the same as that in the above-described embodiments. The electrode extension portion RM_E1, which is a portion extending from the electrode main portion RM_A, may be a portion of the first electrode RME1, which overlaps the bank layer BNL in a plan view. The electrode extension portion EM_E1 (or a portion of the electrode extension portion EM_E1) may be disposed in a first electrode contact hole CTD. The electrode extension portion RM_E1 may be a portion spaced apart from the first electrode line RL1 in the sub-regions SA1 and SA2. The electrode main portion RM_A and the electrode extension portion RM_E1 of the first electrode RME1 may be the portions of the first electrode RME1, which are substantially integrated with each other. The electrode main portion RM_A and the electrode extension portion RM_E1 may be distinguished by arrangement positions thereof.

The first electrode line RL1 may extend in a first direction DR1, and may be disposed across the sub-regions SA1 and SA2. In case that the first electrode line RL1 is disposed in the first sub-region SA1, the first electrode RME1 may be disposed across the emission area EMA and the first sub-region SA1, and the separation portions ROP between the first electrode RME1 and the first electrode line RL1 may be disposed in the first sub-region SA1. The first electrode line RL1 and a dummy pattern EP may be integral with each other, and may be electrically connected to a third voltage line VL3 through the dummy pattern EP.

The first electrode RME1 may be in contact with a second electrode pattern CSE2 through the first electrode contact hole CTD at the portion of the electrode extension portion RM_E1 overlapping the bank layer BNL in a plan view. The first electrode RME1 may be in contact with a first connection electrode CNE1 through a first contact portion CT1 at the portion of the electrode extension portion RM_E1 disposed in the sub-regions SA1 and SA2.

In the display device 10 of FIGS. 4 to 8, the first electrode RME1 may include the electrode main portion RM_A, the first electrode connection portion RM_C1, and the electrode piece portion RM_P, and the first electrodes RME1 disposed in the sub-pixels SPXn may be spaced apart from each other with respect to the separation portion ROP disposed between the electrode piece portions RM_P. The first electrodes RME1 may be formed as (or formed from) an electrode (e.g., the first electrode line RL1 of FIG. 22), in which the electrode piece portions RM_P are electrically connected to each other, and the first electrodes RME1 may be formed by separating the first electrode line RL1 into the electrode piece portions RM_P, which are not electrically connected to each other.

On the other hand, in the display device 10_4 of FIG. 22, the first electrodes RME1 electrically connected to each other by the first electrode line RL1 may be formed by separating portions branched from the first electrode line RL1. For example, the portions branched from the first electrode line RL1 may be separated from each other by the separation portion ROP to form the first electrodes RME1. In the display device 10_4, the first electrodes RME1 may be separated by (or separated from) the first electrode line RL1. Thus, the formation position of the separation portion ROP may be standardized, and the separation process of separating the dummy pattern EP may be omitted. For example, the first electrode line RL1 may be electrically insulated from the first electrodes RME1 by the separation portion ROP, and additional separation process of electrically insulating the dummy pattern EP from the first electrodes RME1 may be omitted.

Figure 23:
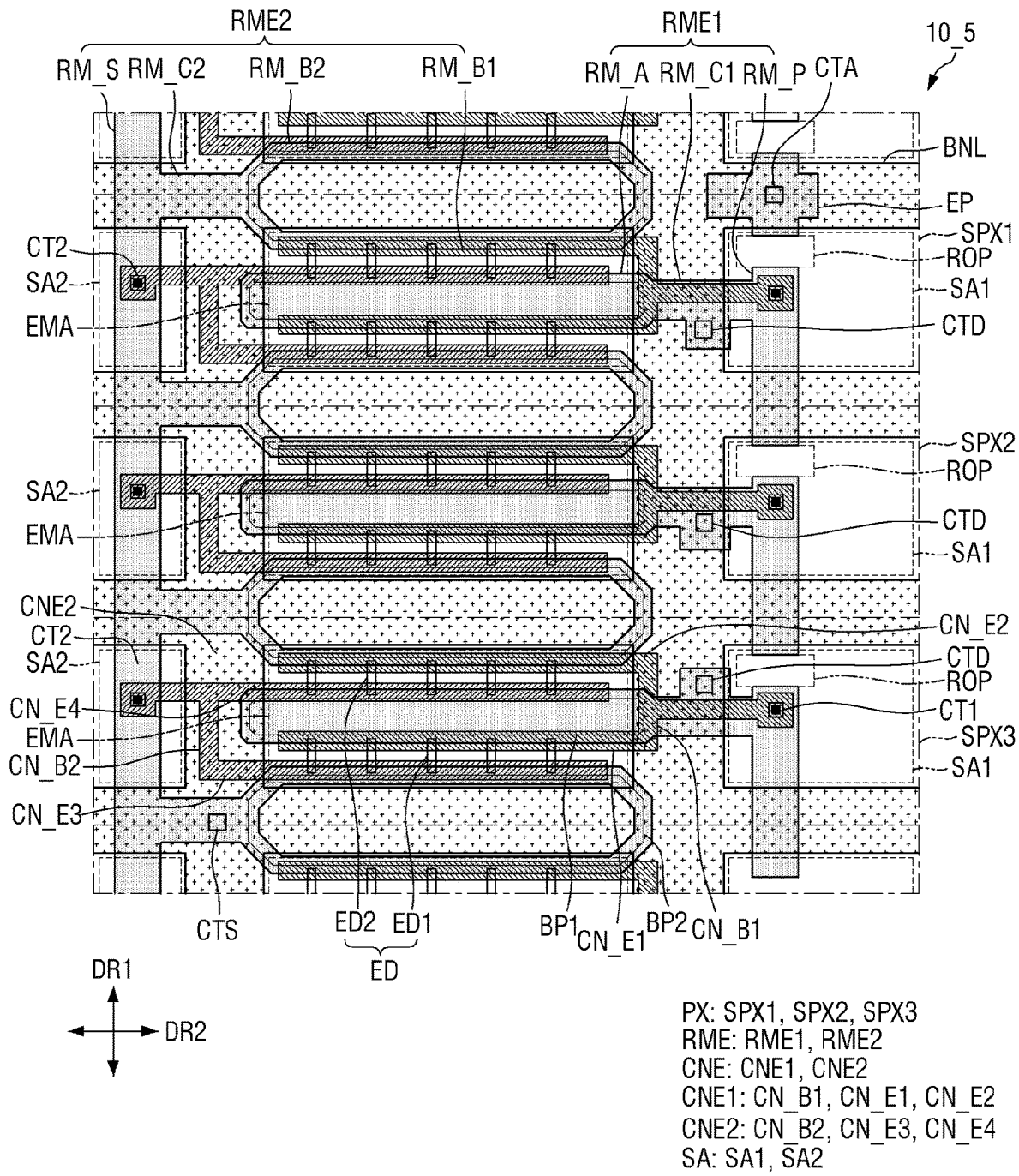
FIG. 23 is a schematic plan view illustrating electrodes and connection electrodes disposed in a pixel of a display device according to another embodiment.

FIG. 23 is a schematic plan view illustrating electrodes and connection electrodes disposed in a pixel of a display device according to another embodiment.

Referring to FIG. 23, in a display device 10_5, a third connection electrode CNE3 may be omitted, and a first connection electrode CNE1 and a second connection electrode CNE2 in contact with light emitting elements ED1 and ED2 may be included. In accordance with an embodiment, in the display device 10_1, the first connection electrode CNE1 and the second connection electrode CNE2 may include extension portions CN_E1, CN_E2, CN_E3, and CN_E4 and connection portions CN_B1 and CN_B2.

The first connection electrode CNE1 may include a first extension portion CN_E1 and a second extension portion CN_E2 extending in a second direction DR2, and a first connection portion CN_B1 electrically connecting the first extension portion CN_E1 to a second extension portion CN_E2. The first extension portion CN_E1 may be disposed on a first electrode RME1 and may be in contact with a first light emitting element ED1 in an emission area EMA. The second extension portion CN_E2 may be disposed on a first electrode branch RM_B1 of a second electrode RME2 and may be in contact with a second light emitting element ED2 in the emission area EMA. A first connection portion CN_B1 may include a portion extending in a first direction DR1 on a bank layer BNL to electrically connect the first extension portion CN_E1 to the second extension portion CN_E2. A first connection portion CN_B1 may include a portion extending in a second direction DR2 to sub-regions SA1 and SA2, and may be in contact with the first electrode RME1 through a first contact portion CT1 in the sub-regions SA1 and SA2. In case that an electrode piece portion RM_P of the first electrode RME1 is disposed in the first sub-region SA1, the first connection electrode CNE1 may be disposed across the emission area EMA and the first sub-region SA1, and may be in contact with the first electrode RME1 through the first contact portion CT1 formed in the first sub-region SAL The first connection electrode CNE1 may form a second connection electrode layer disposed on a third insulating layer PAS3. The first contact portion CT1 may penetrate a first insulating layer PAS1, a second insulating layer PAS2, and the third insulating layer PAS3.

The second connection electrode CNE2 may include a third extension portion CN_E3, a fourth extension portion CN_E4, and a second connection portion CN_B2. The third extension portion CN_E3 and the fourth extension portion CN_E4 may extend in the second direction DR2, and the second connection portion CN_B2 may electrically connect the third extension portion CN_E3 to the fourth extension portion CN_E4. The third extension portion CN_E3 may be disposed on a second electrode branch RM_B2 of the second electrode RME2 and may be in contact with the first light emitting element ED1 in the emission area EMA. The fourth extension portion CN_E4 may be disposed on the first electrode RME1 and may be in contact with the second light emitting element ED2 in the emission area EMA. The second connection portion CN_B2 may include a portion extending in the first direction DR1 on the bank layer BNL to electrically connect the third extension portion CN_E3 to the fourth extension portion CN_E4. The second connection portion CN_B2 may include a portion extending in the second direction DR2 to the sub-regions SA1 and SA2, and may be in contact with the second electrode RME2 through a second contact portion CT2 in the sub-regions SA1 and SA2. In case that an electrode stem portion RM_S of the second electrode RME2 is disposed in the second sub-region SA2, the second connection electrode CNE2 may be disposed across the emission area EMA and the second sub-region SA2, and may be in contact with the second electrode RME2 through the second contact portion CT2 formed in the second sub-region SA2. The second connection electrode CNE2 may form a first connection electrode layer disposed between the second insulating layer PAS2 and the third insulating layer PAS3, and the second contact portion CT2 may penetrate the first insulating layer PAS1 and the second insulating layer PAS2.

The first connection electrode CNE1 may be in contact with a first end of the first light emitting element ED1 and a first end of the second light emitting element ED2. The second connection electrode CNE2 may be in contact with a second end of the first light emitting element ED1 and a second end of the second light emitting element ED2. Unlike the above-described embodiments, the first light emitting element ED1 and the second light emitting element ED2 may be electrically connected to each other in parallel.

Figure 24:
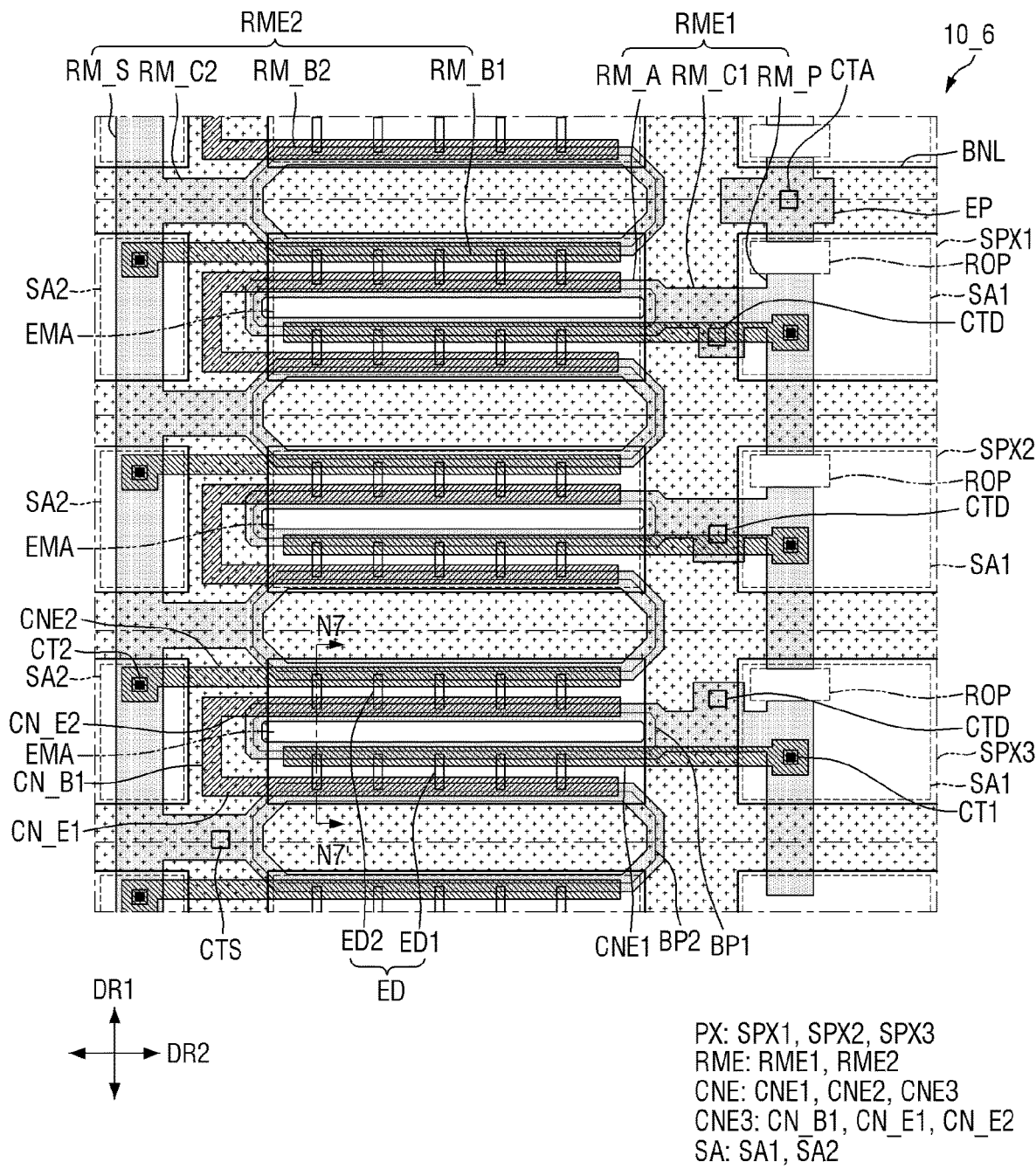
FIG. 24 is a schematic plan view illustrating electrodes and connection electrodes disposed in a pixel of a display device according to another embodiment.
Figure 25:
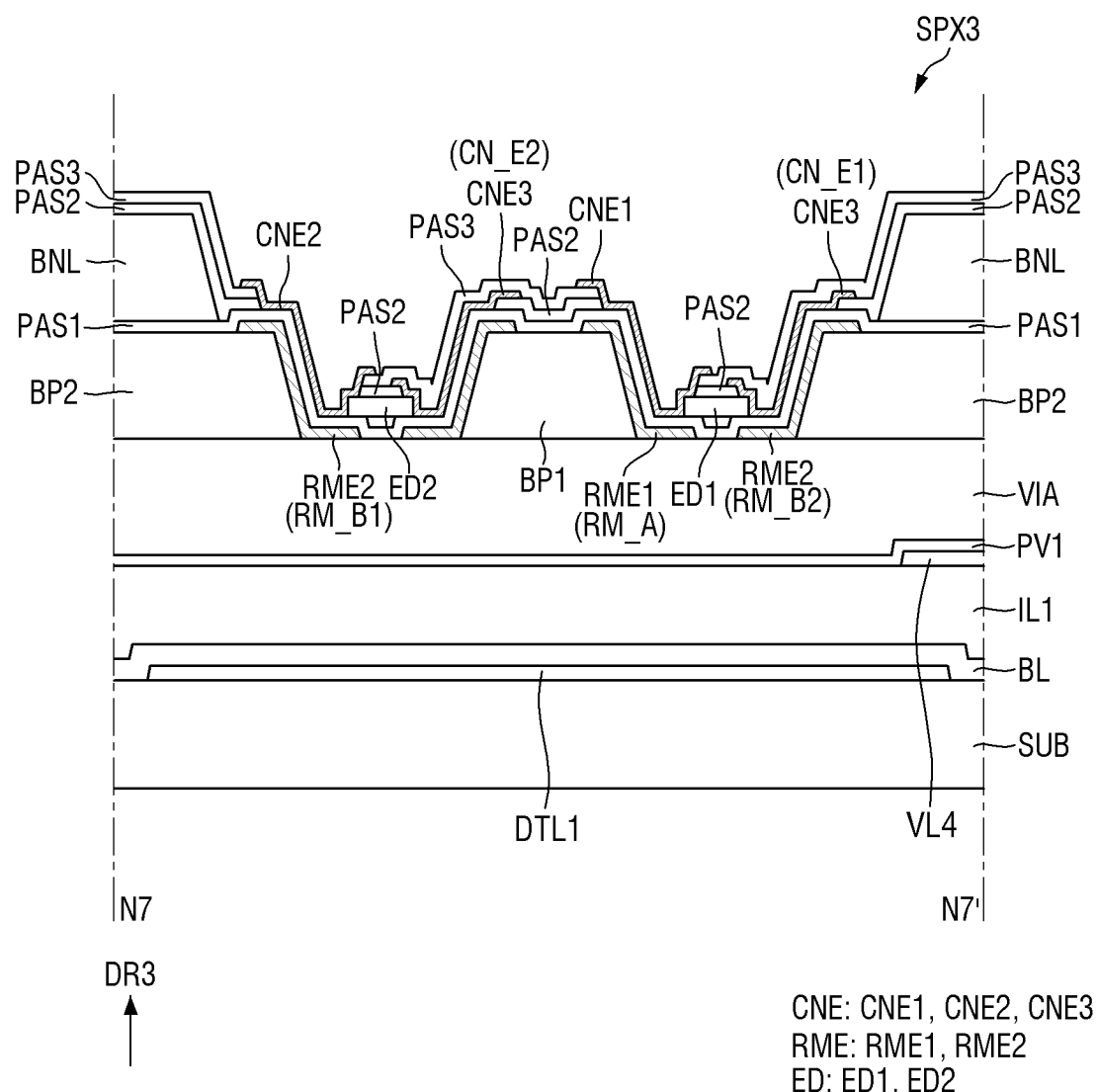
FIG. 25 is a schematic cross-sectional view taken along line N7-N7' of FIG. 24.

FIG. 24 is a schematic plan view illustrating electrodes and connection electrodes disposed in a pixel of a display device according to another embodiment. FIG. 25 is a schematic cross-sectional view taken along line N7-N7' of FIG. 24.

Referring to FIGS. 24 and 25, in a display device 10_6 according to an embodiment, an electrode main portion RM_A of a first electrode RME1 may have a relatively thin width and may not cover a part of a first bank pattern BP1. Similar to an electrode branch portions RM_B1 and RM_B2 of a second electrode RME2, the electrode main portion RM_A of the first electrode RME1 may have the same width as those of the electrode branch portions RM_B1 and RM_B2, and may cover at least one edge of the first bank pattern BP1. In an embodiment, the electrode main portion RM_A of the first electrode RME1 may only cover the edge.

A light emitting element ED may be in contact with a connection electrode CNE and electrically connected to the electrode RME. Although the electrode RME does not cover the bank patterns BP1 and BP2, the electrode RME may be electrically connected to the light emitting element ED. The electrode RME may be disposed only on inclined side surfaces of the bank patterns BP1 and BP2, and reflect light emitted from the light emitting element ED. In the first electrode RME1, the electrode main portion RM_A may expose (e.g., partially expose) a top surface of the first bank pattern BP1, and a first insulating layer PAS1 may be in direct contact with the first bank pattern BP1. In the display device 10_5, an area in which the electrode RME including a material having high reflectivity, which is unnecessarily disposed, may be reduced. Thus, reflection of external light may be reduced.

Figure 26:
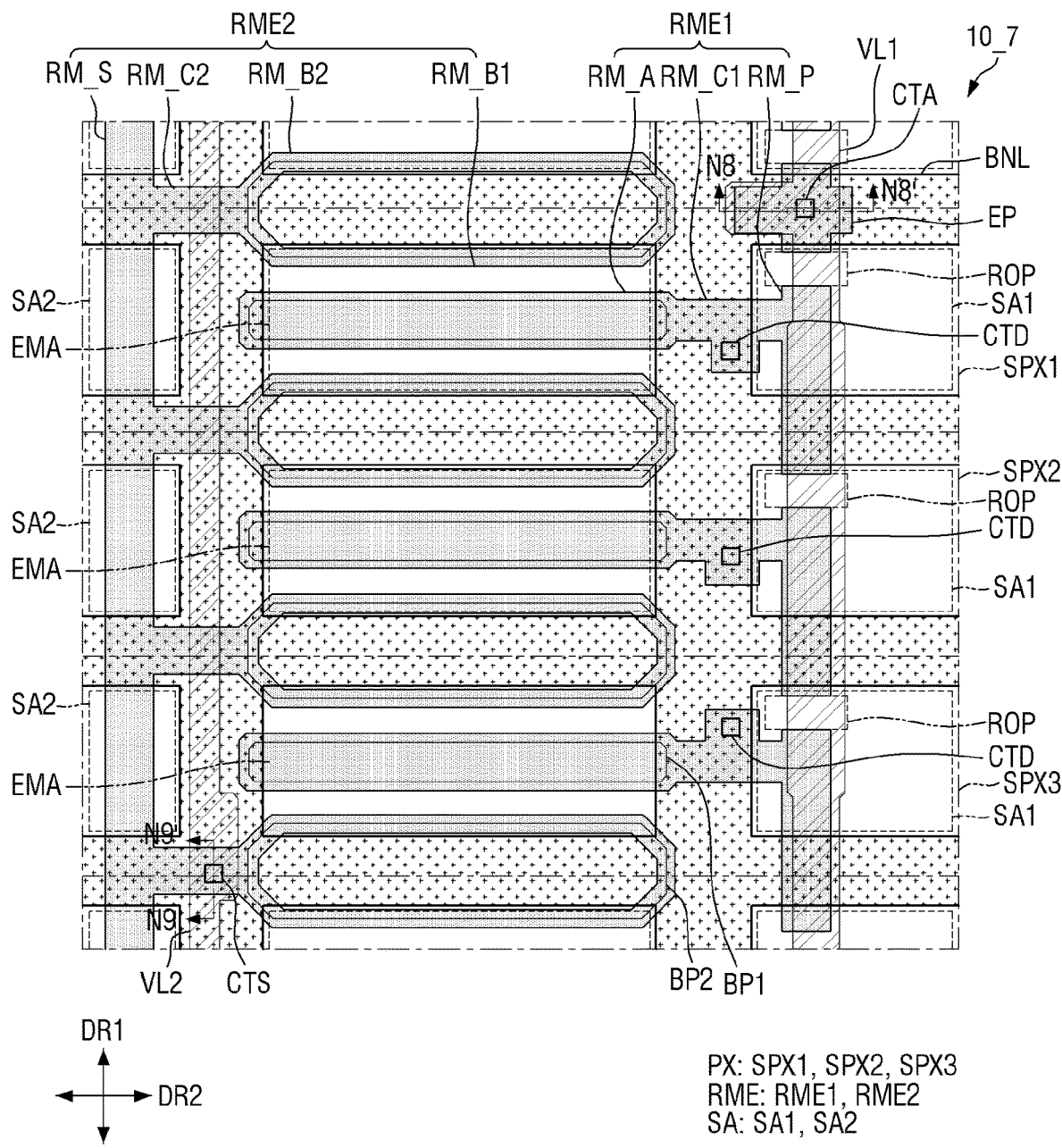
FIG. 26 is a schematic plan view illustrating electrodes disposed in a pixel of a display device according to another embodiment.
Figure 27:
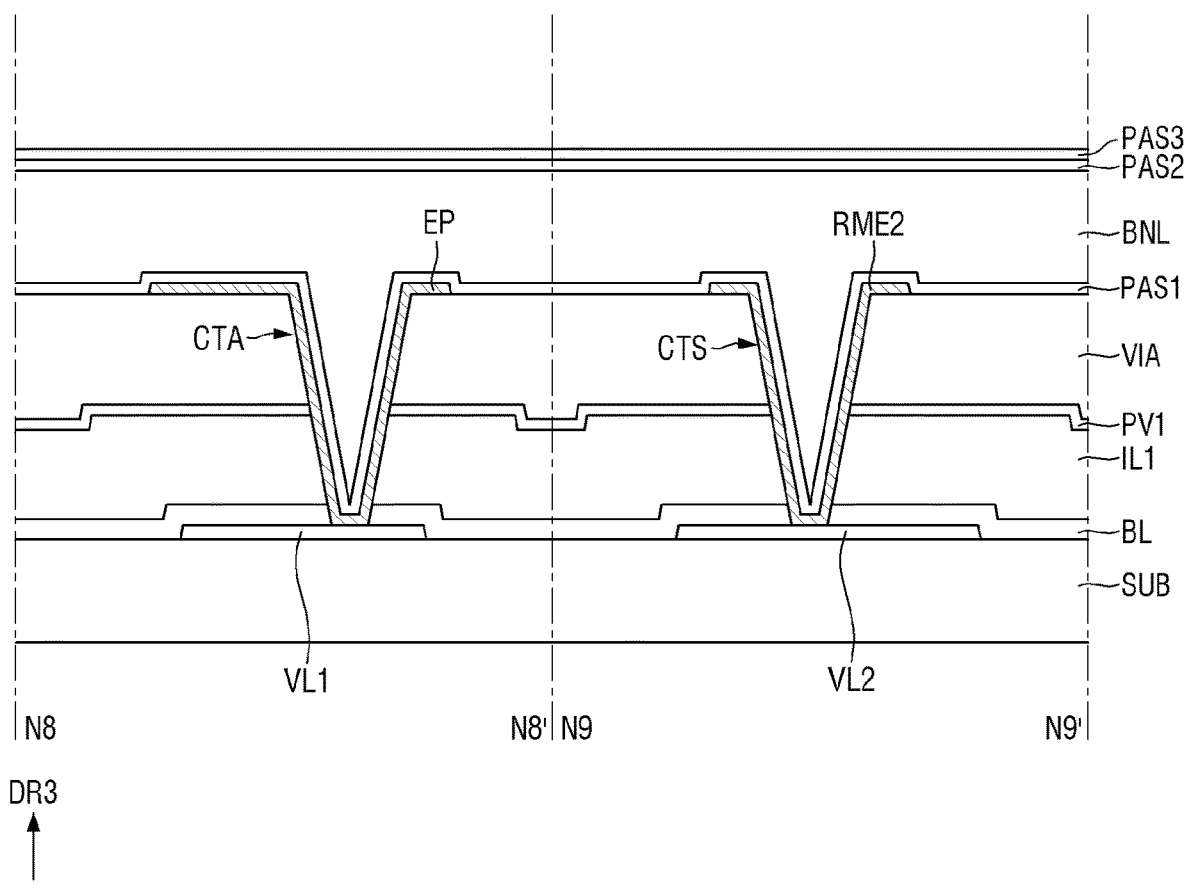
FIG. 27 is a schematic cross-sectional view taken along lines N8-N8' and N9-N9' of FIG. 26.

FIG. 26 is a schematic plan view illustrating electrodes disposed in a pixel of a display device according to another embodiment. FIG. 27 is a schematic cross-sectional view taken along lines N8-N8' and N9-N9' of FIG. 26. FIG. 27 illustrates a schematic cross section across the second electrode contact hole CTS and the third electrode contact hole CTA of FIG. 26.

Referring to FIGS. 26 and 27, in a display device 10_7 according to an embodiment, the third voltage line VL3 and the fourth voltage line VL4 (e.g., refer to FIG. 7) may be omitted. A second electrode RME2 may be electrically connected (e.g., directly connected) to a second voltage line VL2 through a second electrode contact hole CTS, and a dummy pattern EP may be electrically connected (e.g., directly connected) to a first voltage line VL1 through a third electrode contact hole CTA. Unlike a first electrode contact hole CTD penetrating a via layer VIA and a first passivation layer PV1, the second electrode contact hole CTS and the third electrode contact hole CTA may penetrate the via layer VIA, the first passivation layer PV1, a first interlayer insulating layer Il1, and a buffer layer BL to expose the first voltage line VL1 and the second voltage line VL2 of the first conductive layer. The second electrode RME2 and the dummy pattern EP may be in direct contact with the second voltage line VL2 and the first voltage line VL1, respectively.

In accordance with an embodiment, the display device 10_7 may further include color control structures TPL, WCL1, and WCL2 (e.g., refer to FIG. 28) and color filter layers CFL1, CFL2, and CFL3 (e.g., refer to FIG. 28) disposed on light emitting elements ED. Light emitted from the light emitting element ED may be emitted through the color control structures TPL, WCL1, and WCL2 and the color filter layers CFL1, CFL2, and CFL3, and colors of emitted lights may be different in each sub-pixel SPXn although light emitting elements ED of a same type are disposed in each sub-pixel SPXn.

Figure 28:
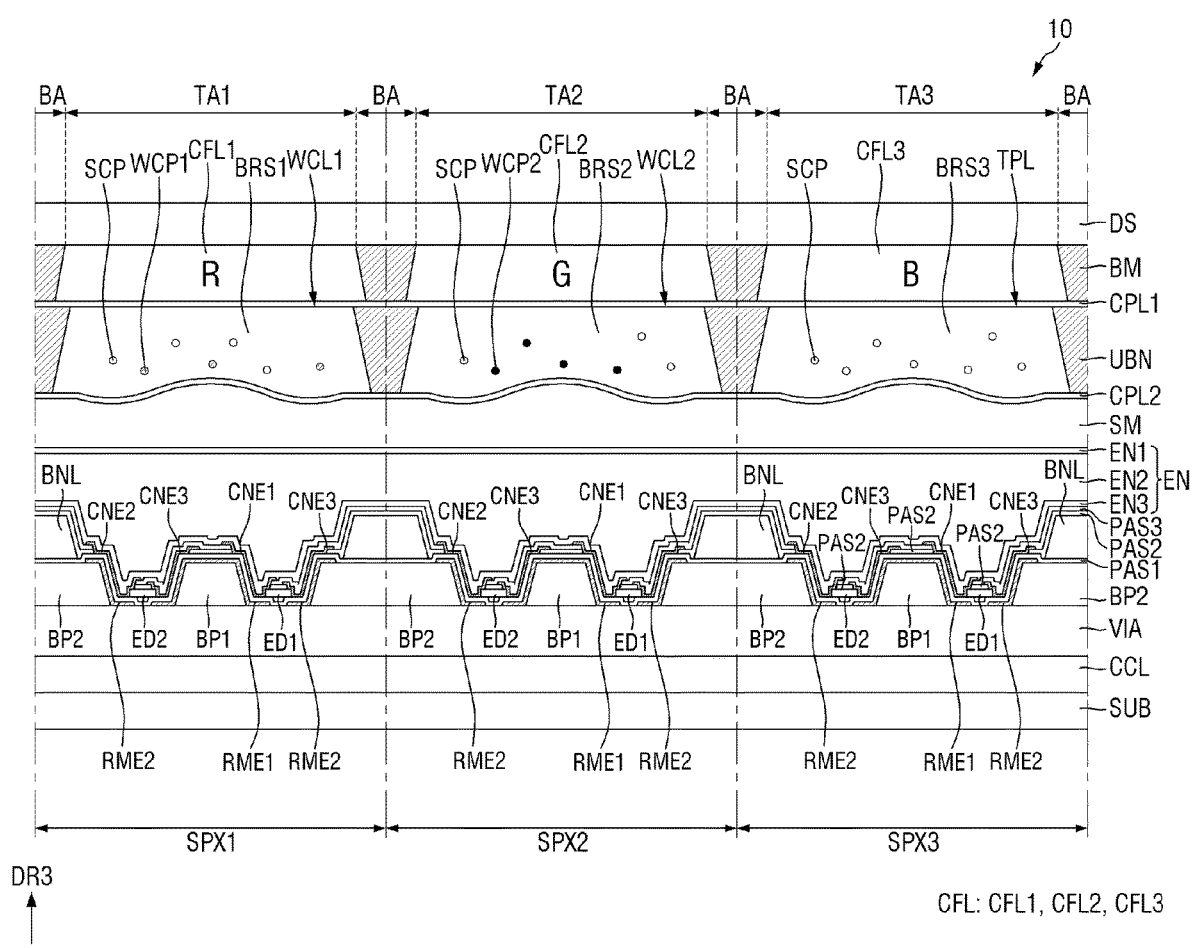
FIG. 28 is a schematic cross-sectional view of a display device according to an embodiment.

FIG. 28 is a schematic cross-sectional view of a display device according to an embodiment.

Referring to FIG. 28, the display device 10 may include a second substrate DS facing a first substrate SUB, color filter layers CFL1, CFL2, and CFL3 and color control structures TPL, WCL1, and WCL1 disposed on a surface of the second substrate DS. The display device 10 may include, on the first substrate SUB, encapsulation layers EN (or EN1, EN2, and EN3) disposed on a third insulating layer PAS3 and connection electrodes CNE1 and CNE2. The first substrate SUB and the second substrate DS may be bonded to each other by a sealing member SM.

The encapsulation layers EN disposed on the first substrate SUB may cover the third insulating layer PAS3 and the connection electrodes CNE1, CNE2, and CNE3 on light emitting elements ED. The encapsulation layer EN may be disposed on the first substrate SUB (e.g., entire first substrate SUB), and may cover (e.g., completely cover) members disposed on the first substrate SUB.

The encapsulation layer EN may include a first encapsulation layer EN1, a second encapsulation layer EN2, and a third encapsulation layer EN3 sequentially stacked one another on the third insulating layer PAS3. The first encapsulation layer EN1 and the third encapsulation layer EN3 may include an inorganic insulating material, and the second encapsulation layer EN2 may include an organic insulating material. For example, the first encapsulation layer EN1 and the third encapsulation layer EN3 may include at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride ($SiO_xN_y$), and lithium fluoride. The second encapsulation layer EN2 may include at least one of acrylic resin, methacrylic resin, polyisoprene, vinyl resin, epoxy resin, urethane resin, cellulose resin, and perylene resin. However, the structure and material of the encapsulation layer EN are not limited to the above-described description, and the stacked structure or material may be variously modified.

The color filter layers CFL1, CFL2, and CFL3 and the color control structures TPL, WCL1 and WCL2 on the second substrate DS may be disposed on the encapsulation layer EN. In the embodiment of FIG. 28, the color filter layers CFL1, CFL2 and CFL3 and the color control structures TPL, WCL1 and WCL2 may be formed on a surface of the second substrate DS, and the second substrate DS may be bonded to the first substrate SUB, on which the light emitting elements ED are disposed, by the sealing member SM.

The display device 10 may include light transmitting areas TA1, TA2, and TA3 and a light blocking area BA. The color filter layers CFL1, CFL2, and CFL3 may emit light in the light transmitting areas TA1, TA2, and TA3. The light blocking area BA may be disposed between the light transmitting areas TA1, TA2 and TA3, and the light may not be emitted in the light blocking area BA. The light transmitting areas TA1, TA2, and TA3 may correspond to a part of the emission area EMA of each sub-pixel SPXn, and the light blocking area BA may be an area other than the light transmitting areas TA1, TA2, and TA3. The light transmitting areas TA1, TA2, and TA3 and the light blocking area BA may be distinguished by a light blocking member BM. Description of the light blocking member BM is provided below.

The second substrate DS may face the first substrate SUB, and may be spaced apart from the first substrate SUB. The second substrate DS may be made of a light transmitting material. In some embodiments, the second substrate DS may include a glass substrate or a plastic substrate. In other embodiments, the second substrate DS may further include a separate layer, for example, an insulating layer such as an inorganic layer, located on the glass substrate or the plastic substrate. As illustrated in the drawing, the light transmitting areas TA1, TA2, and TA3 and the light blocking area BA may be defined on the second substrate DS.

The light blocking member BM may be disposed on a surface of the second substrate DS, which face the first substrate SUB. The light blocking member BM may be formed in a grid pattern to partially expose the surface of the second substrate DS. In the display device 10, the light blocking member BM may cover the sub-regions SA of each sub-pixel SPXn and bank layers BNL in a plan view. Areas in which the light blocking member BM is not disposed may be the light transmitting areas TA1, TA2, and TA3 in which the color filter layers CFL1, CFL2, and CFL3 emit light. For example, the light blocking member BM may not be disposed in the light transmitting areas TA1, TA2, and TA3, and the color filter layers CFL1, CFL2, and CFL3 may emit the light in the light transmitting areas TA1, TA2, and TA3. An area in which the light blocking member BM is disposed may be the light blocking area BA in which the emission of the light is blocked. For example, the light blocking member BM may be disposed in the light blocking area BA, and block the emission of the light.

The light blocking member BM may include an organic material capable of absorbing light. The light blocking member BM may absorb an external light, and reduce color distortion due to reflection of the external light. For example, the light blocking member BM may be made of a material used for a black matrix of the display device 10, and may absorb all wavelengths of visible light. The light blocking member BM and the black matrix of the display device 10 may have a same material.

In some embodiments, the display device 10 may not include the light blocking member BM, and may include an upper light absorbing member UBM including a material that absorbs light of a wavelength among visible light wavelengths and transmits light of another wavelength. In other embodiments, the display device 10 may include a color pattern containing the same material as at least one of the color filter layers CFL1, CFL2, and CFL3. For example, the display device 10 may include the color pattern containing the material of any one of the color filter layers in the above-described region where the light blocking member BM is disposed. In other embodiments, the display device 10 may include a structure in which color patterns are stacked each other the region where the light blocking member BM is disposed. A description thereof may refer to other embodiments.

The color filter layers CFL1, CFL2, and CFL3 may be disposed on a surface of the second substrate DS. The color filter layers CFL1, CFL2, and CFL3 may be respectively disposed on the surface of the second substrate DS, and correspond to the regions exposed by the light blocking member BM. The color filter layers CFL1, CFL2, and CFL3 may be spaced apart from each other with the light blocking member BM interposed between, but the disclosure is not limited thereto. In some embodiments, some of the color filter layers CFL1, CFL2, and CFL3 may be arranged on the light blocking member BM and separated from each other on the light blocking member BM. In another embodiment, the color filter layers CFL1, CFL2, and CFL3 may partially overlap each other in a plan view.

The color filter layers CFL1, CFL2, and CFL3 may include a first color filter layer CFL1 disposed in the first sub-pixel SPX1, a second color filter layer CFL2 disposed in the second sub-pixel SPX2, and a third color filter layer CFL3 disposed in the third sub-pixel SPX3. The color filter layers CFL1, CFL2, and CFL3 may be formed in an island-like pattern corresponding to the light transmitting areas TA1, TA2, and TA3 or the emission area EMA. However, the disclosure is not limited thereto. The color filter layers CFL1, CFL2, and CFL3 may form a linear pattern.

The color filter layers CFL1, CFL2, and CFL3 may contain a colorant such as a dye or a pigment that absorb light of another wavelength band other than a wavelength band. The color filter layers CFL1, CFL2, and CFL3 may be arranged for each sub-pixel SPXn (e.g., corresponding sub-pixel SPXn) and may transmit only a part of the light incident on the color filter layers CFL1, CFL2, and CFL3 in the corresponding sub-pixel SPXn. Each sub-pixel SPXn of the display device 10 may selectively display only the light that has passed through the color filter layers CFL1, CFL2, and CFL3. In an embodiment, the first color filter layer CFL1 may be a red color filter layer, the second color filter layer CFL2 may be a green color filter layer, and the third color filter layer CFL3 may be a blue color filter layer. The lights emitted from the light emitting element ED may be emitted through the color filter layers CFL1, CFL2, and CFL3 and transmit the color control structures TPL, WCL1, and WCL2.

A first capping layer CPL1 may be disposed on the color filter layers CFL1, CFL2, and CFL3 and the light blocking member BM. The first capping layer CPL1 may prevent impurities such as moisture or air from permeating from the outside and damaging or contaminating the color filter layers CFL1, CFL2, and CFL3. The first capping layer CPL1 may be made of an inorganic insulating material.

An upper bank layer UBN may overlap the light blocking member BM on a surface of the first capping layer CPL1 in a plan view. The upper bank layer UBN may include portions extending in the first and second directions DR1 and DR2 to be arranged in a grid pattern. The upper bank layer UBN may be adjacent to (e.g., surround) portions in which the color filter layers CFL1, CFL2, and CFL3 corresponds to the light transmitting areas TA1, TA2, and TA3. The upper bank layer UBN may form an area where the color control structures TPL, WCL1, and WCL2 are disposed.

The color control structures TPL, WCL1, and WCL2 may be disposed in the area adjacent to (or surrounded by) the upper bank layer UBN on the surface of the first capping layer CPL1. The color control structures TPL, WCL1, and WCL2 may be disposed in the light transmitting areas TA1, TA2, and TA3 adjacent to (or surrounded by) the upper bank layer UBN to form an island-like pattern in the display area DPA. However, the disclosure is not limited thereto, and the color control structures TPL, WCL1, and WCL2 may be arranged over the sub-pixels SPXn, and extend in a direction to form a linear pattern.

In case that the light emitting element ED of each sub-pixel SPXn emits blue light of the third color, the color control structures TPL, WCL1, and WCL2 may include the first wavelength conversion layer WCL1, the second wavelength conversion layer WCL2, and the light transmitting layer TPL. The first wavelength conversion layer WCL1 may be disposed on the first sub-pixel SPX1, and correspond to a first light transmitting area TA1. The second wavelength conversion layer WCL2 may be disposed on the second sub-pixel SPX2, and correspond to a second light transmitting area TA2. The light transmitting layer TPL may be disposed on the third sub-pixel SPX3, and correspond to a third light transmitting area TA3.

The first wavelength conversion layer WCL1 may include a first base resin BRS1 and a first wavelength conversion material WCP1 provided in the first base resin BRS1. The second wavelength conversion layer WCL2 may include a second base resin BRS2 and a second wavelength conversion material WCP2 provided in the second base resin BRS2. The first wavelength conversion layer WCL1 and the second wavelength conversion layer WCL2 may transmit the blue light of the third color incident from the light emitting element ED, and convert the wavelength of the blue light. The first wavelength conversion layer WCL1 and the second wavelength conversion layer WCL2 may further include a scatterer SCP contained in each base resin, and the scatterer SCP may increase wavelength conversion efficiency.

The light transmitting layer TPL may include a third base resin BRS3 and the scatterer SCP contained in the third base resin BSR3. The light transmitting layer TPL may transmit the blue light of the third color incident from the light emitting element ED, and maintain the wavelength of the blue light. The scatterer SCP of the light transmitting layer TPL may control an emission path of the light emitted through the light transmitting layer TPL. The light transmitting layer TPL may not include a wavelength conversion material.

The scatterer SCP may be a metal oxide particle or an organic particle. Examples of the metal oxide may include at least one of titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). However, the disclosure is not limited thereto. Examples of a material of the organic particles may include acrylic resin, urethane resin, and the like. However, the disclosure is not limited thereto, and the organic particles may have various suitable organic materials.

The first to third base resins BRS1, BRS2, and BRS3 may include a light transmitting organic material. For example, the first to third base resins BRS1, BRS2, and BRS3 may include at least one of an epoxy resin, an acrylic resin, a cardo resin, and an imide resin. However, the disclosure is not limited thereto. The first to third base resins BRS1, BRS2 and BRS3 may be formed of a same material, but the disclosure is not limited thereto.

The first wavelength conversion material WCP1 may convert the blue light of the third color into red light of the first color, and the second wavelength conversion material WCP2 may convert the blue light of the third color into the green light of the second color. The first wavelength conversion material WCP1 and the second wavelength conversion material WCP2 may be quantum dots, quantum bars, phosphors or the like. Examples of the quantum dot may include at least one of group IV nanocrystal, group II-VI compound nanocrystal, group III-V compound nanocrystal, and group IV-VI nanocrystal.

In the embodiment, top surfaces of the layers of the color control structures TPL, WCL1, and WCL2 may not be flat and edges of the color control structures TPL, WCL1, and WCL2 adjacent to the first bank BNL1 may be higher than central portions of the color control structures TPL, WCL1, and WCL2, the disclosure is not limited thereto. The top surfaces of the layers of the color control structures TPL, WCL1, and WCL2 may be flat, and/or the central portions of the color control structures TPL, WCL1, and WCL2 may be higher than the edges of the color control structures TPL, WCL1, and WCL2.

The light emitting element ED of each sub-pixel SPXn may emit the blue light of the same third color, and the sub-pixels SPXn may emit lights of different colors. For example, the light emitted from the light emitting element ED disposed in the first sub-pixel SPX1 may be incident on the first wavelength conversion layer WCL1. The light emitted from the light emitting element ED disposed in the second sub-pixel SPX2 may be incident on the second wavelength conversion layer WCL2. The light emitted from the light emitting element ED disposed in the third sub-pixel SPX3 may be incident on the light transmitting layer TPL. The light incident on the first wavelength conversion layer WCL1 may be converted into red light. The light incident on the second wavelength conversion layer WCL2 may be converted into green light. The light incident on the light transmitting layer TPL may be transmitted as the same blue light without wavelength conversion. Although each sub-pixel SPXn contains the light emitting elements ED that emit the light of the same color, the lights of different colors may be emitted depending on the arrangement of the color control structures TPL, WCL1, and WCL2 arranged above the light emitting elements ED.

The light emitting element ED disposed in the first sub-pixel SPX1 may emit the blue light of the third color, and the light (e.g., the blue light) may pass through the encapsulation layer EN and the second capping layer CPL2, and be incident into the first wavelength conversion layer WCL1. The first base resin BRS1 of the first wavelength conversion layer WCL1 may be made of a transparent material, and a part of the light may transmit the first base resin BRS1 and be incident on the first capping layer CPL1 disposed on the first wavelength conversion layer WCL1. However, at least a part of the light may be incident on the scatterer SCP and the first wavelength conversion material WCP1 arranged in the first base resin BRS1. The light may be scattered by the scatterer SCP and the wavelength of the light may be converted by the first wavelength conversion material WCP1. Thus, the light may be incident as the red light on the first capping layer CPL1. Lights incident on the second capping layer CPL2 may be incident on the first color filter layer CFL1, and the first color filter layer CFL1 may block transmission of other lights except for the red light. Accordingly, the first sub-pixel SPX1 may emit the red light.

Similarly, the lights emitted from the light emitting element ED disposed in the second sub-pixel SPX2 may pass through the encapsulation layer EN, the second capping layer CPL2, the second wavelength conversion layer WCL2, the first capping layer CPL1, and the second color filter layer CFL2 be emitted as the green light.

The light emitting element ED disposed in the third sub-pixel SPX3 may emit the blue light of the third color, and the light may pass through the encapsulation layer EN and the second capping layer CPL2 and be incident on the light transmitting layer TPL. The third base resin BRS3 of the light transmitting layer TPL may be made of a transparent material, and a part of the light may transmit the third base resin BRS3 and be incident on the capping layer CPL1 disposed on the light transmitting layer TPL. Lights incident on the first capping layer CPL1 may pass through the first capping layer CPL1 and be incident on the third color filter layer CFL3. The third color filter layer CFL3 may block transmission of other lights except for the blue light. Accordingly, the third sub-pixel SPX3 may emit the blue light.

The display device 10 according to an embodiment may include the color control structures TPL, WCL1, and WCL2 and the color filter layers CFL1, CFL2, and CFL3 disposed on the light emitting elements ED. Thus, lights of different colors may be displayed although light emitting elements ED of a same type are disposed in each sub-pixel SPXn.

In FIG. 28, the color filter layers CFL1, CFL2, and CFL3 and the color control structures TPL, WCL1, and WCL2 are formed on the second substrate DS and bonded to the first substrate SUB by the sealing member SM. However, the disclosure is not limited thereto. In accordance with another embodiment, the color control structures TPL, WCL1, and WCL2 may be formed (e.g., directly formed) on the first substrate SUB, or the color filter layers CFL1, CFL2, and CFL3 may also be formed on the first substrate SUB, so that the second substrate DS may be omitted.

Figure 29:
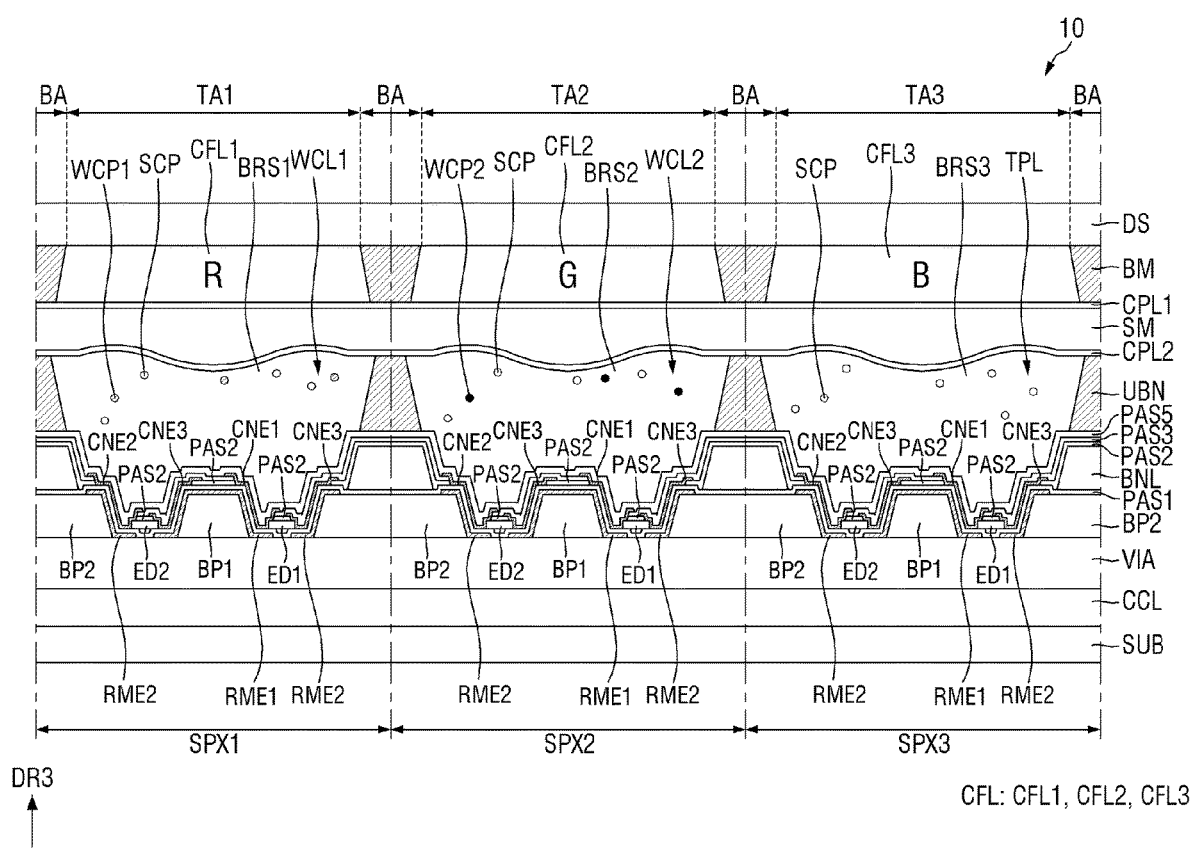
FIGS. 29 to 31 are schematic cross-sectional views of a display device according to another embodiment.
Figure 30:
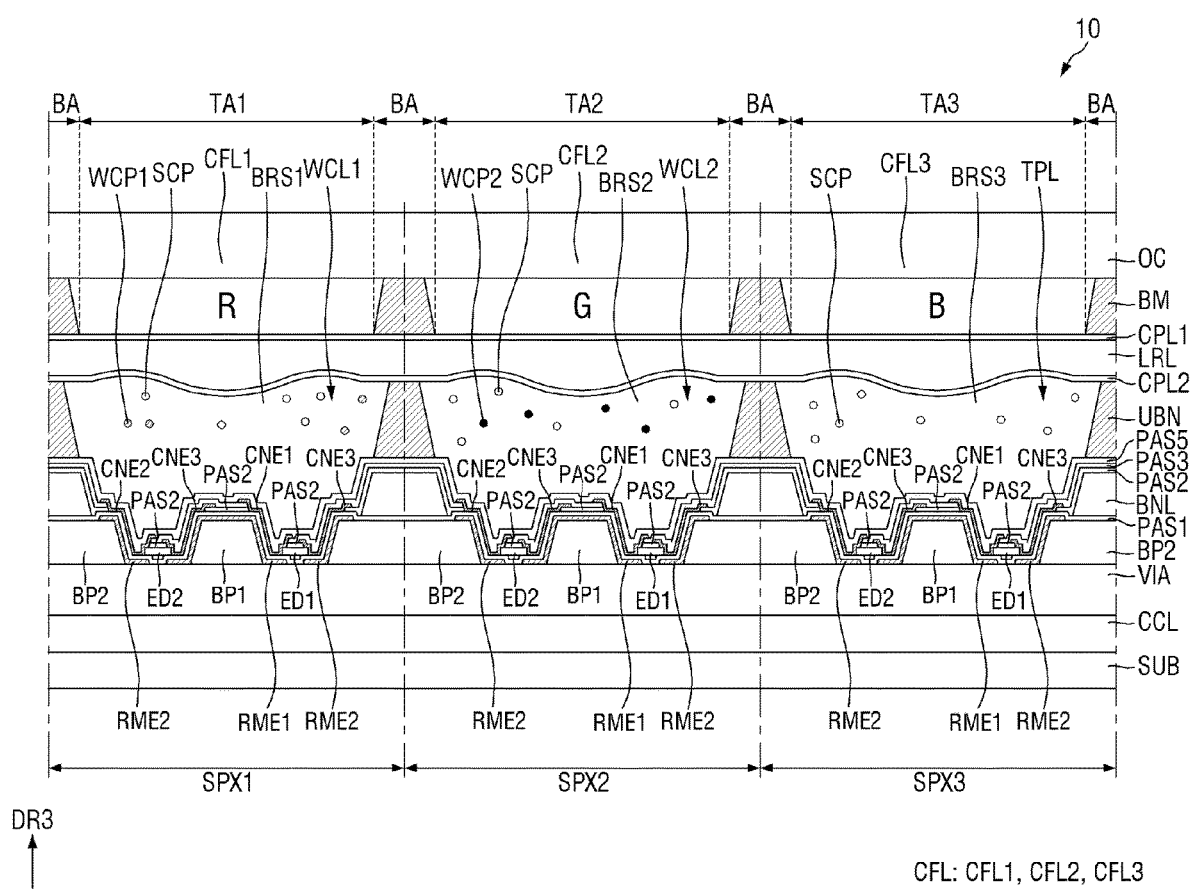
Figure 31:
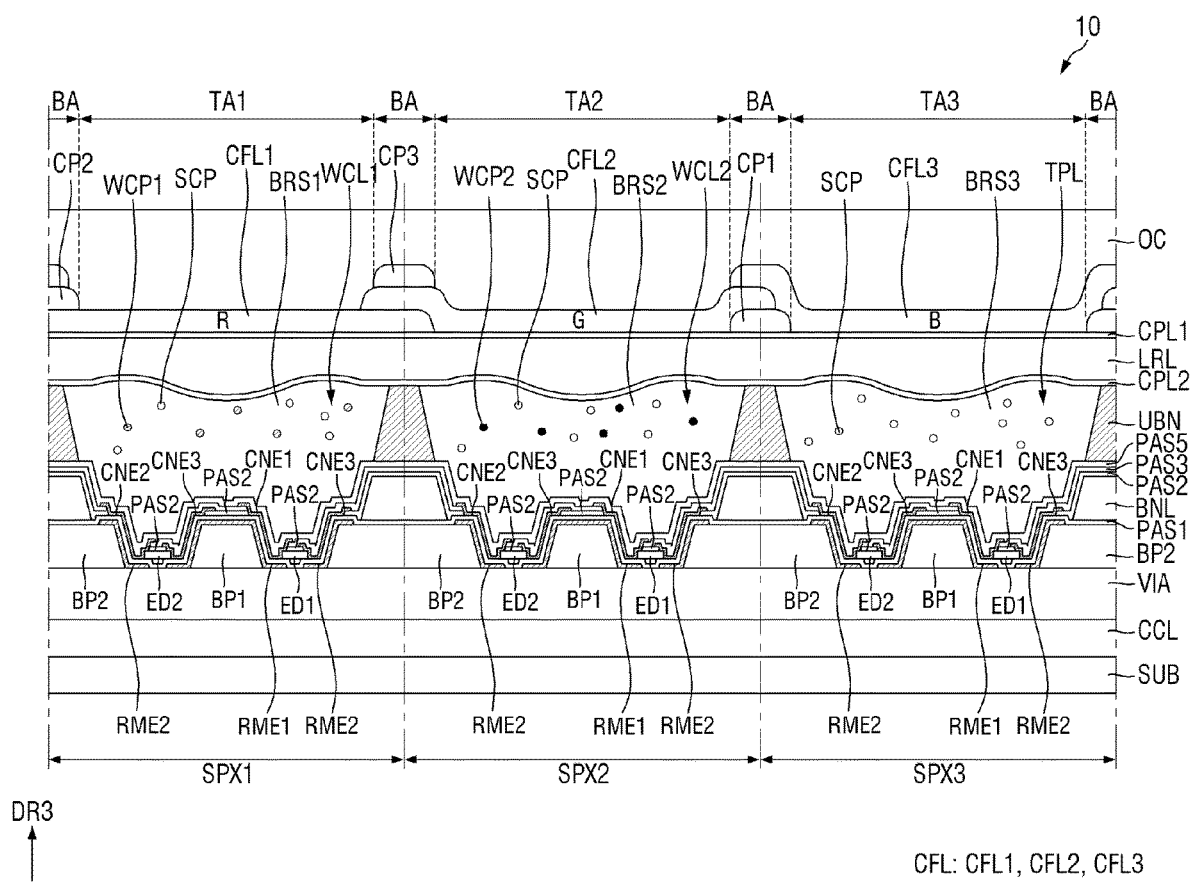

FIGS. 29 to 31 are schematic cross-sectional views of a display device according to another embodiment.

Referring to FIG. 29, in the display device 10, color control structures TPL, WCL1, and WCL2 and an upper bank layer UBN may be formed on a first substrate SUB, and color filter layers CFL1, CFL2, and CFL3 may be formed on a second substrate DS. The embodiment is different from the embodiment of FIG. 28 in that the arrangement of the color control structures TPL, WCL1, and WCL2 is different from each other.

A fourth insulating layer PAS4 may be further disposed on a third insulating layer PAS3, connection electrodes CNE1 and CNE2, and a bank layer BNL. In the embodiment of FIG. 28, similarly to the first encapsulation layer EN1, the fourth insulating layer PAS4 may protect all layers disposed on the first substrate SUB. However, the fourth insulating layer PAS4 may be omitted.

The upper bank layer UBN may be disposed (e.g., directly disposed) on the fourth insulating layer PAS4, and may overlap the bank layer BNL in a thickness direction of the display device 10. The upper bank layer UBN may be adjacent to (e.g., surround) at least a part of an emission area EMA, and the color control structures TPL, WCL1, and WCL2 may correspond to the emission area EMA. In other embodiments, the color control structures TPL, WCL1, and WCL2 may be formed in a linear pattern and disposed across multiple emission areas EMA.

The color control structures TPL, WCL1, and WCL2 may be disposed (e.g., directly disposed) on the fourth insulating layer PAS4. In the display device 10, a light emitting element ED that emits light and the color control structures TPL, WCL1, and WCL2 may be continuously arranged on the first substrate SUB. The upper bank layer UBN may have a height and adjacent to (e.g., surround) an area where the light emitting elements ED are disposed. Base resins BRS1, BRS2, and BRS3 of the color control structures TPL, WCL1 and WCL2 may be disposed (e.g., directly disposed) on the fourth insulating layer PAS4 in an area adjacent to (or surrounded by) the upper bank layer UBN. Scatterers SCP and wavelength conversion materials WCP1 and WCP2 of the color control structures TPL, WCL1, and WCL2 may be arranged around the light emitting element ED in each of the base resins BRS1, BRS2, and BRS3.

The second capping layer CPL2 may be disposed on the upper bank layer UBN and the color control structures TPL, WCL1, and WCL2. After a process of forming a circuit layer CCL and a process of forming the light emitting elements ED and the electrodes RME are performed, a process of forming the color control structures TPL, WCL1, and WCL2 may be performed on the first substrate SUB. The color filter layers CFL1, CFL2, and CFL3, the light blocking member BM, and the first capping layer CPL1 may be disposed on a surface of the second substrate DS, and the second substrate DS may be bonded to the first substrate SUB, on which the color control structures TPL, WCL1 and WCL2 are formed, by the sealing member SM. The embodiment is advantageous in that color conversion efficiency increases as the gap between the light emitting element ED and the color control structures TPL, WCL1, and WCL2 decreases. Further, since the color control structures TPL, WCL1, and WCL2 are disposed (e.g., directly disposed) on the fourth insulating layer PAS4, an encapsulation layer EN (e.g., refer to FIG. 28) may be omitted.

Referring to FIG. 30, in the display device 10, light emitting elements ED may be disposed on a first substrate SUB, and color control structures TPL, WCL1, and WCL2 and color filter layers CFL1, CFL2, and CFL3 may be sequentially disposed on the first substrate SUB having the light emitting elements ED. The embodiment is different from the embodiment of FIG. 29 in that all layers may be formed on the first substrate SUB without preparing the separate second substrate DS, and the second substrate DS and the sealing member SM are omitted.

A low refractive index layer LRL may be disposed on the color control structures TPL, WCL1, and WCL2 and an upper bank layer UBN, and a first capping layer CPL1, the color filter layers CFL1, CFL2, and CFL3, a light blocking member BM, and an overcoat layer OC may be disposed on the low refractive index layer LRL.

The low refractive index layer LRL that is an optical layer for recycling light having transmitted the color control structures TPL, WCL1, and WCL2 may improve a light emission efficiency and a color purity of the display device 10. The low refractive index layer LRL may be made of an organic material having a low refractive index, and may compensate a stepped portion formed by the color control structures TPL, WCL1 and WCL2 and the upper bank layer UBN.

The first capping layer CPL1, the color filter layers CFL1, CFL2, and CFL3, and the light blocking member BM may be substantially the same as those described above except that the arrangement positions thereof are different from each other.

The first capping layer CPL1 may be disposed on the low refractive index layer LRL, and may prevent impurities such as moisture, air or the like from permeating from the outside and damaging or contaminating the low refractive index layer LRL. The light blocking member BM may be disposed on the first capping layer CPL1, and overlap the upper bank layer UBN in a plan view. The light blocking member BM may be formed in a grid pattern, and partially expose a surface of the first capping layer CPL1. The color filter layers CFL1, CFL2, and CFL3 may correspond to an area opened by the light blocking member BM on the first capping layer CPL.

The overcoat layer OC may be disposed on the color filter layer CFL and the light blocking member BM. The overcoat layer OC may be disposed in a display area DPA (e.g., entire display area DPA of FIG. 2), and may be partially disposed in a non-display area NDA (e.g., refer to FIG. 2). The overcoat layer OC may protect the members containing an organic insulating material and arranged in the display area DPA from the outside.

Referring to FIG. 31, in the display device 10, the light blocking member BM (e.g., refer to FIG. 30) may be omitted and color patterns CP1, CP2, and CP3 may be disposed. The embodiment is different from the embodiment of FIG. 28 in that the light blocking member UBM is replaced by the color patterns CP1, CP2, and CP3.

The color patterns CP1, CP2, and CP3 may be formed in substantially the same grid pattern as the light blocking member BM of FIG. 28. However, the color patterns CP1, CP2, and CP3 may be made of the same material as those of color filter layers CFL1, CFL2, and CFL3, and may be integral with one another. Multiple color patterns CP1, CP2, and CP3 may be stacked each other in a light blocking area BA, and light transmission may be blocked in an area where the color patterns CP1, CP2, and CP3 are stacked one another.

A first color pattern CP1 may be made of the same material as that of a first color filter layer CFL1 and disposed in the light blocking area BA. The first color pattern CP1 may be disposed (e.g., directly disposed) on the first capping layer CPL1 in the light blocking area BA. The first color pattern CP1 and the first color filter layer CFL1 may be integral with each other in the light blocking area BA adjacent to a first light transmitting area TA1 of a first sub-pixel SPX1.

A second color pattern CP2 may be made of the same material as that of a second color filter layer CFL2 and disposed in the light blocking area BA. The second color pattern CP2 may be disposed (e.g., directly disposed) on the first color pattern CP1 in the light blocking area BA. The second color pattern CP1 and the second color filter layer CFL2 may be integral with each other in the light blocking area BA adjacent to a second light transmitting area TA2 of a second sub-pixel SPX2. Similarly, a third color pattern CP3 may be made of the same material as that of a third color filter layer CFL3 and disposed in the light blocking area BA. The third color pattern CP3 may be disposed (e.g., directly disposed) on the second color pattern CP2 in the light blocking area BA. The third color pattern CP3 and the third color filter layer CFL3 may be integral with each other in the light blocking area BA adjacent to a third light transmitting area TA3 of a third sub-pixel SPX3.

The display device 10 according to the embodiment has the color patterns CP1, CP2, and CP3 stacked one another and performing the same function as that of the light blocking member BM, and mixture of colors between adjacent areas due to materials containing different colorants may be prevented. Further, since the color patterns CP1, CP2, and CP3 include the same materials as those of the color filter layers CFL1, CFL2, and CFL3, external light or reflected light transmitting the light blocking area BA may have a wavelength band of a color. An eye color sensibility perceived by user's eyes may vary depending on the color of the light. A light in a blue wavelength band may be perceived less sensitively to the user than a light in a green wavelength band or a light in a red wavelength band. Since the light blocking member BM is omitted and the color patterns CP1, CP2, and CP3 are disposed in the light blocking area BA, the transmission of the light may be blocked and the user may perceive the reflected light relatively less sensitively. Also, a part of the light from the outside of the display device 10 may be absorbed and the reflected light due to the external light may be reduced.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a plurality of electrode patterns spaced apart from each other in a first direction;
a via layer disposed on the plurality of electrode patterns;
a plurality of first electrodes, each of the plurality of first electrodes partially overlapping an electrode pattern of the plurality of electrode patterns on the via layer in a plan view and extending in a second direction intersecting the first direction;
a plurality of second electrodes, each of the plurality of second electrodes comprising a portion extending in the second direction, the plurality of first electrodes and the plurality of second electrodes being spaced apart from each other and alternately disposed with each other;
a plurality of light emitting elements disposed on a first electrode of the plurality of first electrodes and a second electrode of the plurality of second electrodes;
a first voltage line extending in the first direction; and
a second voltage line spaced apart from the first voltage line in the second direction with the plurality of electrode patterns interposed between the first voltage line and the second voltage line, wherein
the plurality of first electrodes are in contact with the plurality of electrode patterns through a plurality of first electrode contact holes penetrating the via layer,
the plurality of first electrode contact holes are spaced apart from each other in the first direction,
the first electrode of the plurality of first electrodes is electrically connected to the first voltage line, and
the second electrode of the plurality of second electrodes is electrically connected to the second voltage line.

2. The display device of claim 1, further comprising:
a third voltage line extending in the second direction and intersecting the first voltage line; and
a fourth voltage line extending in the second direction and intersecting the second voltage line, wherein
the fourth voltage line is spaced apart from the third voltage line in the first direction with the plurality of electrode patterns interposed between the third voltage line and the fourth voltage line, and
the second electrode of the plurality of second electrodes is electrically connected to the fourth voltage line.

3. The display device of claim 2, wherein
each of the plurality of second electrodes comprises an electrode stem portion extending in the first direction, and
the electrode stem portion is in contact with the fourth voltage line through a second electrode contact hole penetrating the via layer at a portion overlapping the fourth voltage line in a plan view.

4. The display device of claim 2, further comprising:
a dummy pattern disposed on the via layer, and overlapping the third voltage line in a plan view,
wherein the dummy pattern is spaced apart from the first electrode of the plurality of first electrodes and is in contact with the third voltage line through a third electrode contact hole penetrating the via layer.

5. A display device comprising:
a plurality of electrode patterns spaced apart from each other in a first direction;
a via layer disposed on the plurality of electrode patterns;
a plurality of first electrodes, each of the plurality of first electrodes partially overlapping an electrode pattern of the plurality of electrode patterns on the via layer in a plan view and extending in a second direction intersecting the first direction;
a plurality of second electrodes, each of the plurality of second electrodes comprising a portion extending in the second direction, the plurality of first electrodes and the plurality of second electrodes being spaced apart from each other and alternately disposed with each other; and
a plurality of light emitting elements disposed on a first electrode of the plurality of first electrodes and a second electrode of the plurality of second electrodes, wherein
the plurality of first electrodes are in contact with the plurality of electrode patterns through a plurality of first electrode contact holes penetrating the via layer,
the plurality of first electrode contact holes are spaced apart from each other in the first direction,
each of the plurality of second electrodes comprises:
an electrode stem portion extending in the first direction;
a plurality of electrode branch portions, each of the plurality of electrode branch portions extending in the second direction and spaced apart from the first electrode of the plurality of first electrodes; and
a first electrode connection portion electrically connected to the electrode stem portion and the plurality of electrode branch portions, and
a light emitting element of the plurality of light emitting elements is disposed on the first electrode of the plurality of first electrodes and an electrode branch portion of the plurality of electrode branch portions.

6. The display device of claim 5, wherein
each of the plurality of first electrodes comprises:
an electrode main portion extending in the second direction and spaced apart from the electrode branch portion of the plurality of electrode branch portions of the second electrode of the plurality of second electrodes;
an electrode piece portion spaced apart from the electrode stem portion in the second direction and extending in the first direction; and
a second electrode connection portion electrically connecting the electrode main portion to the electrode piece portion,
in the plurality of first electrodes, the electrode piece portion comprises a plurality of electrode piece portions spaced apart from each other in the first direction.

7. The display device of claim 5, wherein
the plurality of electrode branch portions comprises:
a first electrode branch portion included in the second electrode of the plurality of second electrodes; and
a second electrode branch portion included in another second electrode of the plurality of second electrodes,
the plurality of light emitting elements comprises:
a first light emitting element having:
a first end disposed on the first electrode of the plurality of first electrodes; and
a second end disposed on the first electrode branch portion; and
a second light emitting element having:
a first end disposed on the first electrode of the plurality of first electrodes; and
a second end disposed on the second electrode branch portion.

8. The display device of claim 7, further comprising:
a first connection electrode disposed on the first electrode of the plurality of first electrodes and in contact with the first end of the first light emitting element;
a second connection electrode disposed on the first electrode branch portion of the second electrode of the plurality of second electrodes and in contact with the second end of the second light emitting element; and
a third connection electrode comprising:
a first extension portion disposed on the second electrode branch portion of the second electrode of the plurality of second electrodes and in contact with the second end of the first light emitting element;
a second extension portion disposed on the first electrode of the plurality of first electrodes and in contact with the first end of the second light emitting element; and
a first connection portion electrically connecting the first extension portion to the second extension portion.

9. The display device of claim 5, further comprising:
an electrode line spaced apart from the electrode stem portion of the second electrode of the plurality of second electrodes in the second direction and extending in the first direction,
wherein the plurality of first electrodes are spaced apart from the electrode line.

10. The display device of claim 5, further comprising:
a bank layer surrounding an emission area in which the plurality of light emitting elements are disposed, a first sub-region disposed on a side of the emission area in the second direction, and a second sub-region disposed on another side of the emission area in the second direction,
wherein the electrode stem portion is disposed in the first sub-region.

11. The display device of claim 10, wherein the bank layer overlaps the plurality of first electrode contact holes in a plan view.

12. The display device of claim 1, further comprising:
a plurality of first bank patterns extending in the second direction and spaced apart from each other in the first direction; and
a plurality of second bank patterns extending in the second direction and disposed between the first bank patterns,
wherein the plurality of light emitting elements are disposed between a first bank pattern of the plurality of first bank patterns and a second bank pattern of the plurality of second bank patterns.

13. The display device of claim 12, wherein
the first electrode of the plurality of first electrodes covers the first bank pattern of the plurality of first bank patterns,
a part of the second electrode of the plurality of second electrodes is disposed on the second bank pattern of the plurality of second bank patterns, and
a width of a portion of the first electrode of the plurality of first electrodes disposed on the first bank pattern of the plurality of first bank patterns is greater than a width of a portion of the second electrode of the plurality of second electrodes disposed on the second bank pattern of the plurality of second bank patterns.

14. A display device comprising:
a plurality of pixels arranged in a first direction and a second direction intersecting the first direction;
a first voltage line and a second voltage line disposed in a pixel of the plurality of pixels and spaced apart from each other in the second direction, the first voltage line and the second voltage line extending in the first direction;
a third voltage line and a fourth voltage line disposed in the pixel of the plurality of pixels and spaced apart from each other in the first direction, the third voltage line and the fourth voltage line extending in the second direction;
a plurality of electrode patterns disposed between the first voltage line and the second voltage line and spaced apart from each other in the first direction;
a plurality of first electrodes, each of the plurality of first electrodes overlapping an electrode pattern of the plurality of electrode patterns in a plan view and extending in the second direction;
a plurality of second electrodes, each of the plurality of second electrodes extending in the second direction, the plurality of first electrodes and the plurality of second electrodes being spaced apart from each other and alternately disposed with each other; and
a plurality of light emitting elements disposed on a first electrode of the plurality of first electrodes and a second electrode of the plurality of second electrodes, wherein
the plurality of first electrodes are in contact with the plurality of electrode patterns through a plurality of first electrode contact holes, and
the plurality of first electrode contact holes are spaced apart from each other in the first direction.

15. The display device of claim 14, further comprising:
a dummy pattern spaced apart from the first electrode of the plurality of first electrodes and in direct contact with the third voltage line through a third electrode contact hole, wherein
the first voltage line intersects the third voltage line,
the second voltage line intersects the fourth voltage line, and
the second electrode comprises:
an electrode stem portion extending in the first direction and in direct contact with the fourth voltage line through a second electrode contact hole; and
a plurality of electrode branch portions extending in the second direction,
the plurality of electrode branch portions and the plurality of first electrodes being spaced apart from each other and alternately disposed with each other.

16. The display device of claim 15, wherein
the plurality of pixels comprise:
a first pixel; and
a second pixel adjacent to the first pixel in the second direction,
the first voltage line of the first pixel is adjacent to and opposite to the second voltage line of the second pixel in the second direction, and
the first pixel and the second pixel share the third voltage line and the fourth voltage line.

17. The display device of claim 16, wherein
the plurality of pixels further comprises a third pixel adjacent to the first pixel in the first direction, and
the fourth voltage line and the second electrode contact hole are disposed at a boundary between the first pixel and the third pixel.

18. The display device of claim 15, wherein
the plurality of pixels comprise:
a first pixel; and
a second pixel adjacent to the first pixel in the second direction,
the first voltage line of the first pixel is adjacent to and opposite to the first voltage line of the second pixel in the second direction, and
the first pixel and the second pixel share the third voltage line and the fourth voltage line.

19. The display device of claim 18, wherein a gap between the second electrode contact hole of the first pixel and the second electrode contact hole of the second pixel is greater than a gap between the third electrode contact hole of the first pixel and the third electrode contact hole of the second pixel.

* * * * *